(12) United States Patent
Akimoto

(10) Patent No.: US 12,543,419 B2
(45) Date of Patent: Feb. 3, 2026

(54) IMAGE DISPLAY DEVICE MANUFACTURING METHOD INCLUDING PROVIDING SUBSTRATE INCLUDING CIRCUIT AND INSULATING FILM, FORMING CONDUCTIVE LAYER ON INSULATING FILM, AND FORMING SEMICONDUCTOR LAYER ON CONDUCTIVE LAYER

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 487 days.

(21) Appl. No.: 17/709,006

(22) Filed: Mar. 30, 2022

(65) Prior Publication Data
US 2022/0223776 A1    Jul. 14, 2022

Related U.S. Application Data

(63) Continuation of application No. PCT/JP2020/036935, filed on Sep. 29, 2020.

(30) Foreign Application Priority Data

Oct. 1, 2019    (JP) .................................. 2019-181636

(51) Int. Cl.
*H10H 20/857*     (2025.01)
*H10H 20/01*      (2025.01)
(Continued)

(52) U.S. Cl.
CPC .......... *H10H 20/857* (2025.01); *H10H 20/01* (2025.01); *H10H 20/01335* (2025.01);
(Continued)

(58) Field of Classification Search
CPC ... H01L 33/62; H01L 33/007; H01L 33/0095; H01L 33/32; H01L 33/382; H01L 33/50;
(Continued)

(56) References Cited

U.S. PATENT DOCUMENTS

| 5,618,474 A | * | 4/1997 | Liau | ..................... | G02B 6/1245 |
| | | | | | 264/1.32 |
| 2004/0026703 A1 | * | 2/2004 | Adomi | .................. | H01L 33/405 |
| | | | | | 257/E33.068 |

(Continued)

FOREIGN PATENT DOCUMENTS

| CN | 108987425 A | 12/2018 |
| JP | 2002-141492 A | 5/2002 |

(Continued)

OTHER PUBLICATIONS

International Search Report and Written Opinion of the International Searching Authority dated Dec. 8, 2020 as issued in PCT Application No. PCT/JP2020/036935 and English translation of International Search Report; 10 pages.

(Continued)

*Primary Examiner* — Duy T Nguyen
(74) *Attorney, Agent, or Firm* — Foley & Lardner LLP

(57) ABSTRACT

An image display device manufacturing method includes: providing a first substrate that includes: a circuit including a circuit element formed on a light-transmitting substrate, and a first insulating film covering the circuit; forming, on the first insulating film, a conductive layer including a portion made of a single crystal metal; forming, on the portion made of the single crystal metal, a semiconductor layer including a light-emitting layer; etching the semiconductor layer to form a light-emitting element; forming a second insulating film covering the conductive layer, the light-emitting element, and the first insulating film; forming a via passing through the first insulating film and the second insulating (Continued)

film; and electrically connecting the light-emitting element and the circuit element through the via at a light-emitting surface facing a surface of the light-emitting element on a first insulating film side.

11 Claims, 28 Drawing Sheets

(51) Int. Cl.
    *H10H 20/825* (2025.01)
    *H10H 20/831* (2025.01)
    *H10H 20/851* (2025.01)

(52) U.S. Cl.
    CPC ...... *H10H 20/825* (2025.01); *H10H 20/8312* (2025.01); *H10H 20/851* (2025.01); *H10H 20/032* (2025.01); *H10H 20/0361* (2025.01); *H10H 20/0364* (2025.01)

(58) Field of Classification Search
    CPC ..... H01L 2933/0016; H01L 2933/0041; H01L 2933/0066; H01L 25/167; H01L 33/42; H01L 27/156; H10H 20/857; H10H 20/01; H10H 20/01335; H10H 20/825; H10H 20/8312; H10H 20/851; H10H 20/032; H10H 20/0361; H10H 20/0364; H10H 20/833; H10H 29/142
    USPC .......................................... 438/22
    See application file for complete search history.

(56) References Cited

U.S. PATENT DOCUMENTS

| | | | |
|---|---|---|---|
| 2008/0124824 A1* | 5/2008 | Tsai | H10K 71/164 257/E33.001 |
| 2008/0179602 A1* | 7/2008 | Negley | H01L 21/2654 438/34 |
| 2008/0217622 A1* | 9/2008 | Goyal | H01L 21/02568 257/64 |
| 2009/0315965 A1 | 12/2009 | Yamagata et al. | |
| 2010/0197054 A1* | 8/2010 | Yonehara | H01L 27/15 257/E33.044 |
| 2012/0249915 A1* | 10/2012 | Morosawa | H01L 27/1255 257/43 |
| 2014/0138614 A1* | 5/2014 | Sugiyama | H01L 33/12 257/13 |
| 2018/0012951 A1 | 1/2018 | Sato | |
| 2018/0122836 A1* | 5/2018 | Kang | H01L 27/1248 |
| 2018/0175268 A1 | 6/2018 | Moon et al. | |
| 2018/0374829 A1* | 12/2018 | Henley | H01L 25/0753 |
| 2019/0066592 A1 | 2/2019 | Kim | |
| 2019/0131343 A1 | 5/2019 | Templier et al. | |
| 2019/0165035 A1 | 5/2019 | Fu | |
| 2019/0267357 A1 | 8/2019 | Iguchi et al. | |
| 2019/0273179 A1 | 9/2019 | Iguchi et al. | |
| 2020/0027865 A1 | 1/2020 | Fan et al. | |

FOREIGN PATENT DOCUMENTS

| | | |
|---|---|---|
| JP | 2008-147608 A | 6/2008 |
| JP | 2009-094144 A | 4/2009 |
| JP | 2016-139560 A | 8/2016 |
| JP | 2018-101785 A | 6/2018 |
| JP | 2019-522894 A | 8/2019 |
| JP | 2019-152851 A | 9/2019 |
| JP | 2019-153783 A | 9/2019 |
| KR | 2019-0048988 A | 5/2019 |
| WO | WO-2016/121698 A1 | 8/2016 |
| WO | WO-2019/049360 A1 | 3/2019 |

OTHER PUBLICATIONS

Jeong et al., "Fabrication of full-color InGaN-based light-emitting diodes on amorphous substrates by pulsed sputtering", Scientific Reports 4:5325, Jun. 23, 2014; 4 pages.

Kim et al., "Fabrication of full-color GaN-based light-emitting diodes on nearly lattice-matched flexible metal foils", Scientific Reports 7:2112, May 18, 2017; 5 pages.

* cited by examiner

IMAGE DISPLAY DEVICE MANUFACTURING METHOD INCLUDING PROVIDING SUBSTRATE INCLUDING CIRCUIT AND INSULATING FILM, FORMING CONDUCTIVE LAYER ON INSULATING FILM, AND FORMING SEMICONDUCTOR LAYER ON CONDUCTIVE LAYER

CROSS-REFERENCE TO RELATED APPLICATIONS

The present application is a bypass continuation of PCT Application No. PCT/JP2020/036935, filed Sep. 29, 2020, which claims priority to Japanese Application No. 2019-181636, filed Oct. 1, 2019. The contents of these applications are hereby incorporated by reference in their entireties.

BACKGROUND

Embodiments of the present invention relate to an image display device manufacturing method and an image display device.

Realization of a thin image display device having high brightness, a wide viewing angle, high contrast, and low power consumption has been desired. To accommodate such market demands, advancements have been made in the development of a display device that utilizes a self-light-emitting element.

The emergence of a display device that uses, as a self-light-emitting element, a micro light-emitting diode (LED), which is a fine light-emitting element, is expected. As a manufacturing method of a display device that uses a micro LED, a method of sequentially transferring individually formed micro LEDs to a drive circuit has been introduced. Nevertheless, as the number of micro LED elements increases as image quality advances, such as full high definition, 4K, and 8K, in the individual formation and the sequential transfer of a large number of micro LEDs to a substrate on which a drive circuit and the like are formed, a significant amount of time is required for the transfer process. Furthermore, connection failure or the like between a micro LED and the drive circuit or the like may occur, resulting in a decrease in yield.

There is known a technique of growing a semiconductor layer including a light-emitting layer on a Si substrate, forming an electrode on the semiconductor layer, and then bonding the semiconductor layer to a circuit substrate on which a drive circuit is formed (for example, Patent Document 1: JP 2002-141492 A).

SUMMARY

An embodiment of the present invention provides an image display device manufacturing method that reduces a transfer process of a light-emitting element and improves yield.

Solution to Problem

An image display device manufacturing method according to an embodiment of the present invention includes preparing a first substrate including a circuit including a circuit element formed on a light-transmitting substrate and a first insulating film covering the circuit, forming on the first insulating film a conductive layer including a portion of a single crystal metal, forming on the portion a semiconductor layer including a light-emitting layer, etching the semiconductor layer to form a light-emitting element, forming a second insulating film covering the conductive layer, the light-emitting element, and the first insulating film, forming a via passing through the first insulating film and the second insulating film, and electrically connecting the light-emitting element and the circuit element through the via at a light-emitting surface facing a surface of the light-emitting element on a side of the first insulating film.

An image display device according to an embodiment of the present invention includes a light-transmitting substrate including a first surface, a circuit element provided on the first surface, a first wiring layer provided on the circuit element and electrically connected to the circuit element, a first insulating film covering the circuit element and the first wiring layer on the first surface, a conductive layer provided on the first insulating film and including a portion of a single crystal metal, a first light-emitting element provided on the portion and electrically connected to the portion, a second insulating film covering at least a portion of the first light-emitting element, the first insulating film, and the conductive layer, a second wiring layer provided on the second insulating film and electrically connected to a light-emitting surface facing a surface of the first light-emitting element on a side of the first insulating film, and a via passing through the first insulating film and the second insulating film and electrically connecting the first wiring layer and the second wiring layer.

An image display device according to an embodiment of the present invention includes a substrate including a first surface and having flexibility, a circuit element provided on the first surface, a first wiring layer provided on the circuit element and electrically connected to the circuit element, a first insulating film covering the circuit element and the first wiring layer on the first surface, a conductive layer provided on the first insulating film and including a portion of a single crystal metal, a first light-emitting element provided on the portion and electrically connected to the portion, a second insulating film covering at least a portion of the first light-emitting element, the first insulating film, and the conductive layer, a second wiring layer provided on the second insulating film and electrically connected to a light-emitting surface facing a surface of the first light-emitting element on a side of the first insulating film, and a via passing through the first insulating film and the second insulating film and electrically connecting the first wiring layer and the second wiring layer.

An image display device according to an embodiment of the present invention includes a light-transmitting substrate including a first surface, a plurality of transistors provided on the first surface, a first wiring layer provided on the plurality of transistors and electrically connected to the plurality of transistors, a first insulating film covering the plurality of transistors and the first wiring layer on the first surface, a conductive layer provided on the first insulating film and including a portion of a single crystal metal, a first semiconductor layer of a first conductivity type provided on the portion and electrically connected to the portion, a light-emitting layer provided on the first semiconductor layer, a second semiconductor layer of a second conductivity type, different from the first conductivity type, provided on the light-emitting layer, a second insulating film covering the conductive layer, the first insulating film, the light-emitting layer, and the first semiconductor layer, and covering at least a portion of the second semiconductor layer, a second wiring layer connected to a light-transmitting electrode arranged on a plurality of light-emitting surfaces of the second semiconductor layer, each exposed from the second insulating film in accordance with the plurality of transistors, and a plurality of vias passing through the first insulating film and the second insulating film and each electrically connecting a wiring line of the first wiring layer and a wiring line of the second wiring layer.

According to an embodiment of the present invention, an image display device manufacturing method that reduces a transfer process of a light-emitting element and improves yield may be realized.

DETAILED DESCRIPTION

Figure 1:
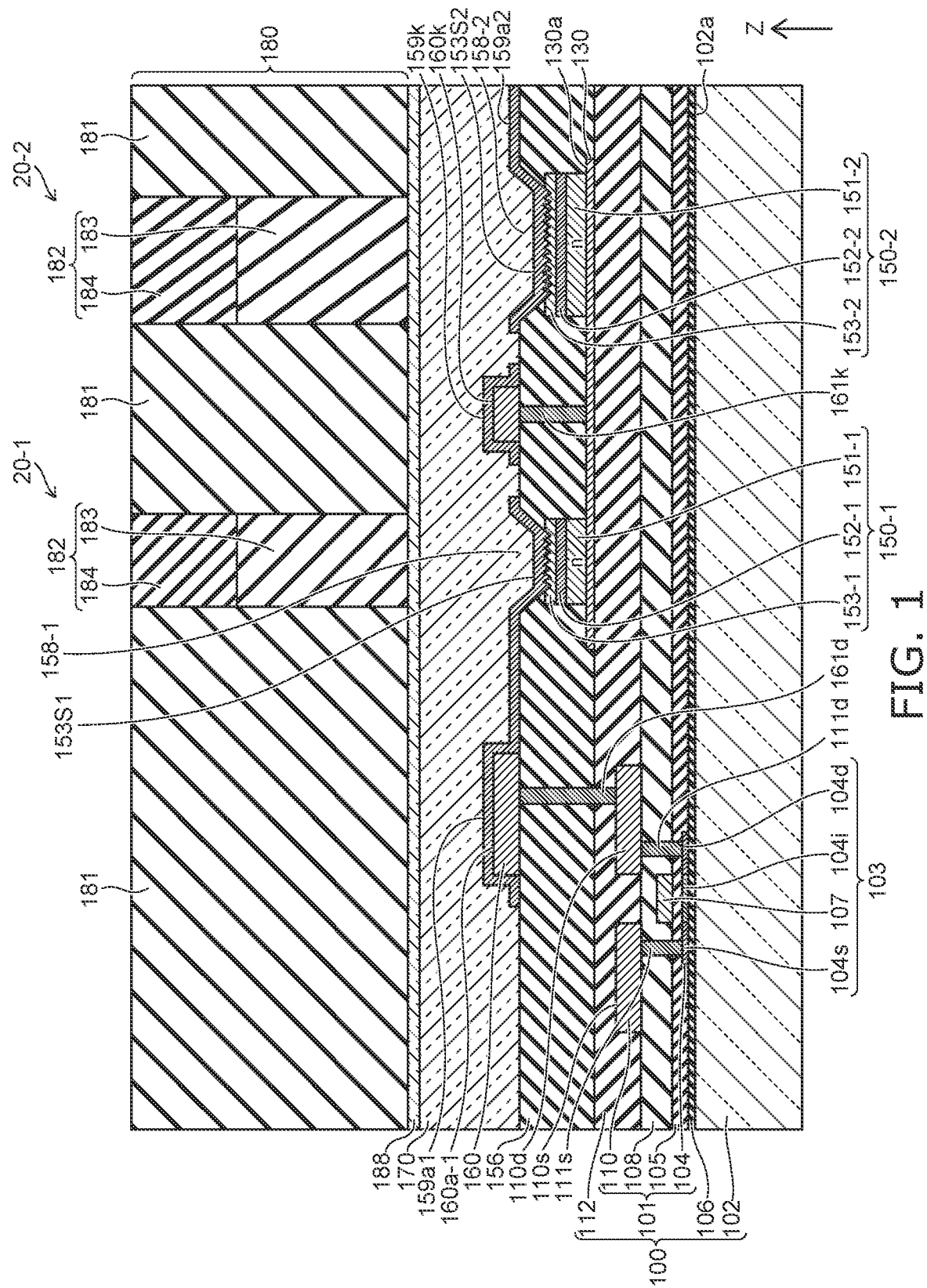
FIG. 1 is a schematic cross-sectional view illustrating a portion of an image display device according to a first embodiment.

Embodiments of the present invention will be described below with reference to the drawings.

Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated.

Note that, in the specification and the drawings, elements similar to those described in relation to a previous drawing are denoted using like reference characters, and a detailed description is omitted as appropriate.

First Embodiment

FIG. 1 is a schematic cross-sectional view illustrating a portion of an image display device according to an embodiment.

FIG. 1 schematically illustrates a configuration of a sub-pixel 20-1 of the image display device according to the present embodiment. A pixel constituting an image displayed on the image display device is constituted by a plurality of sub-pixels 20 illustrated in FIG. 3 described below. In FIG. 1, the sub-pixel 20-1 as well as a portion of a sub-pixel 20-2 are illustrated.

In the following, description is sometimes made using a three-dimensional coordinate system of XYZ. The sub-pixels 20-1, 20-2 are arrayed on a two-dimensional plane. The two-dimensional plane in which the sub-pixels 20-1, 20-2 are arrayed is defined as an XY plane. The sub-pixels 20-1, 20-2 are arrayed in an X-axis direction and a Y-axis direction. FIG. 1 illustrates an aligned section view taken along the lines AA' in FIG. 4 described below, and is a cross-sectional view in which cross sections in a plurality of planes perpendicular to the XY plane are connected together. In other drawings as well, in a cross-sectional view of a plurality of planes perpendicular to the XY plane, the Z axis orthogonal to the XY plane is illustrated without illustrating the X axis and the Y axis, as in FIG. 1. That is, in these drawings, the plane perpendicular to the Z axis is the XY plane.

The sub-pixels 20-1, 20-2 respectively include light-emitting surfaces 153S1, 153S2 that are substantially parallel to the XY plane. The light-emitting surfaces 153S1, 153S2 emit light mainly in a positive direction of the Z axis orthogonal to the XY plane.

As illustrated in FIG. 1, the sub-pixel 20-1 of the image display device of the present embodiment includes a substrate 102, a transistor (circuit element) 103, a first wiring layer (first wiring layer) 110, a first interlayer insulating film (first insulating film) 112, a light-emitting element (first light-emitting element) 150-1, a second interlayer insulating film (second insulating film) 156, a conductive layer 130, a plurality of vias 161d, 161k, and a second wiring layer (second wiring layer) 160.

In the present embodiment, the image display device includes the sub-pixel 20-2. For example, the sub-pixel 20-2 is disposed adjacent to the sub-pixel 20-1. The sub-pixel 20-2 includes the substrate 102, the first wiring layer 110, the first interlayer insulating film 112, the second interlayer insulating film 156, the conductive layer 130, and the second wiring layer 160, which are common to the sub-pixel 20-1. A light-emitting element (second light-emitting element) 150-2 is provided on the conductive layer 130 together with the light-emitting element 150-1. In FIG. 1, while a transistor for the sub-pixel 20-2 is not illustrated, a transistor that drives the light-emitting element 150-2 is provided separately.

In the present embodiment, the substrate 102 on which circuit elements including the transistor 103 are formed is a light-transmitting substrate, and is, for example, a glass substrate. The substrate 102 includes a first surface 102a, and a thin film transistor (TFT) is formed as the transistor 103 on the first surface 102a. The first surface 102a is a surface substantially parallel to the XY plane. The light-emitting elements 150-1, 150-2 are driven by the TFT formed on the glass substrate. The process of forming circuit elements including the TFT on a large glass substrate is established for the manufacture of a liquid crystal panel, an organic electroluminescent (EL) panel, and the like, resulting in the advantage that an existing plant can be utilized.

The sub-pixel 20 further includes a color filter 180. The color filter (wavelength conversion member) 180 is provided on a surface resin layer 170 with a transparent thin film adhesive layer 188 interposed therebetween. The surface resin layer 170 is provided on the interlayer insulating film 156 and the wiring layer 160.

The transistor 103 is formed on a TFT lower layer film 106 formed on the first surface 102a of the substrate 102. The TFT lower layer film 106 is provided to ensure flatness when the transistor 103 is formed, and to protect a TFT channel 104 of the transistor 103 from contamination and the like during heat treatment. The TFT lower layer film 106 is, for example, $SiO_2$.

In addition to the transistor 103 for driving the light-emitting element 150-1, circuit elements such as a transistor for driving the light-emitting element 150-2 and other transistors and capacitors, although not illustrated in FIG. 1, are formed on the substrate 102, forming, with wiring lines and the like, a circuit 101. For example, the transistor 103 corresponds to a drive transistor 26 illustrated in FIG. 3 described below.

Hereinafter, the circuit 101 is a circuit that includes the TFT channel 104, an insulating layer 105, an insulating film 108, vias 111s, 111d, and the wiring layer 110. The substrate 102, the TFT lower layer film 106, the circuit 101, and other components such as the interlayer insulating film 112 may be collectively referred to as a circuit substrate 100.

The transistor 103 is a p-channel TFT in this example. The transistor 103 includes the TFT channel 104 and a gate 107.

The TFT is preferably formed by a low temperature polysilicon (LTPS) process. The TFT channel 104 is a region of polycrystalline Si formed on the substrate 102, and is polycrystallized and activated by annealing a region formed as amorphous Si by laser irradiation. A TFT formed by the LTPS process has sufficiently high mobility.

The TFT channel 104 includes regions 104s, 104i, 104d. The regions 104s, 104i, 104d are all provided on the TFT lower layer film 106. The region 104i is provided between the regions 104s, 104d. The regions 104s, 104d are doped with a p-type impurity such as boron (B) and are in ohmic connection with the vias 111s, 111d.

The gate 107 is provided on the TFT channel 104 with the insulating layer 105 interposed therebetween. The insulating layer 105 is provided to insulate the TFT channel 104 and the gate 107 and to provide insulation from other adjacent circuit elements. When a potential lower than that of the region 104s is applied to the gate 107, a channel is formed in the region 104i, making it possible to control a current flowing between the regions 104s, 104d.

The insulating layer 105 is, for example, $SiO_2$. The insulating layer 105 may be a multi-layer insulating layer including $SiO_2$, $Si_3N_4$, or the like in accordance with the covered region.

The gate 107 is, for example, polycrystalline Si. The polycrystalline Si film of the gate 107 can be generally created by a chemical vapor deposition (CVD) process.

In this example, the gate 107 and the insulating layer 105 are covered by the insulating film 108. The insulating film 108 is, for example, $SiO_2$ or $Si_3N_4$. The insulating film 108 functions as a flattening film for forming the wiring layer 110. The insulating film 108 is a multi-layer insulating film containing $SiO_2$ or $Si_3N_4$, for example.

The vias 111s, 111d are provided through the insulating film 108. The first wiring layer (first wiring layer) 110 is formed on the insulating film 108. The first wiring layer 110 includes a plurality of wiring lines that can differ in electrical potential, and includes wiring lines 110s, 110d. In the wiring layer in the cross-sectional views of FIG. 1 and subsequent drawings, the reference character of the wiring layer is displayed at a position lateral to one wiring line included in the denoted wiring layer.

The via 111s is provided between and electrically connects the wiring line 110s and the region 104s. The via 111d is provided between and electrically connects the wiring line 110d and the region 104d.

The wiring line 110s, in this example, electrically connects the region 104s, which is a source region of the transistor 103, to a power source line 3 illustrated in FIG. 3 described below. As described below, the wiring line 110d is electrically connected to a p-type semiconductor layer 153-1 on the light-emitting surface 153S1 side of the light-emitting element 150-1 by the via 161d and a wiring line 160a-1.

The wiring layer 110 and the vias 111s, 111d are formed by Al, an Al alloy, or a layered film of Al and Ti or the like, for example. In a layered film of Al and Ti, for example, Al is layered on a thin film of Ti, and Ti is further layered on Al.

The interlayer insulating film 112 is provided on the insulating film 108 and the wiring layer 110. The interlayer insulating film (first insulating film) 112 is an organic insulating film such as phosphorus silicon glass (PSG) or boron phosphorus silicon glass (BPSG), for example. The interlayer insulating film 112 provides insulation between circuit elements of the circuit 101 formed on the circuit substrate 100 and provides a flat surface for forming the conductive layer 130. The interlayer insulating film 112 also functions as a protective film that protects a front surface of the circuit substrate 100.

The conductive layer 130 is provided on the interlayer insulating film 112. The conductive layer 130 includes a light-reflecting plate 130a. One light-reflecting plate 130a is provided per two sub-pixels in this example. Different light-reflecting plates 130a may or may not be connected to each other within the conductive layer 130. In this example, different light-reflecting plates 130a are connected to a ground line 4 of FIG. 3 described below, for example, by the via 161k and a wiring line 160k provided for each light-reflecting plate 130a.

At least a portion of the conductive layer 130 is formed of a single crystal metal. Preferably, the entire conductive layer 130 is a single crystal metal layer. At least a portion of the light-reflecting plate 130a is formed of a single crystal metal. At least the locations of the light-reflecting plate 130a where the light-emitting elements 150-1, 150-2 are provided are formed of a single crystal metal and form a single crystal metal layer, for example. Hereinafter, including in other embodiments as well, it is assumed that the conductive layer 130 and the light-reflecting plate (portion) 130a are formed of a single crystal metal layer as a whole.

The metal material that forms the conductive layer 130 and the light-reflecting plate 130a is, for example, Cu or Hf. The metal material used in the conductive layer 130 is not limited to Cu or Hf as long as the metal material can be monocrystallized by a low temperature annealing process consistent with the LTPS process. The light-reflecting plate 130a, being formed of a metal material or the like, can be electrically connected to the light-emitting elements 150-1, 150-2 with low resistance. The light-emitting elements 150-1, 150-2, are provided on the same light-reflecting plate 130a, and thus the light-emitting elements 150-1, 150-2 can be electrically connected to each other with low resistance.

Outer peripheries of the light-emitting elements 150-1, 150-2 are located entirely within an outer periphery of the light-reflecting plate 130a when the light-emitting elements 150-1, 150-2 are projected onto the light-reflecting plate 130a in an XY plane view. By appropriately selecting the material of the light-reflecting plate 130a, the light scattered downward of the light-emitting elements 150-1, 150-2 can be reflected toward the light-emitting surface 153S1, 153S2 side, improving light emission efficiency.

The light-reflecting plate 130a reflects the light scattered downward of the light-emitting element 150-1 toward the light-emitting surface 153S1 side, making it possible to ensure that the light does not reach the transistor 103. The light-reflecting plate 130a also reflects of light scattered downward of the light-emitting element 150-2 toward the light-emitting surface 153S2 side, making it possible to ensure that the light does not reach the transistor that drives the light-emitting element 150-2. The light-reflecting plate 130a blocks light scattered downward of the light-emitting elements 150-1, 150-2. This suppresses the light reaching the circuit element including the transistor 103 and makes it possible to prevent malfunction of circuit elements as well.

The light-emitting element 150-1 includes an n-type semiconductor layer (first semiconductor layer) 151-1, a light-emitting layer 152-1, and the p-type semiconductor layer (second semiconductor layer) 153-1. The n-type semiconductor layer 151-1, the light-emitting layer 152-1, and the p-type semiconductor layer 153-1 are layered in this order from the side of the interlayer insulating film 112 toward the side of the light-emitting surface 153S1.

The light-emitting element 150-2 includes an n-type semiconductor layer (third semiconductor layer) 151-2, a light-emitting layer 152-2, and a p-type semiconductor layer (fourth semiconductor layer) 153-2. The n-type semiconductor layer 151-2, the light-emitting layer 152-2, and the p-type semiconductor layer 153-2 are layered in this order from the side of the interlayer insulating film 112 toward the side of the light-emitting surface 153S2.

An area of the light-emitting element in an XY plane view is set in accordance with the light emission colors of red, green, and blue sub-pixels. The areas of the light-emitting elements 150-1, 150-2 in an XY plane view are set as appropriate according to visibility, a conversion efficiency of a color conversion unit 182 of the color filter 180, and the like. In this example, the areas of the two light-emitting elements 150-1, 150-2 in an XY plane view are different. The light-emitting elements 150-1, 150-2 are mounted on a surface of the light-reflecting plate 130a that is substantially parallel to the XY plane, and thus the areas in an XY plane view are the areas of the regions surrounded by the outer peripheries of the light-emitting elements 150-1, 150-2 projected onto the XY plane. In the following, the area in an XY plane view is simply referred to as "area." In this example, the area of the light-emitting element 150-1 is smaller than the area of the light-emitting element 150-2.

The light-emitting elements 150-1, 150-2 have substantially square or rectangular shapes in an XY plane view, for example, but a corner portion may be rounded. The light-emitting element 150 may have, for example, an elliptical shape or a circular shape in an XY plane view. With appropriate selection of the shape, the arrangement, and the like of the light-emitting element in a plan view, a degree of freedom of the layout is improved.

As the light-emitting elements 150-1, 150-2, a gallium nitride compound semiconductor including a light-emitting layer such as $In_XAl_YGa_{1-X-Y}N$ (where $0 \leq X$, $0 \leq Y$, $X+Y<1$), for example, is preferably used. Hereinafter, the gallium nitride compound semiconductor described above may be simply referred to as gallium nitride (GaN). The light-emitting elements 150-1, 150-2 in one embodiment of the present invention are so-called light-emitting diodes, and a wavelength of light emitted by the light-emitting elements 150-1, 150-2 is about 467 nm±20 nm, for example. The wavelength of light emitted by the light-emitting elements 150-1, 150-2 may be a blue violet emission of about 410 nm±20 nm. The wavelength of the light emitted by the light-emitting elements 150-1, 150-2 is not limited to the values described above and may be an appropriate value.

The second interlayer insulating film 156 covers the first interlayer insulating film 112, the conductive layer 130, and the light-emitting elements 150-1, 150-2. The interlayer insulating film 156 is formed of an organic insulating material or the like. The interlayer insulating film 156 covers the light-emitting elements 150-1, 150-2, the conductive layer 130, and the like, thereby providing protection from a surrounding environment, such as dust and humidity, and the like. The interlayer insulating film 156 covers the light-emitting element 150, the conductive layer 130, and the like, thereby having a function of insulating these from other conductors. A front surface of the interlayer insulating film 156 need only be flat enough to allow formation of the wiring layer 160 on the interlayer insulating film 156.

The organic insulating material used for the interlayer insulating film 156 is preferably a white resin. The interlayer insulating film 156 that is a white resin can reflect the laterally emitted light of the light-emitting elements 150-1, 150-2, the return light caused by the interface of the color filter 180, and the like and substantially improve the light emission efficiency of the light-emitting elements 150-1, 150-2.

The white resin is formed by dispersing scattering microparticles having a Mie scattering effect on a transparent resin such as a silicon-based resin such as spin-on glass (SOG) or a novolac phenolic resin. The microparticles are colorless or white, and have a diameter of about one-tenth to several times the wavelength of the light emitted by the light-emitting elements 150-1, 150-2. Microparticles having a diameter of about one-half the wavelength of the light are suitably used as the scattering microparticles. Examples of such scattering microparticles include $TiO_2$, $Al_2SO_3$, and ZnO. Alternatively, the white resin can also be formed by utilizing a number of fine pores or the like dispersed within a transparent resin. The interlayer insulating film 156 may be whitened by using a $SiO_2$ film or the like formed by atomic layer deposition (ALD) or CVD, for example, instead of SOG.

The second interlayer insulating film 156 may be a black resin. With the interlayer insulating film 156 being a black resin, the scattering of light within the sub-pixels 20-1, 20-1 is suppressed, and stray light is more effectively suppressed. An image display device in which stray light is suppressed can display a sharper image.

The via 161k is provided through the second interlayer insulating film 156. One end of the via 161k is connected to the light-reflecting plate 130a.

The via 161d is provided through the first interlayer insulating film 112 and the second interlayer insulating film 156. One end of the via 161d is connected to the wiring line 110d.

The wiring layer 160 is provided on the interlayer insulating film 156. The wiring layer 160 includes the wiring lines 160a-1, 160k. The wiring line 160a-1 is connected to the other end of the via 161d.

A light-transmitting electrode 159a1 is provided over the wiring line 160a-1. The light-transmitting electrode 159a1 is provided over the light-emitting surface 153S1 of the light-emitting element 150-1. The light-transmitting electrode 159a1 is provided between the wiring line 160a-1 and the light-emitting surface 153S1, and electrically connects the wiring line 160a-1 and the p-type semiconductor layer 153-1. Accordingly, the p-type semiconductor layer 153-1 that is an anode electrode of the light-emitting element 150-1 is electrically connected, via the light-transmitting electrode 159a1, the wiring line 160a-1, the via 161d, and the wiring line 110d, to the region 104d of the channel that is a drain electrode of the transistor 103.

A light-transmitting electrode 159a2 is provided over the light-emitting surface 153S2 of the light-emitting element 150-2. Similar to the case of the light-emitting element 150-1, the light-emitting surface 153S2 is electrically connected, via the light-transmitting electrode 159a2, a wiring line included in the wiring layer 160, and a via passing through the interlayer insulating films 112, 156, to a transistor that drives the light-emitting element 150-2.

The wiring line 160k is connected to the other end of the via 161k. A light-transmitting electrode 159k is provided over the wiring line 160k. The wiring line 160k and the light-transmitting electrode 159k are connected to the ground line 4 illustrated in FIG. 3 described below. Accordingly, the n-type semiconductor layers 151-1, 151-2 are connected to the ground line 4 via the light-reflecting plate 130a, the via 161k, the wiring line 160k, and the light-transmitting electrode 159k.

Figure 3:
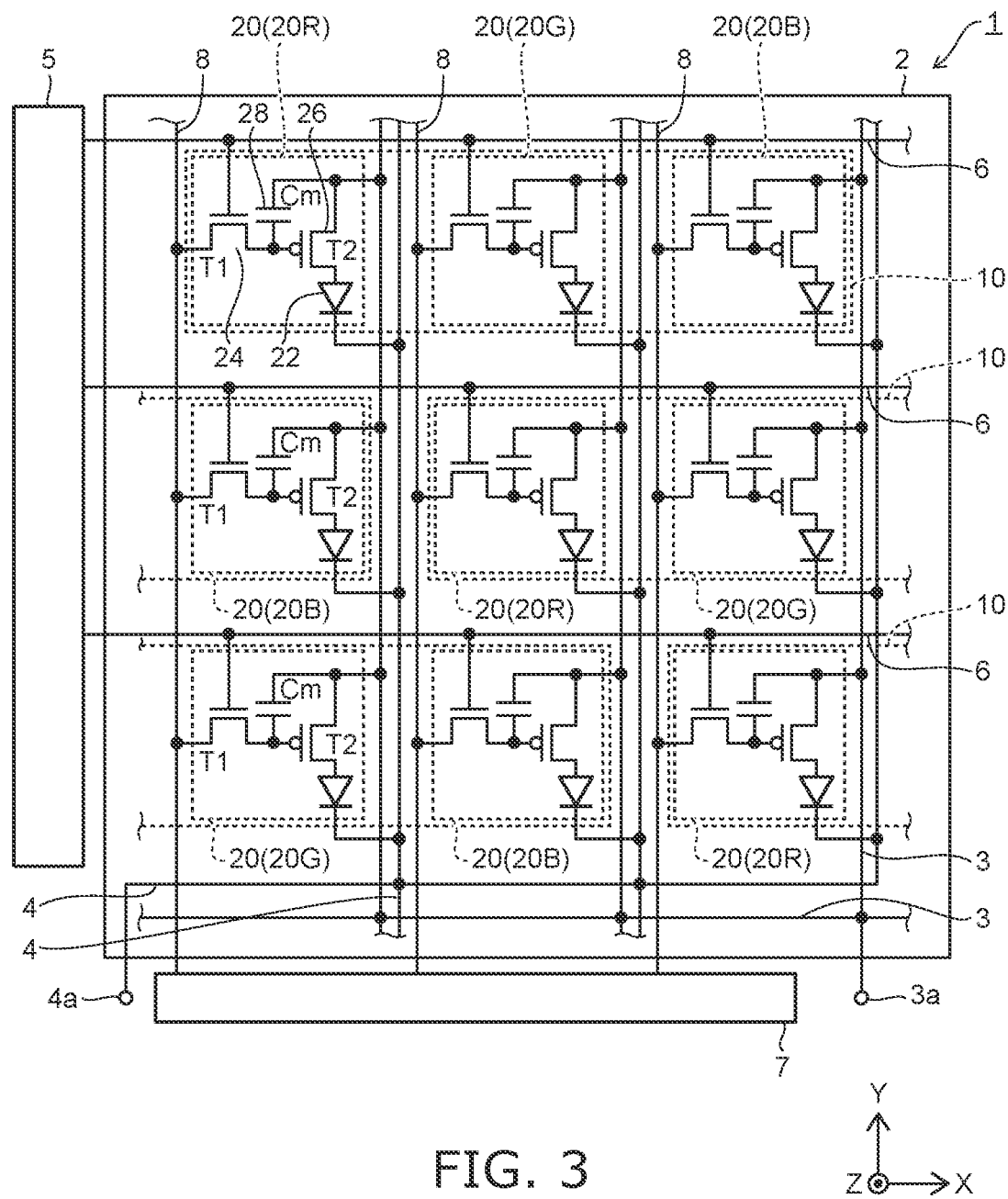
FIG. 3 is a schematic block diagram illustrating the image display device according to the first embodiment.

The region 104s of the TFT channel 104 that is a source electrode of the transistor 103 is electrically connected, via the wiring line 110s, to the power source line 3 illustrated in FIG. 3.

The surface resin layer 170 covers the second interlayer insulating film 156, the second wiring layer 160, and the light-transmitting electrodes 159a1, 159a2, 159k. The surface resin layer 170 is a transparent resin and provides a flat surface for protecting the interlayer insulating film 156, the wiring layer 160, and the light-transmitting electrodes 159a1, 159a2, 159k, and for adhering the color filter 180.

The color filter 180 includes a light-blocking portion 181 and the color conversion unit 182. The color conversion unit 182 is provided directly above the light-emitting surfaces 153S1, 153S2 of the light-emitting elements 150-1, 150-2 in accordance with the shapes of the light-emitting surfaces 153S1, 153S2. In the color filter 180, a portion other than the color conversion unit 182 is the light-blocking portion 181. The light-blocking portion 181 is a so-called black matrix, and can reduce bleeding caused by the color mixing of light emitted from the adjacent color conversion unit 182 and the like, and thus display a sharp image.

The color conversion unit 182 is one layer or two layers. A portion of two layers is illustrated in FIG. 1. Whether the color conversion unit 182 is one layer or two layers is determined by the color, that is, the wavelength, of the light emitted by the sub-pixels 20-1, 20-2. In a case in which the light emission color of the sub-pixels 20-1, 20-2 is red or green, the color conversion unit 182 is preferably the two layers of a color conversion layer 183 and a filter layer 184 described below. In a case in which the light emission color of the sub-pixels 20-1, 20-2 is blue, one layer is preferred.

In a case in which the color conversion unit 182 is two layers, a first layer closer to the light-emitting element 150 is the color conversion layer 183, and a second layer is the filter layer 184. That is, the filter layer 184 is layered on the color conversion layer 183.

The color conversion layer 183 is a layer that converts the wavelength of the light emitted by the light-emitting elements 150-1, 150-2 to a desired wavelength. For example, in a case in which the sub-pixel emits red light, the color conversion layer 183 converts light of 467 nm±20 nm, which is the wavelength of the light-emitting element 150-1, to light having a wavelength of about 630 nm±20 nm, for example. In a case in which the sub-pixel emits green, the color conversion layer 183 converts light of 467 nm±20 nm, which is the wavelength of the light-emitting element, to light having a wavelength of about 532 nm±20 nm, for example.

The filter layer 184 blocks the wavelength component of the remaining blue light emission without color conversion by the color conversion layer 183.

In a case in which the color of the light emitted by the sub-pixel is blue, the light-emitting element of the sub-pixel may output the light via the color conversion layer 183 or may output the light as is without the light being passed through the color conversion layer 183. In a case in which the wavelength of the light emitted by the light-emitting element is about 467 nm±20 nm, the light-emitting element of the sub-pixel may output the light without the light being passed through the color conversion layer 183. In a case in which the wavelength of the light emitted by the light-emitting element is set to 410 nm±20 nm, it is preferable to provide the one layer of the color conversion layer 183 in order to convert the wavelength of the light to be output to about 467 nm±20 nm.

Even in the case of a blue sub-pixel, the sub-pixel may include the filter layer 184. With the filter layer 184 provided in the blue sub-pixel, minute reflection of external light generated at the front surface of the light-emitting element of the sub-pixel is suppressed.

Modified Example

A modified example of the configuration of the sub-pixel will now be described.

Figure 2A:
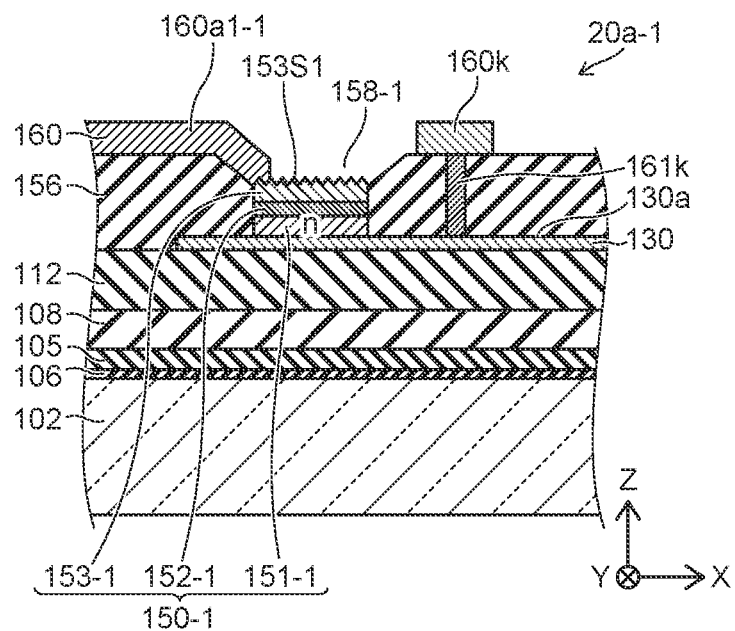
FIG. 2A is a schematic cross-sectional view illustrating a portion of a modified example of the image display device according to the first embodiment.
Figure 2B:
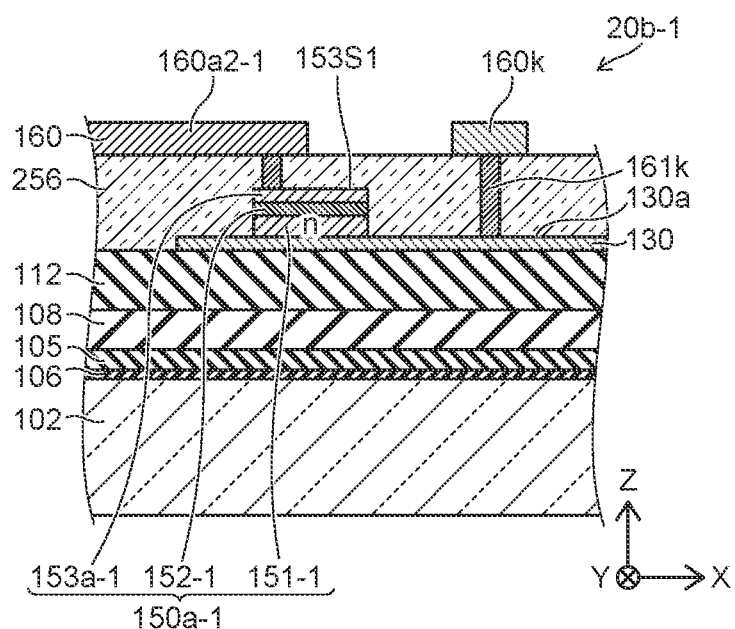
FIG. 2B is a schematic cross-sectional view illustrating a portion of the modified example of the image display device according to the first embodiment.

FIG. 2A and FIG. 2B are schematic cross-sectional views illustrating portions of the modified example of the image display device according to the present embodiment.

2A illustrates one light-emitting element 150-1 of the two light-emitting elements 150-1, 150-2 provided on the light-reflecting plate 130a and illustrated in FIG. 1. The configurations of the two light-emitting elements 150-1, 150-2 are the same, and in the following description of the present modified example, matters related to the configuration including the light-emitting element 150-1 will be described. In FIG. 2B as well, configurations of a light-emitting element 150a-1 and a light-emitting element 150a-2 illustrated in FIG. 9A described below are the same, and matters related to the configuration of the light-emitting element 150a-1 will be described.

In the cross-sectional views of the sub-pixels in FIG. 2A and subsequent drawings, illustration of the surface resin layer 170 and the color filter 180 is omitted in order to avoid complexity. In the subsequent drawings, unless otherwise specified, the surface resin layer 170, the color filter 180, and the like are provided on the second interlayer insulating films 156, 256 and the second wiring layer 160. The same applies to the other embodiments and other modified examples described below as well.

In a sub-pixel 20a-1 of FIG. 2A, the method of connecting the light-emitting element 150-1 and a wiring line 160a1-1 differs from that in the first embodiment described above. The same components are denoted by the same reference characters, and detailed descriptions thereof will be omitted as appropriate.

As illustrated in FIG. 2A, the sub-pixel 20a-1 includes the wiring line 160a1-1. In this modified example, the wiring line 160a1-1 is different from the wiring line 160a-1 in the first embodiment described above.

The wiring line 160a1-1 extends to the light-emitting surface 153S1 of the light-emitting element 150-1 and, at one end of the wiring line 160a1-1, is electrically connected to a surface of the p-type semiconductor layer 153-1 including the light-emitting surface 153S1. The light-emitting surface 153S1 and the surface including the light-emitting surface 153S1 are coplanar surfaces.

The light-emitting surface 153S1 is preferably roughened as in the embodiment described above. In a case in which the light-emitting surface 153S1 is a rough surface, the light extraction efficiency of the light-emitting element 150-1 can be improved.

In a sub-pixel 20b-1 of FIG. 2B, the light-emitting element 150a-1 differs from that in the first embodiment in including a p-type semiconductor layer 153a-1 that is not roughened. In the sub-pixel 20b-1, the method of connecting the light-emitting element 150a-1 and a wiring line 160a2-1 differs from that in the first embodiment.

As illustrated in FIG. 2B, in the sub-pixel 20b-1, the second interlayer insulating film (second insulating film) 256 is a resin having light transmittance, and is preferably a transparent resin. Examples of transparent resin materials include silicon-based resins such as SOG and novolac phenolic resin. The light-emitting element 150a-1 emits light from the light-emitting surface 153S1 via the transparent interlayer insulating film 256. The light-emitting surface 153S1 is connected to the wiring line 160a2-1 of the second wiring layer 160 via a contact hole.

In the sub-pixel 20b-1 of the present modified example, the light-emitting element 150a-1 emits light from the light-emitting surface 153S1 via the interlayer insulating film 256, and thus the process of forming an opening in the interlayer insulating film 256 and the process of roughening the light-emitting surface 153S1 can be omitted.

In the present embodiment, any of the configurations of the sub-pixels 20-1, 20a-1, 20b-1 described above can be included.

FIG. 3 is a schematic block diagram illustrating the image display device according to the present embodiment.

As illustrated in FIG. 3, an image display device 1 according to the present embodiment includes a display region 2. The sub-pixels 20 are arrayed in the display region 2. The sub-pixels 20 are arrayed, for example, in a lattice pattern. For example, n sub-pixels 20 are arrayed along the X axis, and m sub-pixels 20 are arrayed along the Y axis.

A pixel 10 includes a plurality of the sub-pixels 20 that emit different colors of light. A sub-pixel 20R emits red light. A sub-pixel 20G emits green light. A sub-pixel 20B emits blue light. The three types of sub-pixels 20R, 20G, 20B emit light at a desired brightness, and thus the light emission color and brightness of one pixel 10 are determined.

One pixel 10 includes the three sub-pixels 20R, 20G, 20B, and the sub-pixels 20R, 20G, 20B are arrayed in a linear shape on the X axis, for example, as in the example illustrated in FIG. 3. In each pixel 10, sub-pixels of the same color may be arrayed in the same column or, as in this example, sub-pixels of different colors may be arrayed on a per column basis.

The image display device 1 further includes the power source line 3 and the ground line 4. The power source line 3 and the ground line 4 are wired in a lattice pattern along the array of the sub-pixels 20. The power source line 3 and the ground line 4 are electrically connected to each sub-pixel 20, and power is supplied to each sub-pixel 20 from a direct current power source connected between a power source terminal 3a and a ground (GND) terminal 4a. The power source terminal 3a and the GND terminal 4a are respectively provided at end portions of the power source line 3 and the ground line 4, and are connected to a direct current power source circuit provided outside the display region 2. A positive voltage is supplied to the power source terminal 3a based on the GND terminal 4a.

The image display device 1 further includes a scanning line 6 and a signal line 8. The scanning line 6 is wired in a direction parallel to the X axis. That is, the scanning line 6 is wired along the array of the sub-pixels 20 in a row direction. The signal line 8 is wired in a direction parallel to the Y axis. That is, the signal line 8 is wired along the array of the sub-pixels 20 in a column direction.

The image display device 1 further includes a row selection circuit 5 and a signal voltage output circuit 7. The row selection circuit 5 and the signal voltage output circuit 7 are provided along an outer edge of the display region 2. The row selection circuit 5 is provided in the Y-axis direction of the outer edge of the display region 2. The row selection circuit 5 is electrically connected to the sub-pixel 20 of each column via the scanning line 6, and supplies a selection signal to each sub-pixel 20.

The signal voltage output circuit 7 is provided in the X-axis direction of the outer edge of the display region 2. The signal voltage output circuit 7 is electrically connected to the sub-pixel 20 of each row via the signal line 8, and supplies a signal voltage to each sub-pixel 20.

The sub-pixel 20 includes a light-emitting element 22, a selection transistor 24, the drive transistor 26, and a capacitor 28. In FIG. 3, the selection transistor 24 may be denoted as T1, the drive transistor 26 may be denoted as T2, and the capacitor 28 may be denoted as Cm.

The light-emitting element 22 is connected in series with the drive transistor 26. In the present embodiment, the drive transistor 26 is a p-channel TFT, and an anode electrode of the light-emitting element 22 connected to the p-type semiconductor layer is connected to a drain electrode that is a main electrode of the drive transistor 26. The series circuit of the light-emitting element 22 and the drive transistor 26 is connected between the power source line 3 and the ground line 4. The drive transistor 26 corresponds to the transistor 103 in FIG. 1, for example, and the light-emitting element 22 corresponds to the light-emitting element 150 in FIG. 1, for example. The current flowing to the light-emitting element 22 is determined by the voltage applied across the gate-source of the drive transistor 26, and the light-emitting element 22 emits light at a brightness corresponding to the flowing current.

The selection transistor 24 is connected between a gate electrode of the drive transistor 26 and the signal line 8 via the main electrode. A gate electrode of the selection transistor 24 is connected to the scanning line 6. The capacitor 28 is connected between the gate electrode of the drive transistor 26 and the power source line 3.

The row selection circuit 5 selects one row from the array of m rows of the sub-pixels 20 to supply a selection signal to the scanning line 6. The signal voltage output circuit 7 supplies a signal voltage having the required analog voltage value to each sub-pixel 20 in the selected row. The signal voltage is applied across the gate-source of the drive transistor 26 of the sub-pixels 20 of the select row. The signal voltage is held by the capacitor 28. The drive transistor 26 introduces a current corresponding to the signal voltage to the light-emitting element 22. The light-emitting element 22 emits light at a brightness corresponding to the current flowing in the light-emitting element 22.

The row selection circuit 5 supplies the selection signal by sequentially switching the selected row. That is, the row selection circuit 5 scans the rows in which the sub-pixels 20 are arrayed. A current corresponding to the signal voltage flows in the light-emitting element 22 of the sub-pixels 20 sequentially scanned, and light is emitted. Each pixel 10 emits light of the light emission color and brightness determined by the light emission color and the brightness emitted by the sub-pixels 20 of each RGB color, and an image is displayed in the display region 2.

Figure 4:
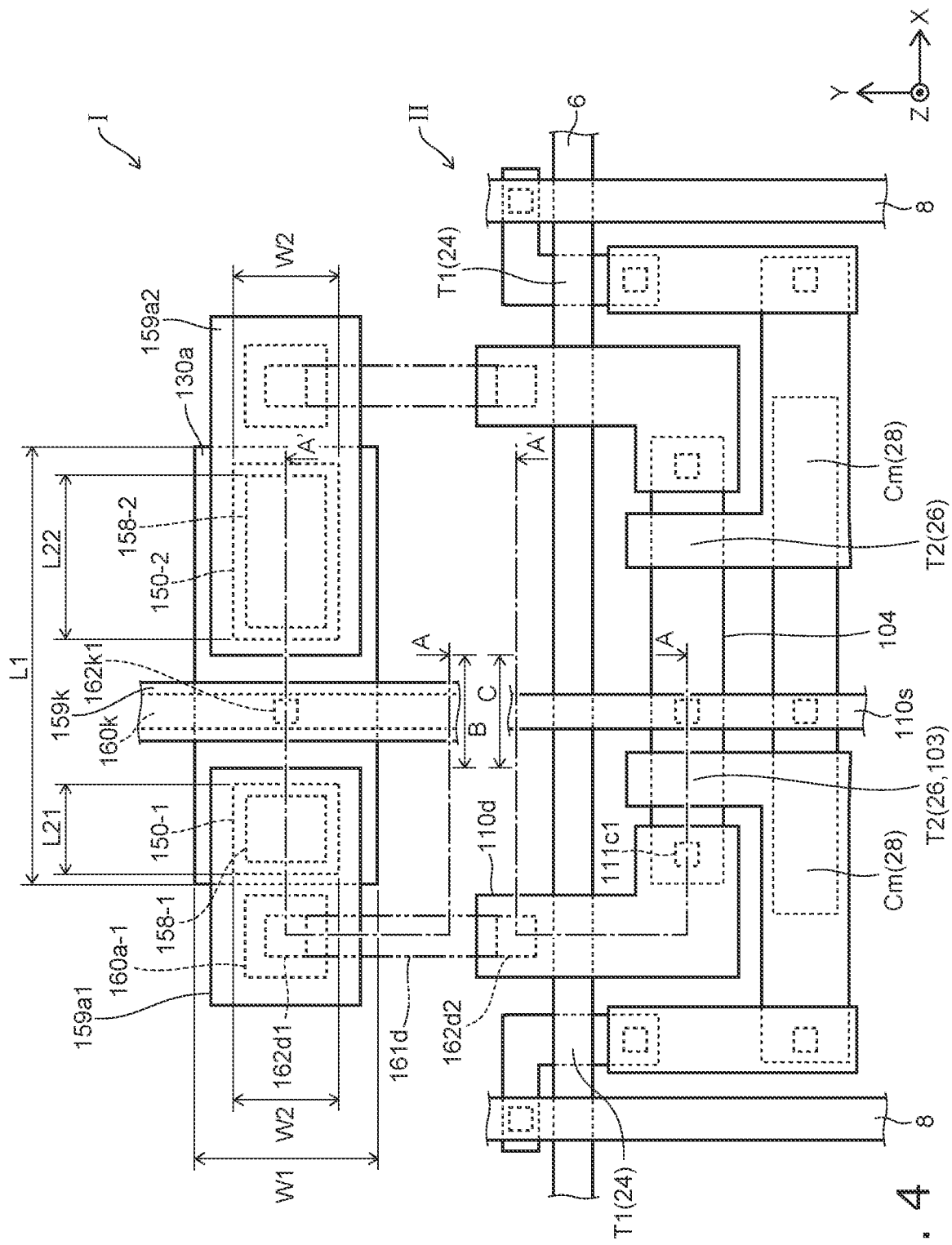
FIG. 4 is a schematic plan view illustrating a portion of the image display device according to the first embodiment.

FIG. 4 is a schematic plan view illustrating a portion of the image display device according to the present embodiment.

In the present embodiment, as illustrated in FIG. 1, the light-emitting element 150-1 (light-emitting element 22 in FIG. 3) and the drive transistor 103 (drive transistor 26 in FIG. 3) are layered in the Z-axis direction. The anode electrode of the light-emitting element 150-1 is electrically connected to the drain electrode of the transistor 103 by the via 161d. Further, a cathode electrode of the light-emitting element 150-1 is connected to the light-reflecting plate 130a, and the light-reflecting plate 130a is electrically connected to the ground line 4 illustrated in FIG. 3 by the via 161k.

Similarly, an anode electrode and a cathode electrode of the light-emitting element 150-2 are also electrically connected to a predetermined circuit by a via. FIG. 4 schematically illustrates these three-dimensional configurations broken down into two plan views.

A plan view of the first layer is schematically illustrated in the upper portion of FIG. 4, and a plan view of the second layer is schematically illustrated in the lower portion. In FIG. 4, the first layer is denoted by "I" and the second layer is denoted by "II." The first layer is a layer in which the light-emitting elements 150-1, 150-2 are formed. That is, the first layer illustrates an element further on the positive side of the Z axis than the first interlayer insulating film 112 in FIG. 1, and the element is a layer from the light-reflecting plate 130a to the second wiring layer 160. In FIG. 4, the second interlayer insulating film 156 is not illustrated.

The second layer illustrates an element that is further on the positive side of the Z axis than is the TFT lower layer film 106 in FIG. 1, and the element is a layer from the transistor 103 to the first interlayer insulating film 112. In FIG. 4, the substrate 102, the insulating layer 105, the insulating film 108, and the first interlayer insulating film 112 are not illustrated.

The cross-sectional view of FIG. 1 is an aligned section view taken along the lines AA' indicated by the dashed lines of alternate long and short dashes in the first layer and the second layer in FIG. 4.

In the present embodiment, a case is illustrated in which the wiring line 160k of the first layer and the wiring line 110s of the second layer extend substantially parallel to the Y-axis direction on substantially the same X coordinate. In the lines AA' in FIG. 4, end portions on the A side are the positions of the wiring lines 160k, 110s. The wiring lines 160k, 110s are disposed parallel to each other by being extended in the Y-axis direction on the same X coordinate. Therefore, when a cross-sectional view is taken along the line AA', the cross section of the end portion on the A side of the wiring line 160k is actually above the wiring line 110s. However, illustrating the cross section of the wiring line 160k at the end portion on the A side causes the illustration to become complex. Therefore, in the cross-sectional views of FIG. 1 and the like, for the end portion on the A side, the cross section of the wiring line 110s is illustrated and illustration of a region B including the wiring line 160k and the light-transmitting electrode 159k is omitted. Further, for the A' side, the cross section of the wiring line 160k and the light-transmitting electrode 159k is illustrated and illustration of a region C including the wiring line 110s is omitted. The same applies to the other embodiments described below as well. The region B is a region of the cut line AA' in which the wiring line 160k and the light-transmitting electrode 159k of the first layer are present, but are not denoted in the cross-sectional view. The region C is a region of the cut line AA' in which the wiring line 110s of the second layer is present, but is not denoted in the cross-sectional view.

As illustrated in FIG. 4, the light-emitting elements 150-1, 150-2 are provided on the light-reflecting plate 130a. The light-reflecting plate 130a is connected to the via 161k illustrated in FIG. 1. The via 161k illustrated in FIG. 1 is connected to the wiring line 160k by a contact hole 162k1.

In the light-emitting element 150-1, an opening 158-1 in the interlayer insulating film is provided. The via 161d is provided adjacent to the light-emitting element 150-1. The via 161d is schematically illustrated in FIG. 4 by a two-dot chain line. In the first layer, the via 161d is connected to the wiring line 160a-1 by a contact hole 162d1. The light-transmitting electrode 159a1 is provided over the light-emitting element 150-1 and the wiring line 160a-1 exposed from the opening 158-1, and electrically connects the light-emitting element 150-1 and the via 161d. In the second layer, the via 161d is connected to the wiring line 110d by a contact hole 162d2.

The wiring line 110d is connected to the via 111d illustrated in FIG. 1 via a contact hole 111c1 open to the insulating film 108, and is connected to the drain electrode of the transistor 103 provided in the TFT channel 104.

In this way, the light-emitting element 150-1 formed in the first layer and the wiring line 110d formed in the second layer that differs from the first layer can be electrically connected and the light-emitting element 150-1 and the transistor 103 can be electrically connected by the via 161d passing through the two interlayer insulating films 112, 156. Similarly, the connection between the light-emitting element 150-2 and the transistor that drives the light-emitting element 150-2 is also made through the via passing through the two interlayer insulating films.

The arrangement of the light-reflecting plate 130a and the light-emitting elements 150-1, 150-2 will now be described using FIG. 4. The light-reflecting plate 130a is a rectangle having a length L1 in the X-axis direction and a length W1 in the Y-axis direction in an XY plane view. On the other hand, in an XY plane view, the light-emitting element 150-1 has a rectangular bottom surface having a length L21 in the X-axis direction and a length W2 in the Y-axis direction. The light-emitting element 150-2 has a rectangular bottom surface with a length L22 in the X-axis direction and the length W2 in the Y-axis direction in an XY plane view.

The lengths of each component are set so that L1>L21, L1>L22, W1>W2. That is, the area of the light-reflecting plate 130a is set larger than the sum of the areas of the light-emitting elements 150-1, 150-2. The light-reflecting plate 130a is provided directly below the light-emitting elements 150-1, 150-2, and the outer peripheries of the light-emitting elements 150-1, 150-2 are entirely located within the outer periphery of the light-reflecting plate 130a. Outer peripheries of the light-emitting elements 150-1, 150-2 need only be fully located within the outer periphery of the light-reflecting plate 130a. A shape of the light-reflecting plate 130a, depending on the layout and the like on the circuit substrate 100, is not limited to a rectangular shape and can be any suitable shape.

The light-emitting element 150 emits light upward. On the other hand, radiated light directed downward from the light-emitting element 150 exists, and scattered light and the like exist in the reflected light at the interface between the interlayer insulating film 112 and the surface resin layer 170. The conductive layer 130 includes the light-reflecting plate 130a having light reflection properties, and thus the light scattered downward of the light-emitting elements 150-1, 150-2 is reflected upward by the light-reflecting plate 130a. As a result, the proportion of light emitted from the light-emitting elements 150-1, 150-2 to the light-emitting surface 153S1, 153S2 side is increased. Accordingly, a substantial light emission efficiency of the light-emitting element 150 is improved. Further, with the light-reflecting plate 130a set in this manner, the arrival of light downward of the light-emitting elements 150-1, 150-2 is suppressed, making it possible to mitigate the effects of light on the circuit elements even in a case in which the circuit elements are disposed in the vicinity directly below the light-emitting elements 150-1, 150-2.

The conductive layer 130 is not limited to being connected to the ground line 4 by the light-reflecting plate 130a, and may be connected to another electrical potential such as the electric potential of the power source line 3, depending on the circuit configuration and the circuit layout.

A manufacturing method of the image display device 1 according to the present embodiment will now be described.

FIG. 5A to FIG. 7B are schematic cross-sectional views illustrating the manufacturing method of the image display device according to the present embodiment.

Figure 5A:
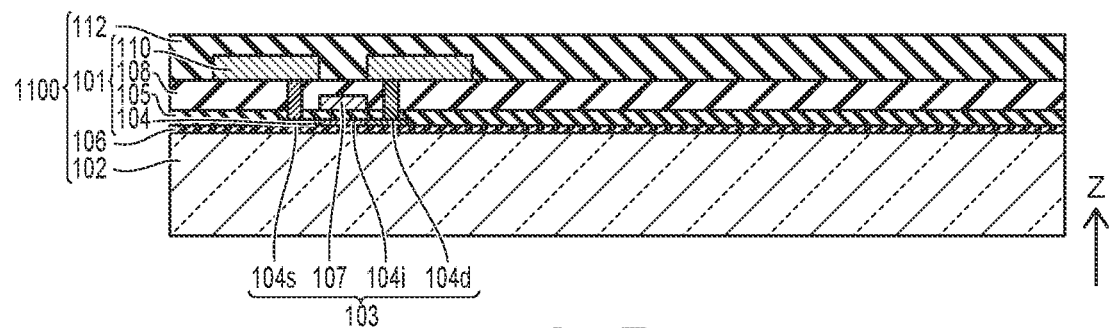
FIG. 5A is a schematic cross-sectional view illustrating a manufacturing method of the image display device according to the first embodiment.

As illustrated in FIG. 5A, in the manufacturing method of the image display device 1 according to the present embodiment, a circuit substrate 1100 is prepared. The circuit substrate (first substrate) 1100 includes the circuit 101 described in FIG. 1 and the like. In the circuit substrate 1100, the first interlayer insulating film (first insulating film) 112 covers the wiring layer 110.

Figure 5B:
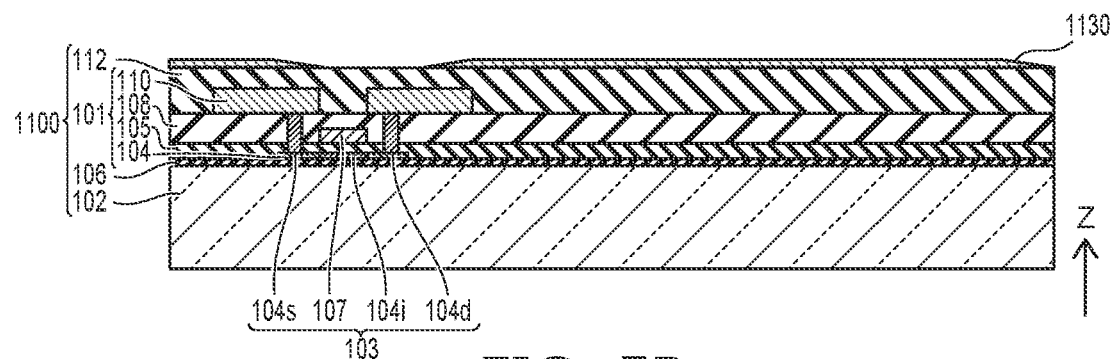
FIG. 5B is a schematic cross-sectional view illustrating the manufacturing method of the image display device according to the first embodiment.

As illustrated in FIG. 5B, a conductive layer 1130 is formed on the interlayer insulating film 112. The conductive layer 1130 is obtained by, for example, forming on the entire surface of the interlayer insulating film 112, by sputtering or the like, a layer of a metal material that is to form the conductive layer 1130, and then patterning the material, leaving locations where the light-emitting elements are to be formed. Alternatively, a conductive layer may be formed by providing a mask having a pattern open at locations where the light-emitting elements are to be formed on the interlayer insulating film 112, and subsequently patterning the material. For the conductive layer 1130, a metal material such as Cu or Hf is used, for example. For formation of the conductive layer 1130, sputtering or the like is preferably used in order to form a film at low temperature.

The patterned conductive layer 1130 is monocrystallized by an annealing process. Preferably, an annealing process is performed so that monocrystallization is achieved across the patterned conductive layer 1130. For the monocrystallization of the conductive layer 1130, an annealing process by laser irradiation, for example, is preferably used. In pulse laser annealing, the conductive layer 1130 can be monocrystallized in a state in which the effect of temperature on a lower layer below the conductive layer is suppressed to a low temperature ranging from about 400° C. to about 500° C., and is therefore suitable for treatment of the circuit substrate 1100 formed by the LTPS process.

Figure 6A:
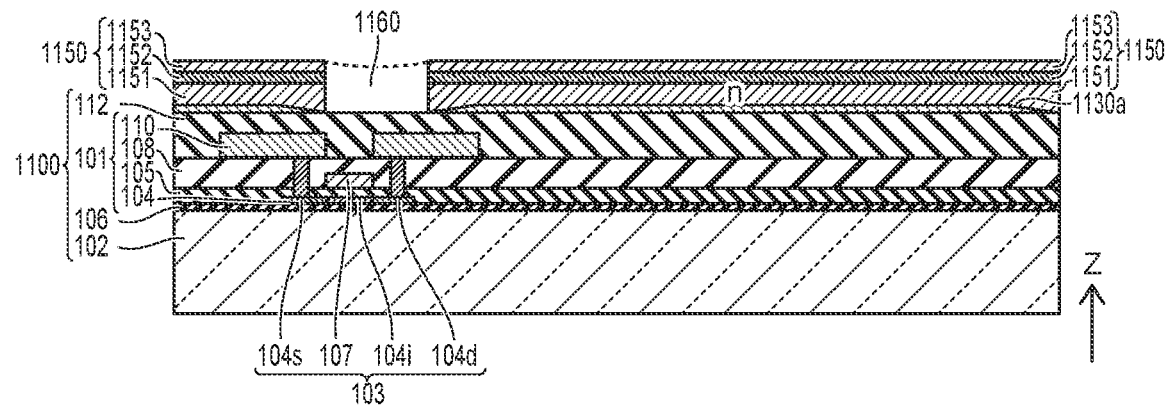
FIG. 6A is a schematic cross-sectional view illustrating the manufacturing method of the image display device according to the first embodiment.

As illustrated in FIG. 6A, a semiconductor layer 1150 is formed over a conductive layer 1130*a* that is monocrystallized. The semiconductor layer 1150 is formed in the order of an n-type semiconductor layer 1151, a light-emitting layer 1152, and a p-type semiconductor layer 1153, in the positive direction of the Z axis from the side of the conductive layer 1130*a*. Crystal defects caused by crystal lattice mismatch readily occur during initial growth of the semiconductor layer 1150, and crystals with GaN as a main component generally exhibit n-type semiconductor properties. Therefore, by growing the semiconductor layer 1150 onto the conductive layer 1130*a* from the n-type semiconductor layer 1151, yield can be improved.

For formation of the semiconductor layer 1150, a physical vapor deposition method such as vapor deposition, ion beam deposition, molecular beam epitaxy (MBE), or sputtering is used, and a low-temperature sputtering method is preferably used. Note that, in the low-temperature sputtering method, the temperature can be made lower when assistance is provided by light or plasma during film formation, and thus such a method is preferred. With epitaxial growth by metal organic chemical vapor deposition (MOCVD), the temperature may exceed 1000° C. In contrast, in the low-temperature sputtering method, it is known that a GaN crystal including a light-emitting layer can be epitaxially grown on a single crystal metal layer at a low temperature ranging from about 400° C. to about 700° C. (refer to Non Patent Documents 1 and 2 and the like, Non Patent Document 1: H. Kim, J. Ohta, K. Ueno, A. Kobayashi, M. Morita, Y. Tokumoto & H. Fujioka, "Fabrication of full-color GaN-based light-emitting diodes on nearly lattice-matched flexible metal foils", SCIENTIFIC REPORTS, 7, No. 2112 (May 18, 2017), and Non Patent Document 2: J. W. Shon, J. Ohta, K. Ueno, A. Kobayashi & H. Fujioka, "Fabrication of full-color InGaN-based light-emitting diodes on amorphous substrates by pulsed sputtering", SCIENTIFIC REPORTS, 4, No. 5325 (Jun. 23, 2014)). Such a low-temperature sputtering method is consistent with formation of the semiconductor layer 1150 on a circuit substrate including TFTs and the like formed in an LTPS process. The semiconductor layer 1150 of GaN is grown on the conductive layer 1130*a* monocrystallized across the entire surface using an appropriate film formation technique, thereby forming the monocrystallized semiconductor layer 1150 including the light-emitting layer 1152 on the conductive layer 1130*a*. The conductive layer 1130*a* is patterned and, in a case in which there is a location where the conductive layer 1130*a* is not present or a location of the conductive layer that is not monocrystallized, a deposit 1160 that contains GaN and is not monocrystallized is formed as illustrated by the dashed line in FIG. 6A.

In the present embodiment, the conductive layer 1130*a* of the single crystal metal is used as a seed to promote crystal formation of GaN. In a case in which the semiconductor layer 1150 is formed on the monocrystallized conductive layer 1130*a*, a buffer layer having conductivity may be provided on the conductive layer 1130*a*, and the semiconductor layer may be grown on this buffer layer by the low-temperature sputtering method described above or the like. For the buffer layer, any type of material may be used as long as the material promotes crystal formation of GaN. A graphene sheet of the other embodiments described below may be used.

Figure 6B:
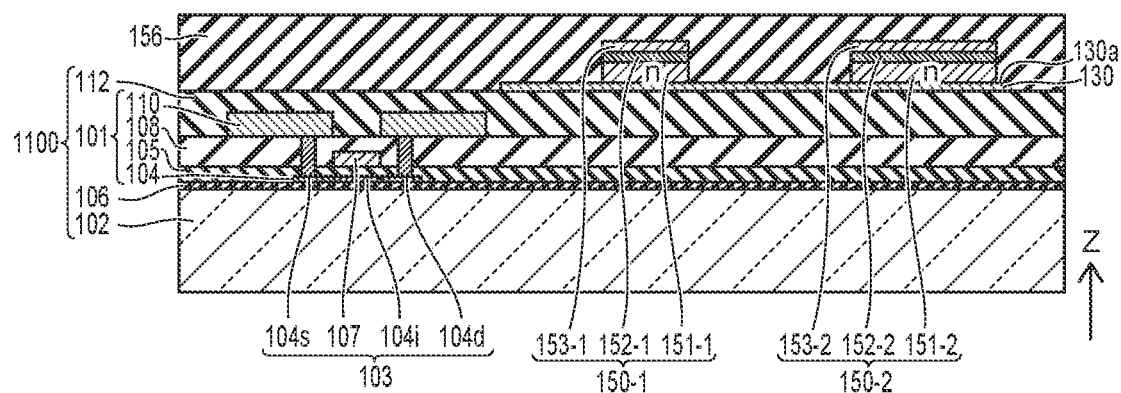
FIG. 6B is a schematic cross-sectional view illustrating the manufacturing method of the image display device according to the first embodiment.

As illustrated in FIG. 6B, the conductive layer is molded into the conductive layer 130 having a desired shape and pattern by etching or the like. The conductive layer 130 includes the light-reflecting plate (portion) 130*a*. The semiconductor layer 1150 is molded into a desired shape by etching or the like, forming the light-emitting elements 150-1, 150-2. In this example, the area of the light-emitting element 150-1 in an XY plane view is molded smaller than the area of the light-emitting element 150-2 in an XY plane view. Subsequently, the second interlayer insulating film (second insulating film) 156 is formed covering the first interlayer insulating film 112, the conductive layer 130, and the light-emitting elements 150-1, 150-2.

Figure 7A:
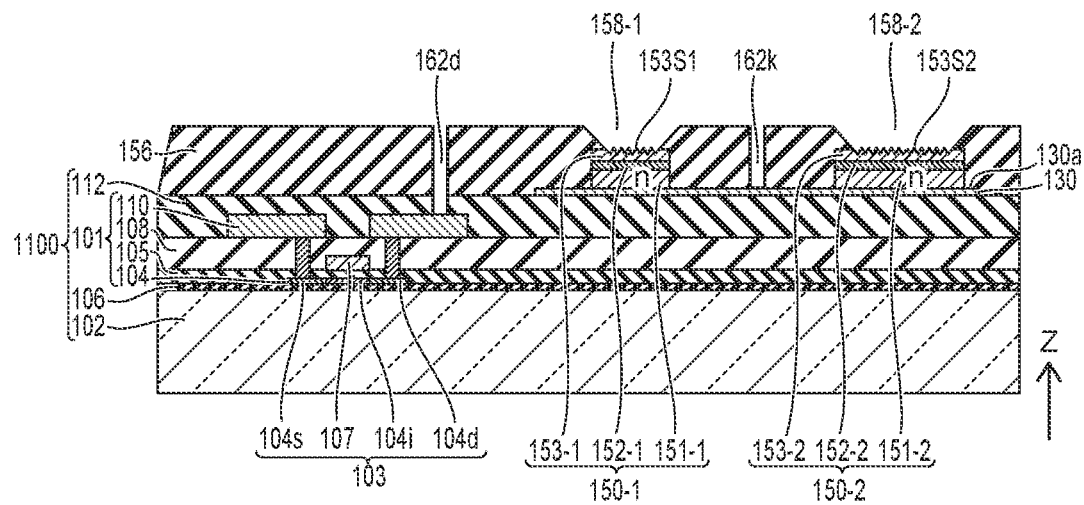
FIG. 7A is a schematic cross-sectional view illustrating the manufacturing method of the image display device according to the first embodiment.

As illustrated in FIG. 7A, the via hole 162*k* is formed through the second interlayer insulating film 156. The via hole 162*d* is formed through the interlayer insulating films 112, 156. Simultaneously with forming the via hole 162*k* and the via hole 162*d*, the openings 158-1, 158-2 are formed in the interlayer insulating film 156, exposing the light-emitting surfaces 153S1, 153S2. The openings 158-1, 158-2 may be formed before formation of the via hole 162*k* and the via hole 162*d* or after formation of the via hole 162*k* and the via hole 162*d*. The exposed light-emitting surfaces 153S1, 153S2 are roughened.

Figure 7B:
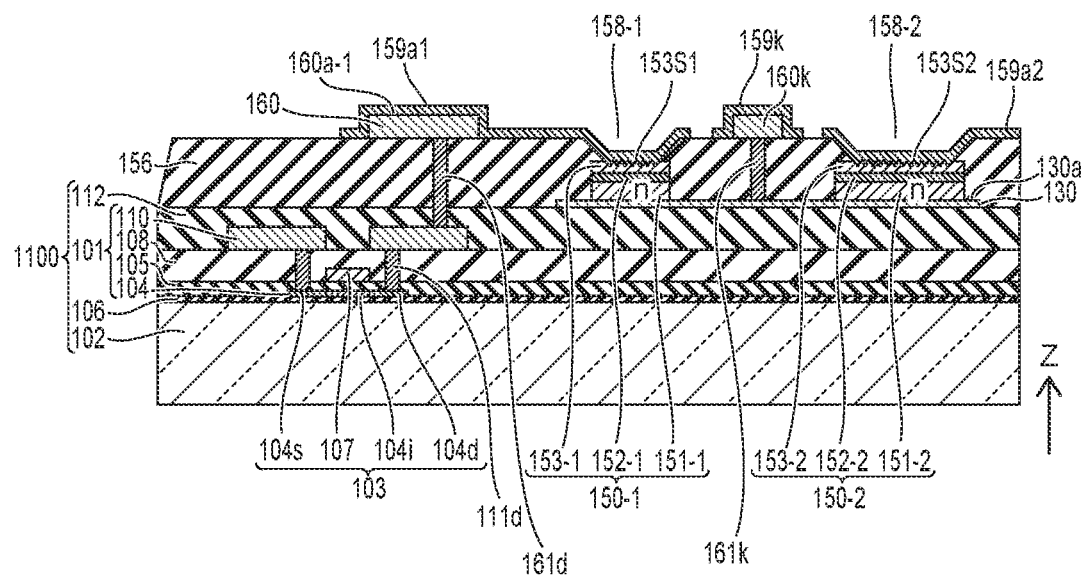
FIG. 7B is a schematic cross-sectional view illustrating the manufacturing method of the image display device according to the first embodiment.

As illustrated in FIG. 7B, the via holes 162*d*, 162*k* illustrated in FIG. 7A are filled with a conductive material. Subsequently or simultaneously with filling the via holes or the like, the second wiring layer 160 is formed. The light-transmitting electrode 159*a*1 is formed over the light-emitting surface 153S1 and over the wiring line 160*a*-1, electrically connecting the p-type semiconductor layer 153-1 and the wiring line 160a-1. At the same time, the light-transmitting electrode 159a2 is formed over the light-emitting surface 153S2, and the light-transmitting electrode 159a2 is electrically connected to an electrode for another drive transistor different from the transistor 103. The light-transmitting electrode 159k is simultaneously formed on the wiring line 160k as well.

Note that, as described above, in order to insulate the light-emitting elements 150-1, 150-2, and the like, the interlayer insulating film 156 need only cover these layers. The interlayer insulating film 156 need only have a flatness that allows the second wiring layer 160 to be formed on the interlayer insulating film 156, and need not be flattened when the interlayer insulating film 156 is formed. In a case in which the interlayer insulating film 156 is not flattened, the process for flattening can be reduced and, other than in the locations where the light-emitting elements 150-1, 150-2 are formed, a thickness of the interlayer insulating film 156 can be decreased. At locations where the thickness of the interlayer insulating film 156 is thin, a depth of the via holes 162k, 162d can be decreased. With formation of a shallow via hole, a sufficient opening diameter across the depth of the via hole can be ensured, making it easy to secure an electrical connection by the via. Therefore, a reduction in yield due to poor electrical properties can be suppressed.

Figure 8A:
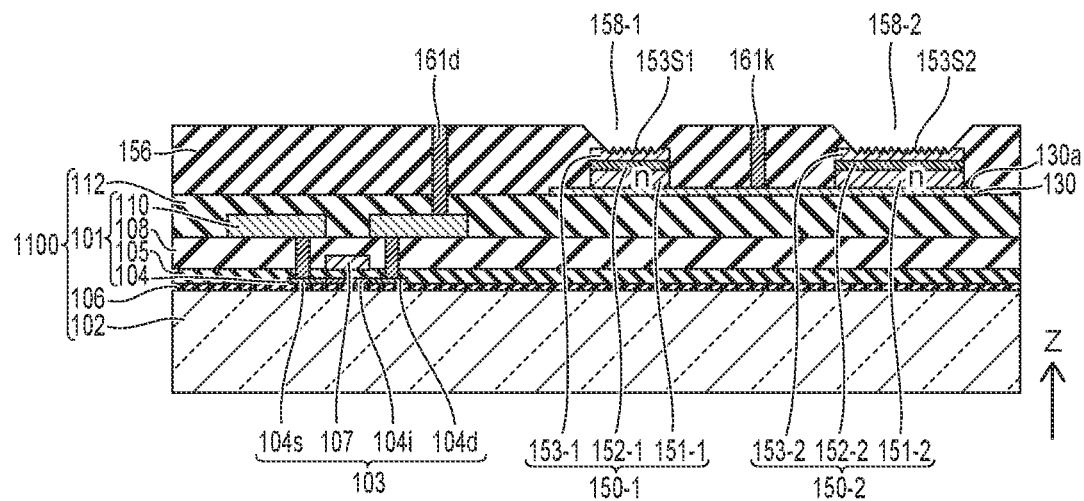
FIG. 8A is a schematic cross-sectional view illustrating a manufacturing method of a modified example of the image display device according to the first embodiment.
Figure 8B:
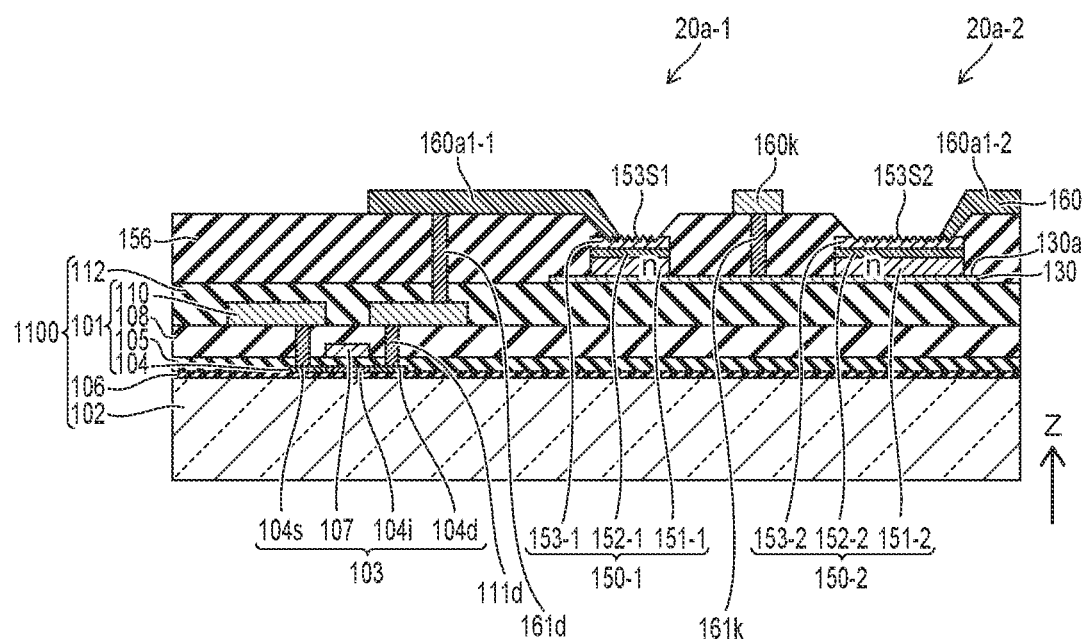
FIG. 8B is a schematic cross-sectional view illustrating the manufacturing method of the modified example of the image display device according to the first embodiment.

FIG. 8A and FIG. 8B are schematic cross-sectional views illustrating the manufacturing method of a modified example of the image display device according to the present embodiment.

FIG. 8A and FIG. 8B illustrate the manufacturing process for forming the sub-pixels illustrated in FIG. 2A. In the present modified example, until formation of the openings 158-1, 158-2, the method includes the same processes as those in the other embodiment described above. Accordingly, the execution of the processes in FIG. 8A and FIG. 8B, following FIG. 7A, will be described below.

As illustrated in FIG. 8A, the openings 158-1, 158-2 are formed, exposing the light-emitting surfaces 153S1, 153S2 of the p-type semiconductor layers 153-1, 153-2, and subsequently the light-emitting surfaces 153S1, 153S2 are roughened. As in the embodiment illustrated in FIG. 7B described above, the via hole 162k passing through the interlayer insulating film 156 is filled with a conductive material, and the via 161k is formed. Similarly, the via hole 162d passing through the interlayer insulating films 112, 156 is filled with a conductive material, and the via 161d is formed.

As illustrated in FIG. 8B, the wiring layer 160 including the wiring lines 160a1-1, 160a1-2, 160k is formed on the interlayer insulating film 156. The wiring line 160a1-1 is connected to a surface including the exposed light-emitting surface 153S1. The wiring line 160a1-2 is connected to a surface including the exposed light-emitting surface 153S2.

In this way, the sub-pixels 20a-1, 20a-2 of the modified example are formed.

Figure 9A:
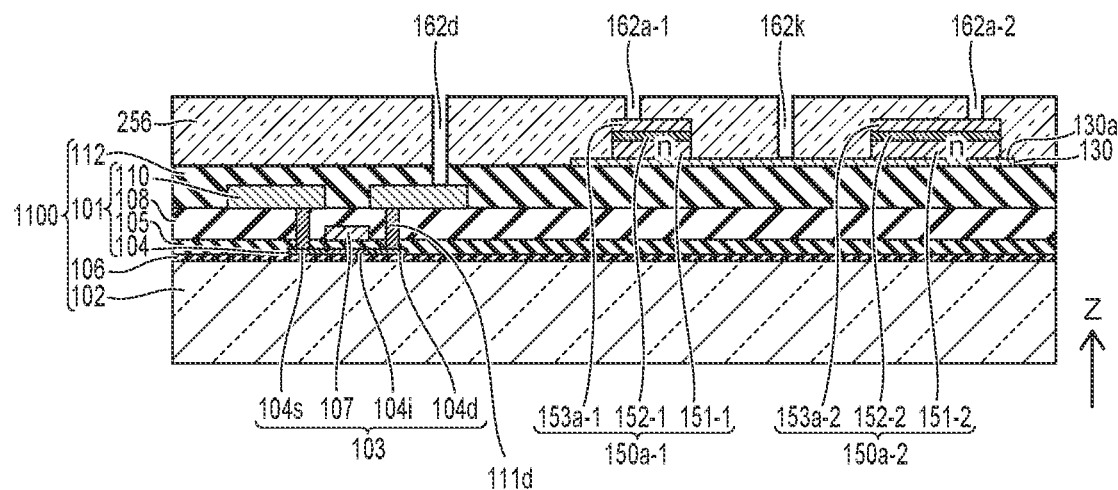
FIG. 9A is a schematic cross-sectional view illustrating the manufacturing method of the modified example of the image display device according to the first embodiment.
Figure 9B:
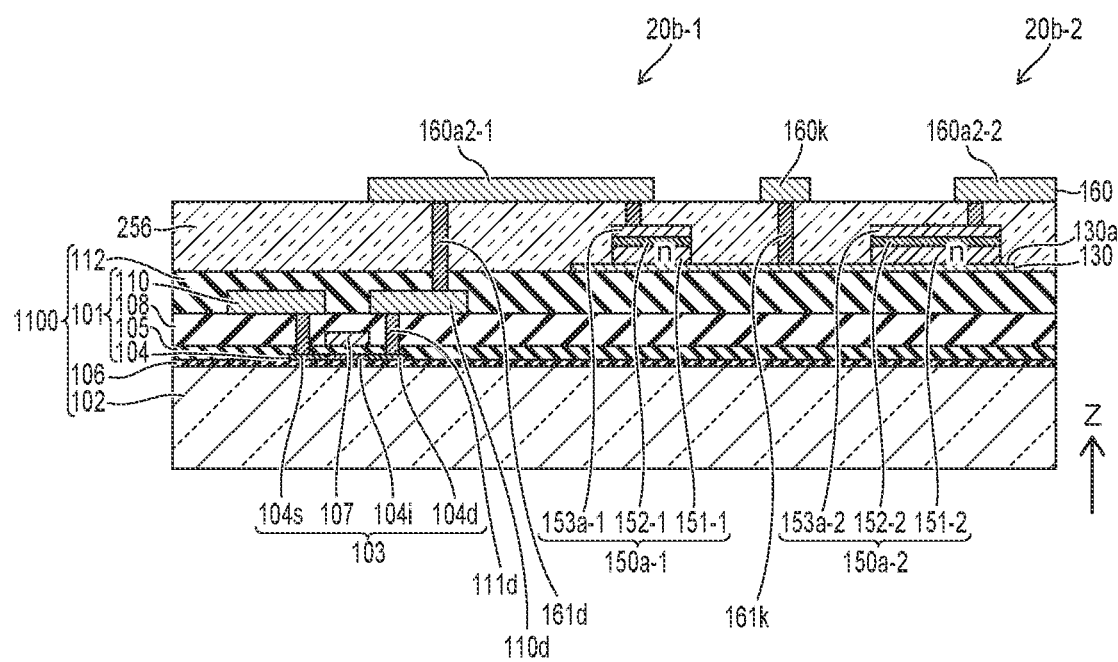
FIG. 9B is a schematic cross-sectional view illustrating the manufacturing method of the modified example of the image display device according to the first embodiment.

FIG. 9A and FIG. 9B are schematic cross-sectional views illustrating the manufacturing method of the modified example of the image display device according to the present embodiment.

FIG. 9A and FIG. 9B illustrate the manufacturing process for forming the sub-pixels illustrated in FIG. 2B. In the present modified example, until formation of the light-emitting elements, the method includes the same processes as those in the other embodiment described above. Accordingly, the processes of FIG. 9A and FIG. 9B, following FIG. 6A, will be described below. In the case of the other embodiments, the interlayer insulating film 156 is formed of an opaque material such as white resin, whereas in the present modified example, the interlayer insulating film 256 is formed of an insulating material having transmittance as described above.

As illustrated in FIG. 9A, the conductive layer 1130a illustrated in FIG. 6A is molded into the conductive layer 130 having a desired shape and pattern by etching or the like. The conductive layer 130 includes the light-reflecting plate 130a. The semiconductor layer 1150 illustrated in FIG. 6A is molded into a desired shape by etching or the like, forming the light-emitting elements 150a-1, 150a-2. Subsequently, the second interlayer insulating film 256 covering the first interlayer insulating film 112, the conductive layer 130, and the light-emitting elements 150a-1, 150a-2 is formed. The interlayer insulating film 256 is an insulating resin having light transmittance, and is preferably a transparent resin.

Contact holes 162a-1, 162a-2 are formed in the second interlayer insulating film 256. The via hole 162k passing through the interlayer insulating film 256 is formed. The via hole 162d passing through the interlayer insulating films 112, 156 is formed. For example, reactive ion etching (RIE) or the like is used for forming the contact holes and the via holes.

As illustrated in FIG. 9B, the contact holes 162a-1, 162a-2 and the via holes 162d, 162k are filled with a conductive material. Subsequently, the second wiring layer 160 is formed, and the wiring lines 160a2-1, 160a2-2, 160k are formed. The wiring line 160a2-1 is connected to the p-type semiconductor layer 153a-1 at one end and is connected to the wiring line 110d by the via 161d at the other end. The wiring line 160a2-2 is connected to a p-type semiconductor layer 153a-2 at one end and is connected to the wiring line for the other drive transistor by the via at the other end. The second wiring layer 160 may be formed at the same time as the via holes 162d, 162k are filled with the conductive material.

In this way, the sub-pixels 20b-1, 20b-2 of the modified example are formed.

The portion of the circuit other than the sub-pixels 20-1, 20-2 is formed in the circuit substrate 1100. For example, the row selection circuit 5 illustrated in FIG. 3 is formed in the circuit substrate 1100 along with drive transistors, selection transistors, and the like. That is, the row selection circuit 5 may be incorporated at the same time by the manufacturing process described above. On the other hand, it is desirable to incorporate the signal voltage output circuit 7 into a semiconductor device manufactured by a manufacturing process that permits high integration by microprocessing. The signal voltage output circuit 7 is mounted on another substrate together with a central processing unit (CPU) and other circuit elements, and is interconnected with the wiring lines of the circuit substrate 1100 before incorporation of, for example, a color filter described below, or after incorporation of the color filter.

For example, the circuit substrate 1100 includes the substrate 102 composed of a glass substrate including the circuit 101 and having light transmittance, and the substrate 102 is substantially rectangular. The circuit 101 for one or a plurality of image display devices is formed on the circuit substrate 1100. In the case of a larger screen size or the like, the circuit 101 for constituting one image display device may be divided into a plurality of the circuit substrates 1100, and the divided circuits may be combined to constitute one image display device.

The circuit substrate 1100 includes one substrate 102, and the plurality of circuits 101 are disposed in a lattice pattern, for example, on the one substrate 102. The circuit 101 includes all sub-pixels 20 and the like required for the one image display device 1. An interval about a scribe line width is provided between the circuits 101 adjacently disposed. Circuit elements and the like are not disposed at an end portion or near an end portion of the circuit 101.

Figure 10:
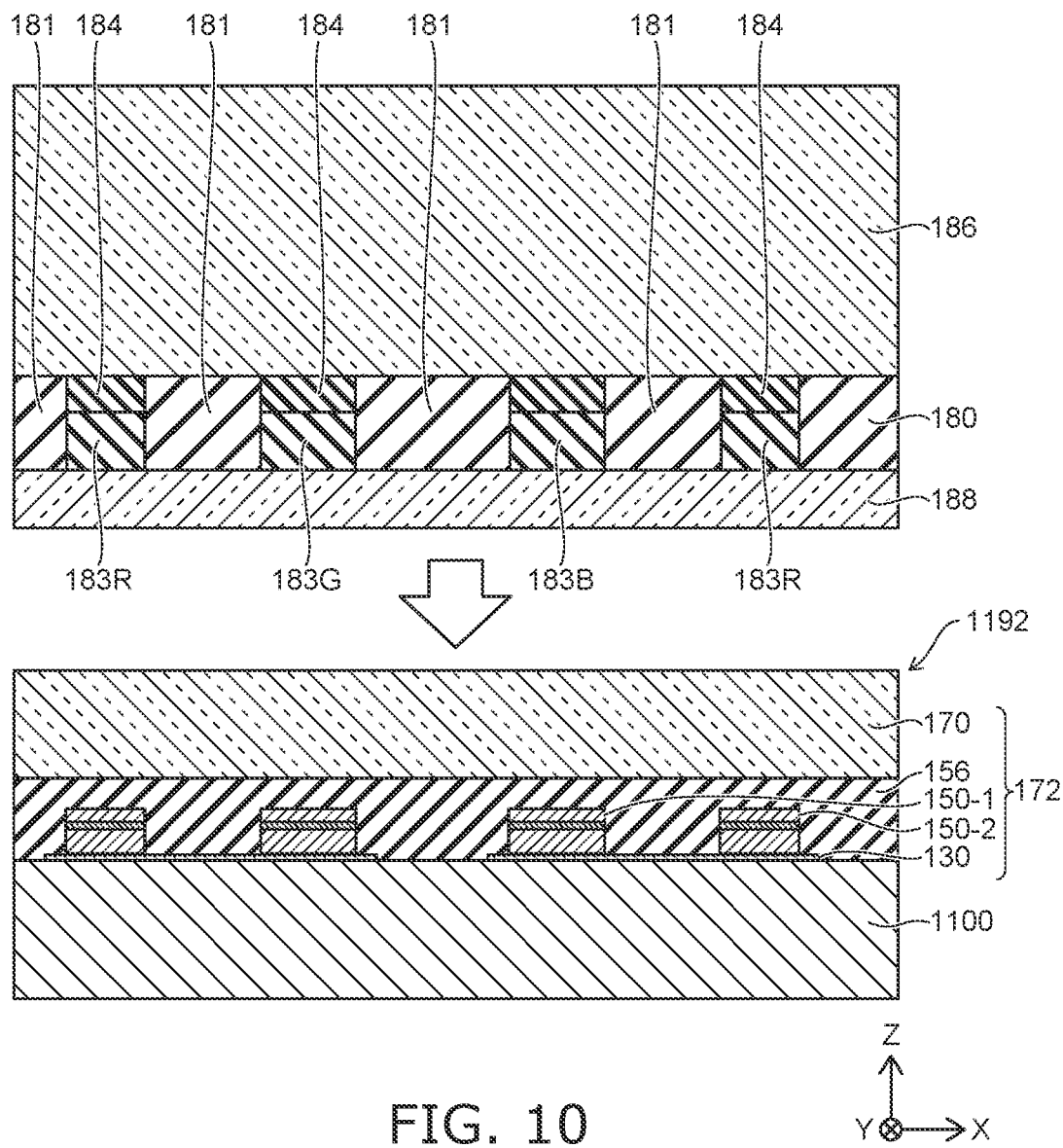
FIG. 10 is a schematic cross-sectional view illustrating the manufacturing method of the image display device according to the first embodiment.

FIG. 10 is a schematic cross-sectional view illustrating the manufacturing method of the image display device according to the present embodiment.

In FIG. 10, the structure within the circuit substrate 1100, the interlayer insulating film 112, the vias 161d, 161k, the wiring layer 160, and the like illustrated in FIG. 1, and the like are omitted to avoid complexity. Further, in FIG. 10, a portion of the color conversion member such as the color filter 180 is illustrated. In FIG. 10, the structure including the conductive layer 130, the light-emitting element 150, the interlayer insulating film 156, the surface resin layer 170, the vias omitted in the illustration, and the like is referred to as a light-emitting circuit portion 172. Further, the structure in which the light-emitting circuit portion 172 is provided on the circuit substrate 1100 is referred to as a structure 1192.

As illustrated in FIG. 10, one surface of the color filter (wavelength conversion member) 180 is adhered to the structure 1192. The other surface of the color filter 180 is adhered to the glass substrate 186. The one surface of the color filter 180 is provided with the transparent thin film adhesive layer 188 and adhered to a surface of the structure 1192 on the side of the light-emitting circuit portion 172 with the transparent film adhesive layer 188 interposed therebetween.

In the color filter 180, in this example, color conversion units are arrayed in the positive direction of the X axis in the order of red, green, and blue. A red color conversion layer 183R is provided in the first layer for red. A green color conversion layer 183G is provided in the first layer for green. A blue color conversion layer 183B is provided in the first layer for blue. While each is provided with the filter layer 184 in the second layer, the frequency characteristics of the filter layer 184, needless to say, can be changed for each color of the color conversion unit. A single layer of the color conversion layer 183B may be provided for blue. The light-blocking portion 181 is provided between each of the color conversion units.

The color filter 180 is adhered to the structure 1192 with the positions of the color conversion layers 183R, 183G, 183B of each color aligned to the position of the light-emitting element 150.

FIG. 11A to FIG. 11D are schematic cross-sectional views illustrating a modified example of the manufacturing method of the image display device according to the present embodiment.

FIG. 11A to FIG. 11D illustrate a method of forming the color filter by ink jetting.

Figure 11A:
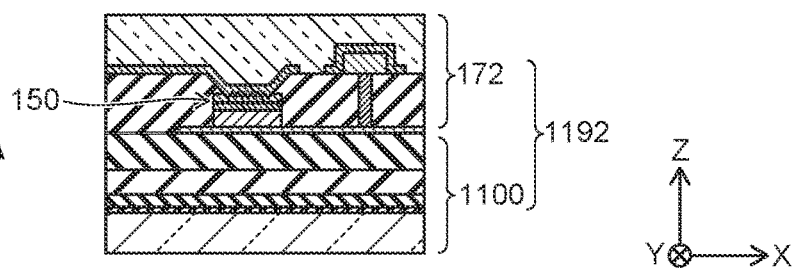
FIG. 11A is a schematic cross-sectional view illustrating the manufacturing method of the image display device according to the first embodiment.

As illustrated in FIG. 11A, the structure 1192 in which the light-emitting circuit portion 172 is adhered to the circuit substrate 1100 is prepared.

Figure 11B:
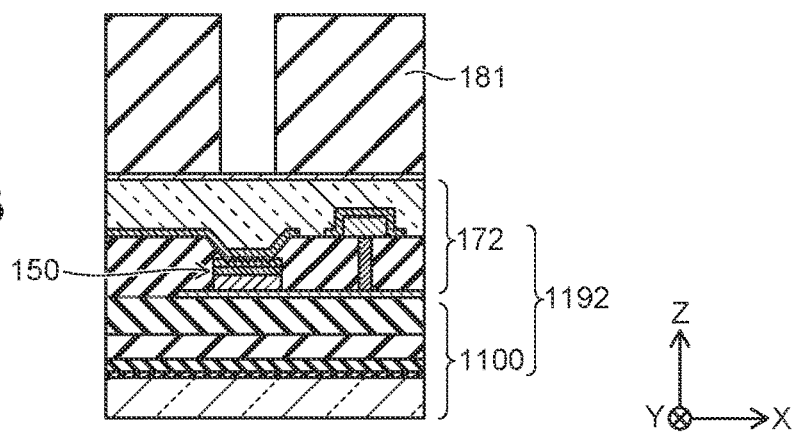
FIG. 11B is a schematic cross-sectional view illustrating the manufacturing method of the image display device according to the first embodiment.

As illustrated in FIG. 11B, the light-blocking portion 181 is formed on the structure 1192. The light-blocking portion 181 is formed using, for example, screen printing or a photolithography technique.

Figure 11C:
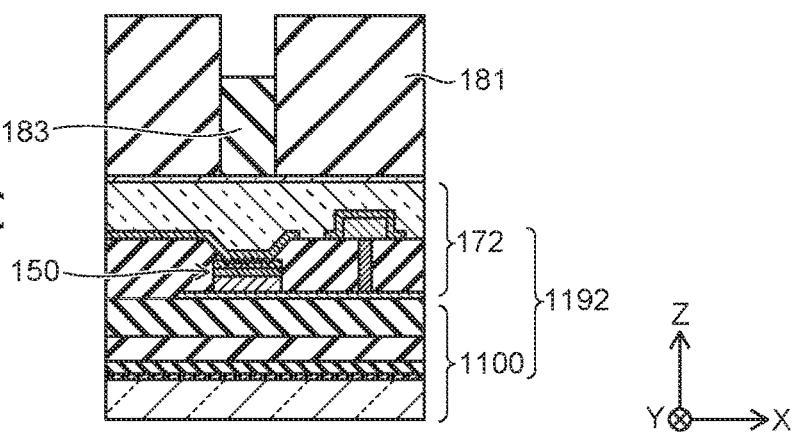
FIG. 11C is a schematic cross-sectional view illustrating the manufacturing method of the image display device according to the first embodiment.

As illustrated in FIG. 11C, a phosphor corresponding to the light emission color is ejected from an inkjet nozzle to form the color conversion layer 183. The phosphor colors the region where the light-blocking portion 181 is not formed. As the phosphor, for example, a fluorescent coating that uses a typical phosphor material, a perovskite phosphor material, or a quantum dot phosphor material is used. Use of a perovskite phosphor material or a quantum dot phosphor material makes it possible to realize each light emission color, high chromaticity, and high color reproducibility, and is thus preferred. After the drawing by the inkjet nozzle, drying is performed at an appropriate temperature and for an appropriate time. A thickness of the coating film at the time of coloring is set thinner than a thickness of the light-blocking portion 181.

As already described, for a blue light-emitting sub-pixel, phosphor is not ejected in a case in which the color conversion unit is not formed. Further, for a blue light-emitting sub-pixel, in a case in which the color conversion unit need only be a single layer when the blue color conversion layer is formed, a thickness of the coating film of the blue phosphor is preferably about the same as the thickness of the light-blocking portion 181.

Figure 11D:
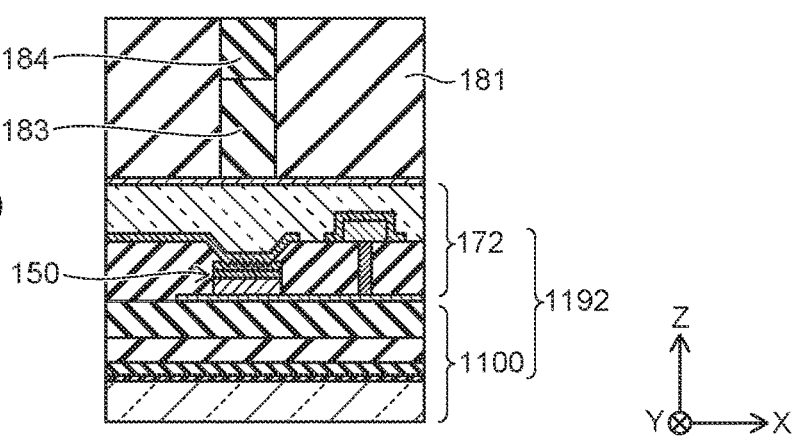
FIG. 11D is a schematic cross-sectional view illustrating the manufacturing method of the image display device according to the first embodiment.

As illustrated in FIG. 11D, the coating for the filter layer 184 is ejected from an inkjet nozzle. The coating is applied so as to overlap the coating film of the phosphor. The total thickness of the coating film of the phosphor and the coating is about the same as the thickness of the light-blocking portion 181.

Effects of the image display device 1 of the present embodiment will now be described.

In the manufacturing method of the image display device 1 according to the present embodiment, circuit elements such as the transistor 103 that drives the light-emitting elements 150-1, 150-2 are formed in advance on the circuit substrate 1100, and the conductive layer 1130 is formed on the interlayer insulating film 112 of the circuit substrate 1100. The conductive layer 1130 is monocrystallized by annealing the entire surface. The semiconductor layer 1150 can be formed on the monocrystallized conductive layer 1130a. The light-emitting elements 150-1, 150-2 connected to the conductive layer 130 can be formed by molding the formed semiconductor layer 1150 into a desired shape. As a result, the process of transferring the light-emitting elements 150-1, 150-2 can be shortened compared to individually transferring individualized light-emitting elements to the circuit substrate 1100.

For example, the number of sub-pixels exceeds 24 million in an image display device with 4K image quality, and exceeds 99 million in the case of an image display device with 8K image quality. To individually mount such a large number of light-emitting elements onto a circuit substrate requires an enormous amount of time, making it difficult to realize an image display device that uses micro LEDs at a realistic cost. Further, individually mounting a large number of light-emitting elements reduces yield due to connection failure and the like during mounting, and thus further increases in cost cannot be avoided.

In contrast, with the manufacturing method of the image display device 1 according to the present embodiment, the light-emitting elements 150-1, 150-2 are formed after the entire semiconductor layer 1150 is formed on the conductive layer 1130 formed on the circuit substrate 1100, making it possible to reduce the transfer process of the light-emitting elements.

The semiconductor layer 1150 having a uniform crystal structure grows on the conductive layer 1130a of a single crystal metal, and thus the light-emitting elements can be self-aligned by appropriately patterning the conductive layer 1130a. As a result, it is not necessary to align the light-emitting elements on the circuit substrate 1100, and the sizes of the light-emitting elements 150-1, 150-2 are readily reduced, which is suitable for a high-definition display.

After the light-emitting elements are formed directly on the circuit substrate by etching or the like, the light-emitting elements and the circuit elements in the circuit substrate 1100 are electrically connected by via formation, making it possible to realize a uniform connection structure and suppress a reduction in yield.

In the present embodiment, a TFT formed on a glass substrate can be used as the circuit substrate 1100, for example, making it possible to utilize an existing flat panel manufacturing process and plant.

The image display device 1 according to the present embodiment includes the conductive layer 130 that includes the light-reflecting plate 130*a*, and the light-emitting elements are formed on the light-reflecting plate 130*a*. The light-emitting surfaces 153S1, 153S2 of the light-emitting elements 150, 150*a* are provided on sides facing the interlayer insulating film 112 provided with the light-reflecting plate 130*a*. Therefore, light that is scattered downward from the light-emitting elements 150-1, 150-2 is reflected by the light-reflecting plate 130*a* and distributed on the side of the light-emitting surfaces 153S1, 153S2. Accordingly, the light emission efficiency of the light-emitting elements 150-1, 150-2 is substantially improved.

The light-reflecting plate 130*a* can block the scattered light downward of the light-emitting elements 150-1, 150-2, making it possible to suppress irradiation of light to circuit elements in the vicinity below the light-emitting elements 150-1, 150-2, and prevent malfunction and the like of the circuit elements.

The light-reflecting plate 130*a* has conductivity and is ohmic-connected to the n-type semiconductor layers 151-1, 151-2. Therefore, the electrical connections with the light-emitting elements 150-1, 150-2 can be utilized to reduce the wiring lines on the side of the light-emitting surfaces 153S1, 153S2.

Second Embodiment

Figure 12:
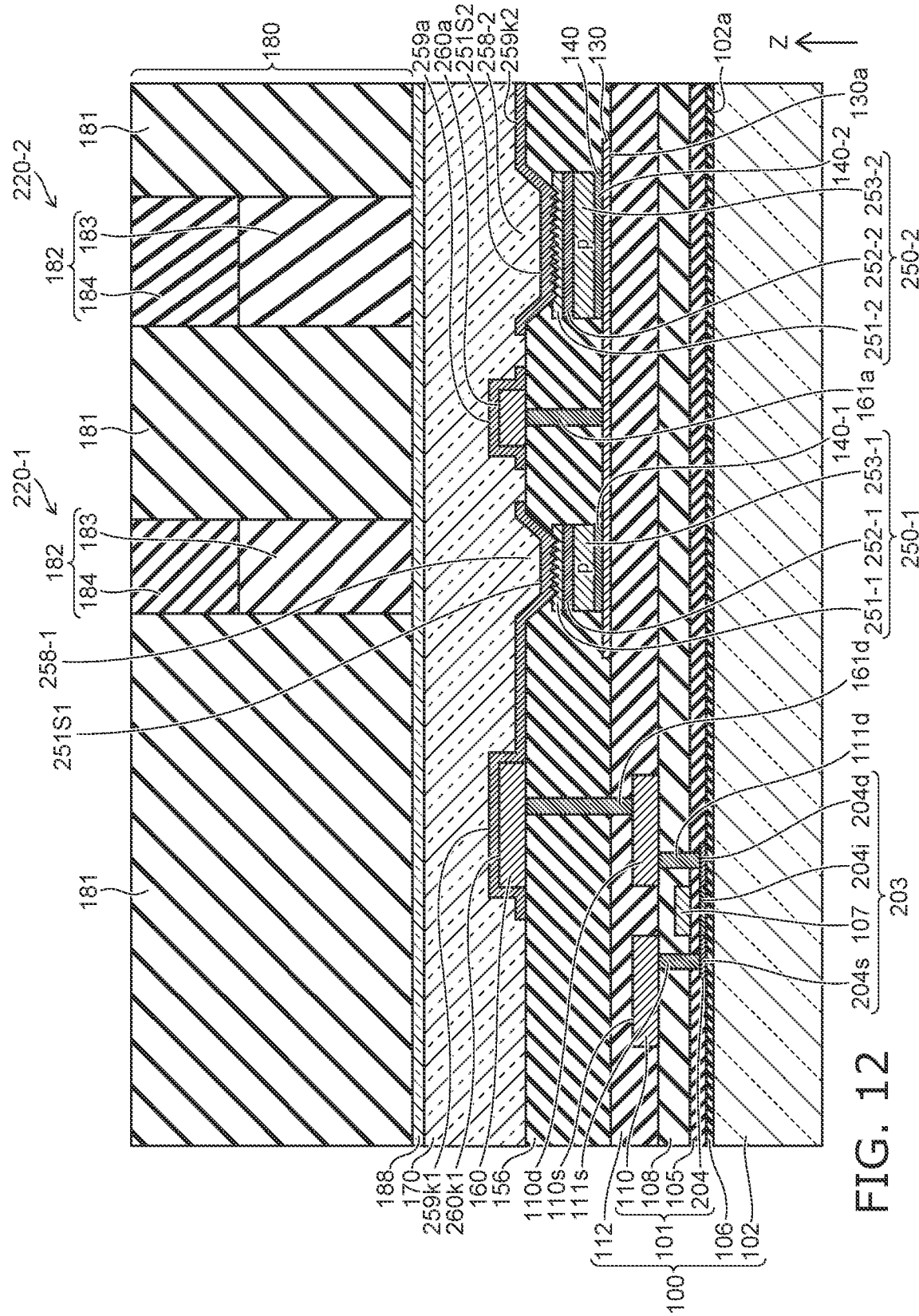
FIG. 12 is a schematic cross-sectional view illustrating a portion of an image display device according to a second embodiment.

FIG. 12 is a schematic cross-sectional view illustrating a portion of an image display device according to the present embodiment.

FIG. 12 illustrates an aligned cross section at positions corresponding to the lines AA' in FIG. 4.

The present embodiment differs from the other embodiments in that sub-pixels 220-1, 220-2 include a graphene layer 140, and the graphene layer 140 includes graphene sheets 140-1, 140-2. Further, in the present embodiment, the configuration of light-emitting elements 250-1, 250-2 and the configuration of a transistor 203 that drives the light-emitting elements differ from those of the other embodiment described above. Components that are the same as those of the other embodiment described above are denoted by the same reference characters, and detailed descriptions thereof will be omitted as appropriate.

As illustrated in FIG. 12, the sub-pixels 220-1, 220-2 of the image display device of the present embodiment include the graphene layer 140. The graphene layer 140 includes the graphene sheets 140-1, 140-2, and the graphene sheets 140-1, 140-2 are provided on the light-reflecting plate 130*a*. The light-emitting element 250-1 is provided on the graphene sheet 140-1. The light-emitting element 250-2 is provided on the graphene sheet 140-2. In this example, the graphene sheets 140-1, 140-2 are provided separately for each light-emitting element 250-1, 250-2, but the graphene sheet has conductivity and thus a plurality of the light-emitting elements may be provided on one graphene sheet.

The two light-emitting elements 250-1, 250-2 are electrically connected via the graphene sheets 140-1, 140-2 and the light-reflecting plate 130*a*.

In the present embodiment, the light-emitting element 250-1 is layered in the order of a p-type semiconductor layer 253-1, a light-emitting layer 252-1, and an n-type semiconductor layer 251-1, from the side of the first interlayer insulating film 112 toward the side of a light-emitting surface 251S1. The light-emitting element 250-2 is layered in the order of a p-type semiconductor layer 253-2, a light-emitting layer 252-2, and a n-type semiconductor layer 251-2, from the side of the first interlayer insulating film 112 toward the side of a light-emitting surface 251S2. In the present embodiment, the n-type semiconductor layers 251-1, 251-2 are the light-emitting surfaces 251S1, 251S2.

The light-emitting surfaces 251S1, 251S2 are surfaces facing the surface of the n-type semiconductor layers 251-1, 251-2 that are in contact with the light-emitting layers 252-1, 252-2. The light-emitting surfaces 251S1, 251S2 are both roughened.

The light-emitting elements 250-1, 250-2 may be the same material as in the other embodiment described above. A light-emitting element 350 emits blue light having a wavelength of, for example, about 467 nm±20 nm or blue violet light having a wavelength of 410 nm±20 nm.

The second interlayer insulating film (second insulating film) 156 covers the first interlayer insulating film 112, the conductive layer 130, the graphene sheets 140-1, 140-2, and the light-emitting elements 250-1, 250-2. The second interlayer insulating film 156 includes openings 258-1, 258-2. The openings 258-1, 258-2 are formed in the light-emitting elements 250-1, 250-2, respectively, and the interlayer insulating film 156 is not provided on the light-emitting surfaces 251S1, 251S2.

The transistor 203 is an n-channel TFT in this example. The transistor 203 includes a TFT channel 204 and the gate 107. The TFT channel 204 is a region of polycrystalline Si formed on the first surface 102*a* of the substrate 102, and is polycrystallized and activated by annealing a region formed as amorphous Si by laser irradiation. The TFT channel 204 includes regions 204*s*, 204*i*, 204*d*. The regions 204*s*, 204*i*, 204*d* are all provided on the TFT lower layer film 106. The region 204*i* is provided between the regions 204*s*, 204*d*. The regions 204*s*, 204*d* are doped with an n-type impurity such as P and are in ohmic connection with the vias 111*s*, 111*d*.

The gate 107 is provided on the TFT channel 204 with the insulating layer 105 interposed therebetween. When a potential higher than that of the region 204*s* is applied to the gate 107, a channel is formed in the region 204*i*, thereby controlling the current flowing between the regions 204*s*, 204*d*.

The structure of an upper portion of the transistor 203 and the structure of the wiring layer 110 are the same as those in the other embodiment described above.

A via 161*a* is provided through the interlayer insulating film 156. One end of the via 161*a* is connected to the light-reflecting plate 130*a*. The other end of the via 161*a* is connected to a wiring line 260*a*. A light-transmitting electrode 259*a* is provided over the wiring line 260*a*. The wiring line 260*a* and the light-transmitting electrode 259*a* are connected to the power source line 3 in FIG. 13 described below, for example. Accordingly, the p-type semiconductor layers 253-1, 253-2 of the light-emitting elements 250-1, 250-2 are electrically connected to the power source line 3 via the graphene sheets 140-1, 140-2, the light-reflecting plate 130*a*, the via 161*a*, the wiring line 260*a*, and the light-transmitting electrode 259*a*.

The via 161*d* is provided through the interlayer insulating films 112, 156. One end of the via 161*d* is connected to the wiring line 110*d*. The wiring line 110*d* is connected, by the via 111*d*, to the region 204*d* that is a drain electrode of the transistor 203. The other end of the via 161d is connected to a wiring line 260k1. A light-transmitting electrode 259k1 is provided over the wiring line 260k1. The light-transmitting electrode 259k1 is provided over the light-emitting surface 251S1. The light-transmitting electrode 259k1 is provided between the wiring line 260k1 and the light-emitting surface 251S1, and electrically connects the wiring line 260k1 and the light-emitting surface 251S1.

Accordingly, the n-type semiconductor layer 251-1 of the light-emitting element 250-1 is electrically connected to the transistor 203 via the light-transmitting electrode 259k1, the wiring 260k1, the via 161d, and the wiring line 110d.

The region 204s that is a source electrode of the transistor 203 is connected to the wiring line 110s by the via 111s. The wiring line 110s is connected to the ground line 4 in FIG. 13 described below, for example.

The n-type semiconductor layer 251-2 of the light-emitting element 250-2 is also electrically connected, via a light-transmitting electrode 259k2, to a transistor for driving the light-emitting element 250-2, similar to the case of the light-emitting element 250-1.

Figure 13:
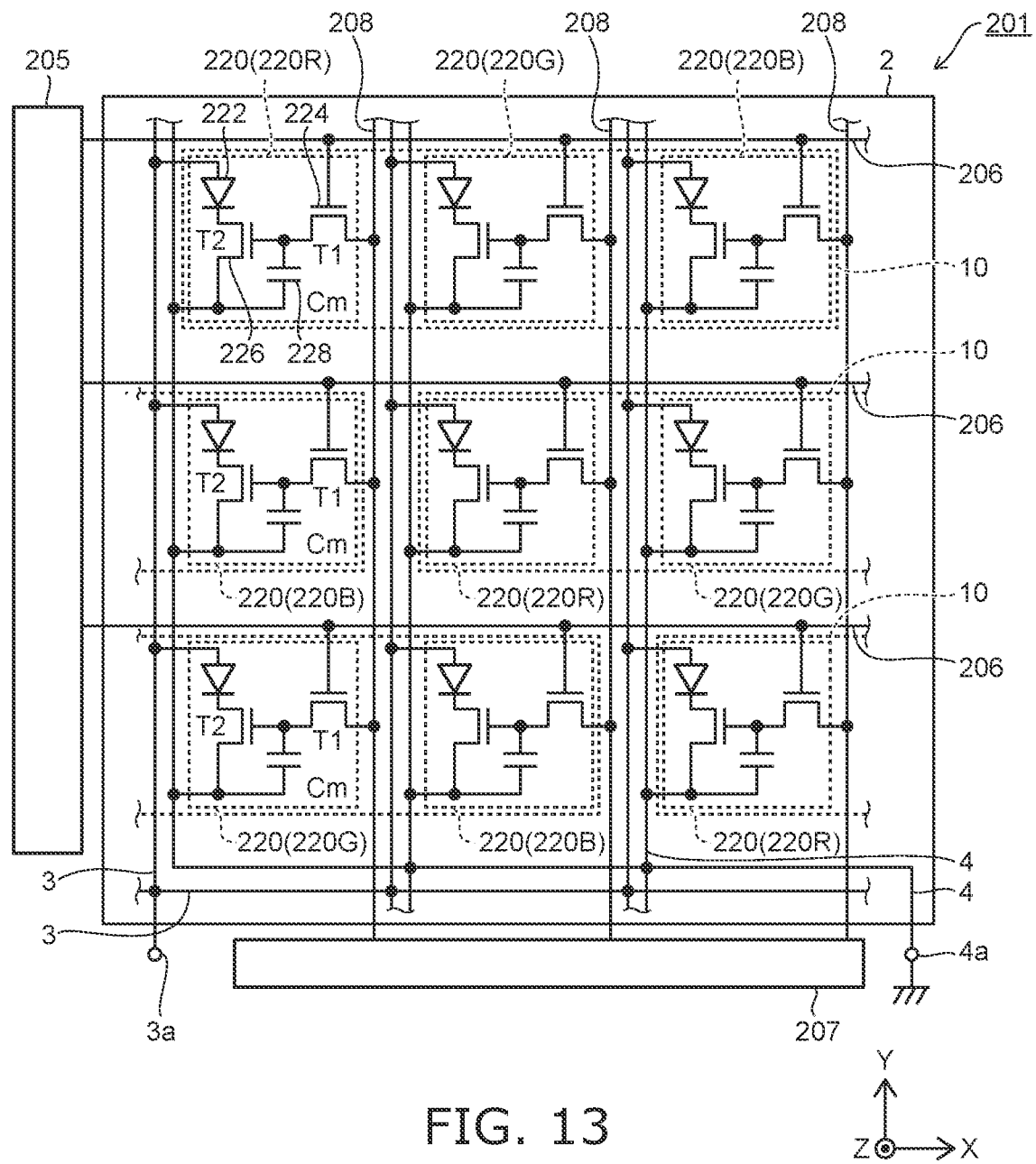
FIG. 13 is a schematic block diagram illustrating the image display device according to the second embodiment.

FIG. 13 is a schematic block diagram illustrating the image display device according to the present embodiment.

As illustrated in FIG. 13, an image display device 201 of the present embodiment includes the display region 2, a row selection circuit 205, and a signal voltage output circuit 207. In the display region 2, a sub-pixel 220 is arrayed in a lattice pattern on the XY plane, for example, as in the other embodiment described above.

The pixel 10, as in the other embodiment described above, includes a plurality of the sub-pixels 220 that emit light of different colors. A sub-pixel 220R emits red light. A sub-pixel 220G emits green light. A sub-pixel 220B emits blue light. The three types of sub-pixels 220R, 220G, 220B emit light at a desired brightness, thereby determining the light emission color and brightness of one pixel 10.

One pixel 10 is formed of the three sub-pixels 220R, 220G, 220B, and the sub-pixels 220R, 220G, 220B are arrayed in a linear shape on the X axis, for example, as in this example. In each pixel 10, sub-pixels of the same color may be arrayed in the same column or, as in this example, sub-pixels of different colors may be arrayed on a per column basis.

The sub-pixel 220 includes a light-emitting element 222, a selection transistor 224, a drive transistor 226, and a capacitor 228. In FIG. 13, the selection transistor 224 may be denoted as T1, the drive transistor 226 may be denoted T2, and the capacitor 228 may be denoted as Cm.

In the present embodiment, the light-emitting element 222 is provided on the power source line 3 side, and the drive transistor 226 connected in series with the light-emitting element 222 is provided on the ground line 4 side. That is, the drive transistor 226 is connected to a potential side lower than that of the light-emitting element 222. The drive transistor 226 is an n-channel transistor.

The selection transistor 224 is connected between a gate electrode of the drive transistor 226 and a signal line 208. The capacitor 228 is connected between the gate electrode of the drive transistor 226 and the ground line 4.

The row selection circuit 205 and the signal voltage output circuit 207 supply a signal voltage of a polarity different from that of the other embodiment described above to the signal line 208 in order to drive the drive transistor 226 that is an n-channel transistor.

In the present embodiment, the polarity of the drive transistor 226 is the n-channel, and thus the polarity of the signal voltage and the like differ from those of the other embodiment described above. That is, the row selection circuit 205 supplies a selection signal to a scanning line 206, sequentially selecting one row from the array of m rows of the sub-pixels 220. The signal voltage output circuit 207 supplies a signal voltage having the required analog voltage value for each sub-pixel 220 in the selected row. The drive transistor 226 of the sub-pixels 220 of the selected row introduces a current corresponding to the signal voltage to the light-emitting element 222. The light-emitting element 222 emits light at a brightness in accordance with the flowing current.

A manufacturing method of the image display device according to the present embodiment will now be described.

FIG. 14A to FIG. 15B are schematic cross-sectional views illustrating the manufacturing method of the image display device according to the present embodiment.

In the present embodiment, until the formation and the annealing of the conductive layer 1130 on the circuit substrate 1100, the processes are the same as those of the other embodiment described above. Hereinafter, the processes following the process illustrated in FIG. 5B will be described.

Figure 14A:
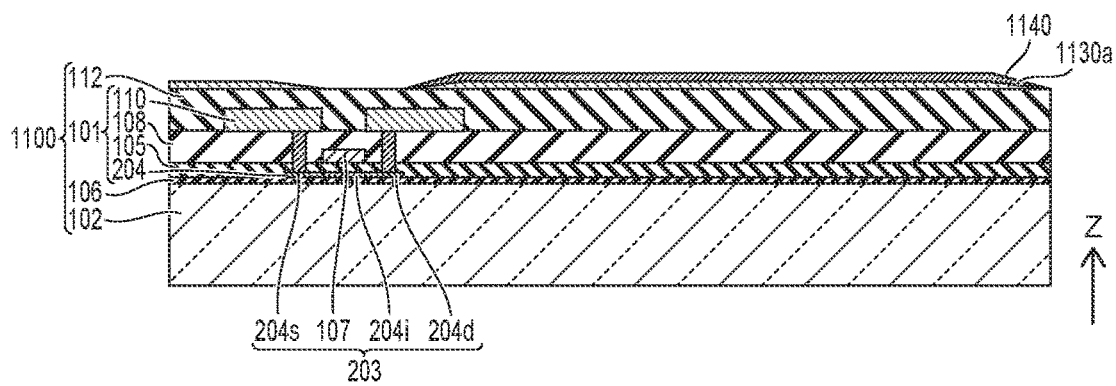
FIG. 14A is a schematic cross-sectional view illustrating a manufacturing method of the image display device according to the second embodiment.

As illustrated in FIG. 14A, a graphene layer 1140 is formed over the conductive layer 1130a patterned and monocrystallized by an annealing process. The graphene layer 1140 is formed by a low temperature process means such as, for example, pulse sputtering.

Figure 14B:
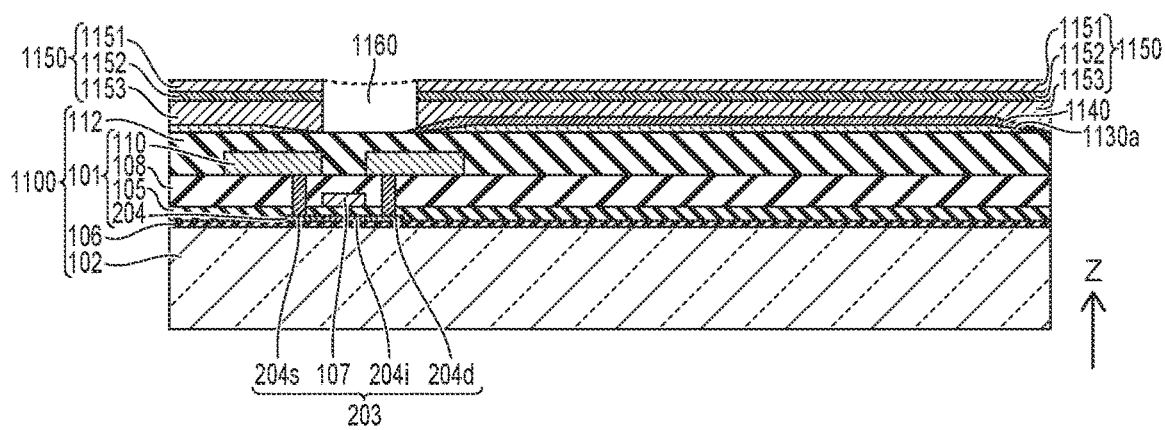
FIG. 14B is a schematic cross-sectional view illustrating the manufacturing method of the image display device according to the second embodiment.

As illustrated in FIG. 14B, the semiconductor layer 1150 is formed over the graphene layer 1140. In the present embodiment, the semiconductor layer 1150 is formed in the order of the p-type semiconductor layer 1153, the light-emitting layer 1152, and the n-type semiconductor layer 1151, in the positive direction of the Z axis from the side of the conductive layer 1130a.

Similar to the other embodiments, a physical vapor deposition method such as vapor deposition, ion beam deposition, MBE, or sputtering is used for the formation of the semiconductor layer 1150, and a low-temperature sputtering method is preferably used. The semiconductor layer 1150 of GaN is grown on the graphene layer 1140, thereby forming the monocrystallized semiconductor layer 1150 including the light-emitting layer 1152 over the graphene layer 1140 (refer to Non Patent Documents 1 and 2 and the like).

Use of pulse sputtering is known to promote crystal growth of GaN on layers of graphene. In the present embodiment, the semiconductor layer 1150 is formed via the graphene layer 1140 grown over the conductive layer 1130a formed of a single crystal metal layer, making it possible to form the semiconductor layer 1150 containing GaN crystal of a more stable high quality.

Further, in the present embodiment, the conductive layer 130 and the light-reflecting plate 130a are formed of a single crystal metal layer, making electrical connection with the semiconductor layer 1150 with low resistance possible.

Figure 14C:
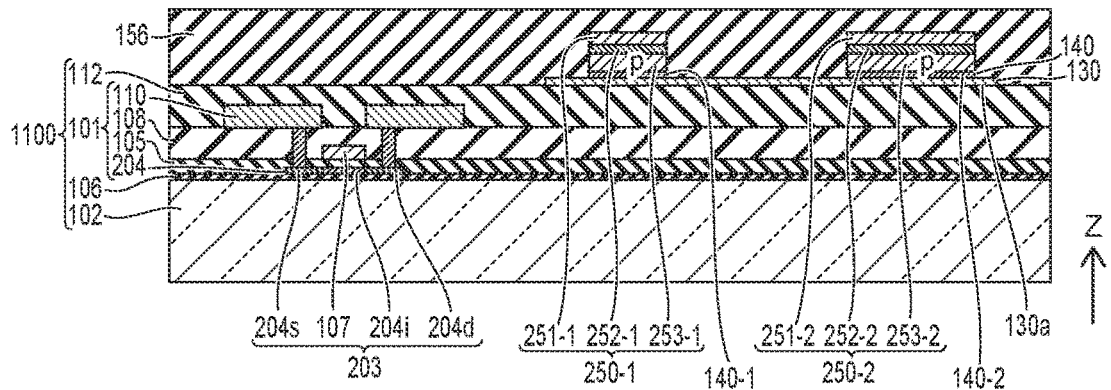
FIG. 14C is a schematic cross-sectional view illustrating the manufacturing method of the image display device according to the second embodiment.

As illustrated in FIG. 14C, the semiconductor layer 1150 is molded into a required shape by RIE or the like, forming the light-emitting elements 250-1, 250-2. At this time, the graphene layer 1140 illustrated in FIG. 14B is over-etched and molded into the graphene sheets 140-1, 140-2 having outer peripheral shapes in accordance with the outer peripheral shapes of the light-emitting elements 250-1, 250-2. The conductive layer 130 is also molded, forming the desired light-reflecting plate 130a. Subsequently, the second interlayer insulating film 156 is formed covering the first interlayer insulating film 112, the conductive layer 130, and the light-emitting elements 250-1, 250-2.

Figure 15A:
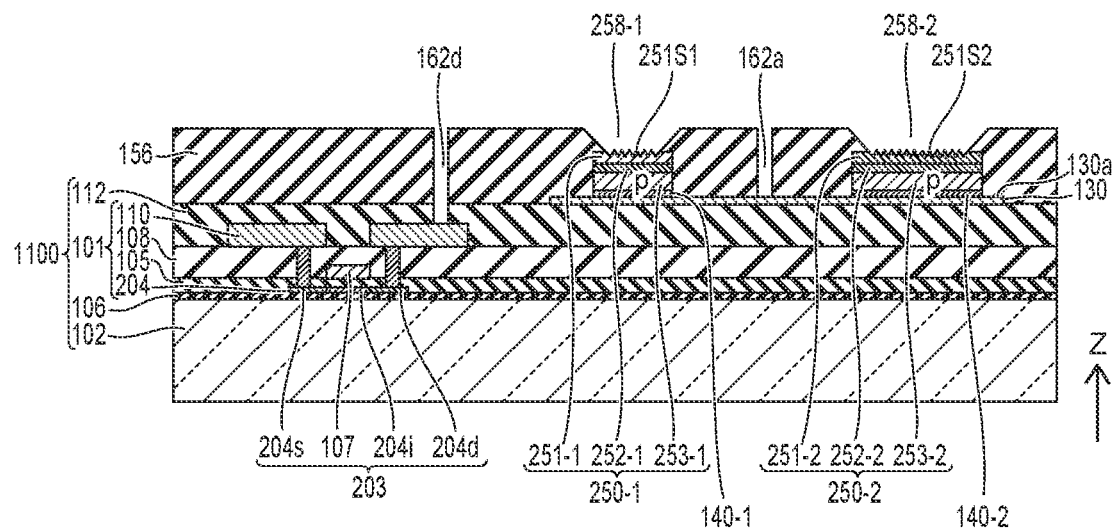
FIG. 15A is a schematic cross-sectional view illustrating the manufacturing method of the image display device according to the second embodiment.

Subsequently, as illustrated in FIG. 15A, a via hole 162*a* is formed through the second interlayer insulating film 156. The via hole 162*d* is formed through the interlayer insulating films 112, 256. Simultaneously with forming the via hole 162*a* and the via hole 162*d*, the openings 258-1, 258-2 are formed in the interlayer insulating film 156, exposing the light-emitting surfaces 251S1, 251S2. The exposed light-emitting surfaces 251S1, 251S2 are roughened. The openings 258-1, 258-2 may be formed before formation of the via hole 162*a* and the via hole 162*d*, or after formation of the via hole 162*a* and the via hole 162*d*.

Figure 15B:
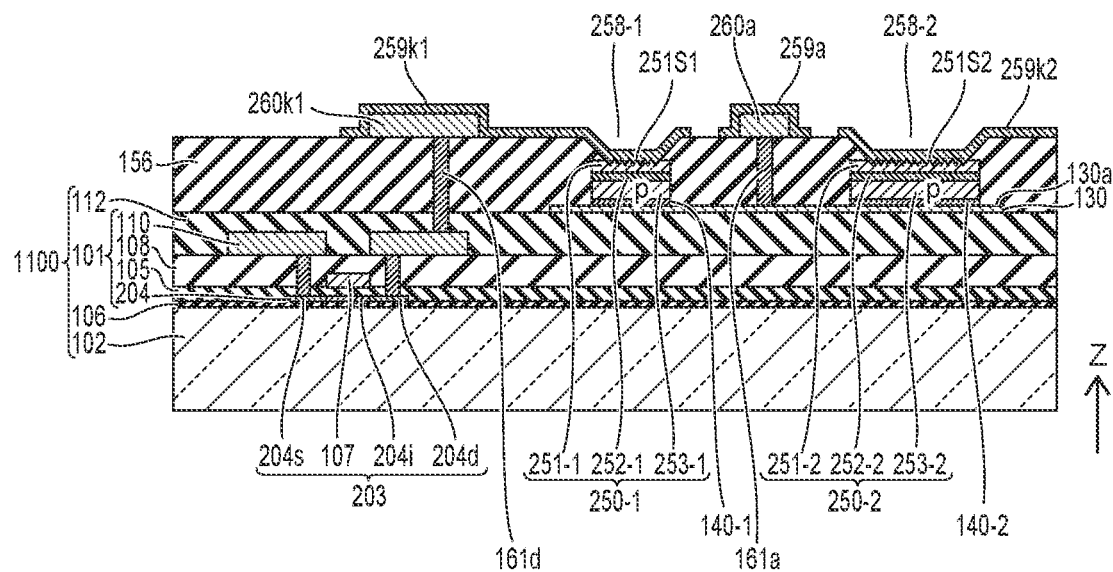
FIG. 15B is a schematic cross-sectional view illustrating the manufacturing method of the image display device according to the second embodiment.

As illustrated in FIG. 15B, the via holes 162*a*, 162*d* illustrated in FIG. 15A are filled with a conductive material, forming the vias 161*a*, 161*d*. Subsequently, simultaneously with filling the via holes or the like, the second wiring layer 160 is formed. Alternatively, the second wiring layer 160 is formed simultaneously with forming the vias 161*a*, 161*d*. The light-transmitting electrode 259*k*1 is formed over the light-emitting surface 251S1 and over the wiring line 260*k*1, electrically connecting the n-type semiconductor layer 251-1 and the wiring line 260*k*1. At the same time, the light-transmitting electrode 259*k*2 is formed over the light-emitting surface 251S2, and the light-transmitting electrode 259*k*2 is electrically connected to an electrode for another drive transistor different from the transistor 203. Note that the light-transmitting electrode 259*a* is formed simultaneously on the wiring line 260*a* as well.

Thereafter, the color filter is formed as in the other embodiments.

In this way, the image display device of the present embodiment can be manufactured.

Effects of the image display device of the present embodiment will now be described.

In addition to the effects of other embodiment described above, the present embodiment further has the following effects. That is, in the present embodiment, the light-emitting elements 250-1, 250-2 are formed on the conductive layer 130 of a single crystal metal via the graphene sheets 140-1, 140-2, making it possible to acquire the light-emitting elements 250-1, 250-2 having a higher quality crystal structure. Accordingly, the yield of the image display device can be improved.

Third Embodiment

In an image display device of the present embodiment, circuit elements such as a transistor is formed on a flexible substrate instead of a glass substrate. In other respects, components that are the same as those of the other embodiments described above are denoted by the same reference characters, and detailed descriptions thereof will be omitted as appropriate.

Figure 16:
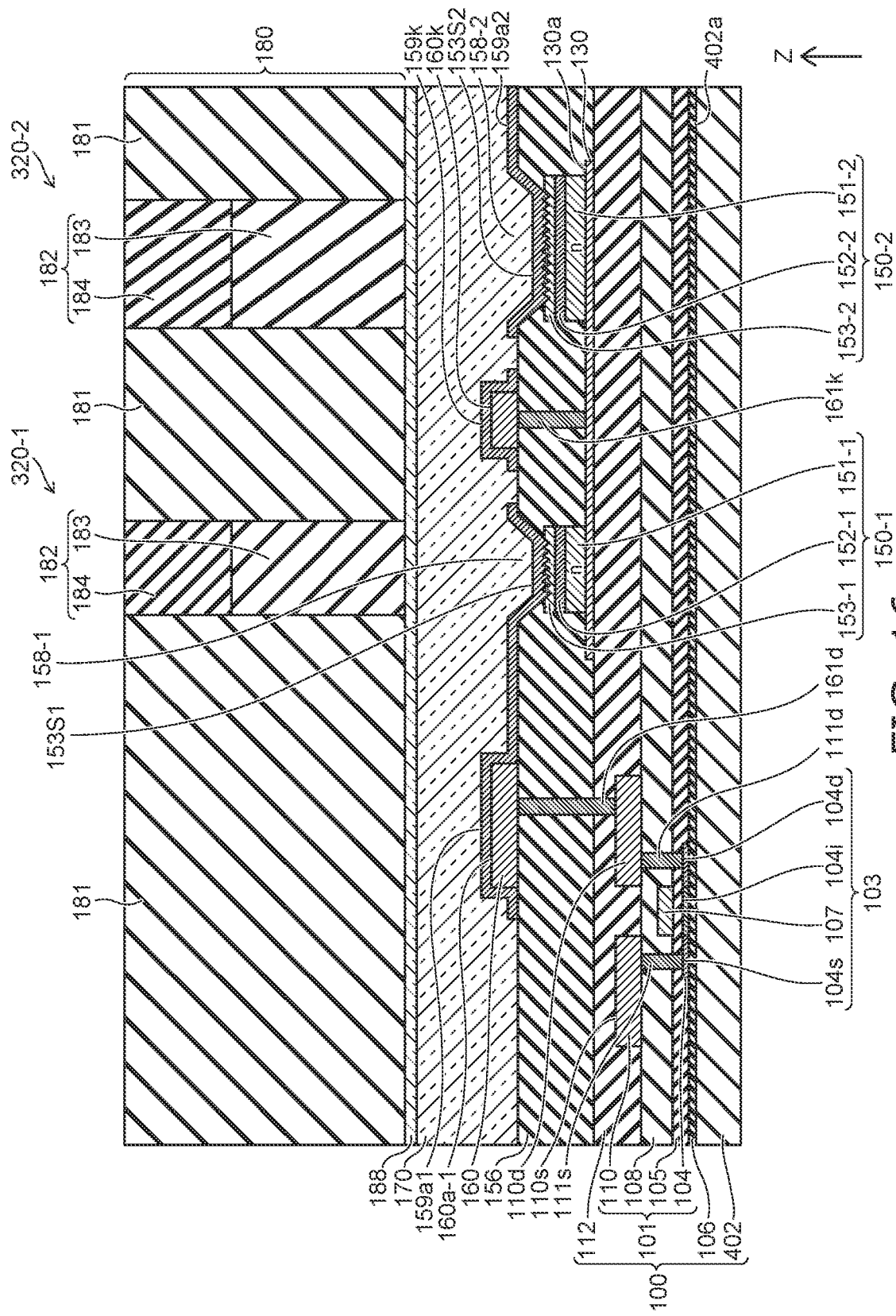
FIG. 16 is a schematic cross-sectional view illustrating a portion of an image display device according to a third embodiment.

FIG. 16 is a schematic cross-sectional view illustrating a portion of the image display device according to the present embodiment.

FIG. 16 illustrates an aligned cross section at positions corresponding to the lines AA' illustrated in FIG. 4.

As illustrated in FIG. 16, the image display device of the present embodiment includes sub-pixels 320-1. 320-2. The sub-pixels 320-1, 320-2 include a substrate 402 that is common to both. The substrate 402 includes a first surface 402*a*. Circuit elements such as the transistor 103 are provided on the first surface 402*a*. In the sub-pixels 320-1, 320-2, an upper structure including the circuit elements is formed on the first surface 402*a*.

The substrate 402 is flexible. The substrate 402 is, for example, a polyimide resin. The interlayer insulating films 112, 156, the wiring layers 110, 160, and the like are preferably formed of a material having a certain degree of flexibility in accordance with the flexibility of the substrate 402. Note that the element having the highest risk of being destroyed during bending is the wiring layer 110 having the longest wiring length. Therefore, it is desirable to adjust various film thicknesses, materials, and films so that a neutral surface including a plurality of protective films and the like added to the front surface and the back surface as needed is positioned on the wiring layer 110.

In this example, the transistor 103 and the light-emitting elements 150-1, 150-2 formed on the substrate 402 are the same as those in the first embodiment, that is, for example, the circuit configuration illustrated in FIG. 3 is applied. Configurations including the circuit configurations of the other embodiments can also be readily applied.

A manufacturing method of the image display device according to the present embodiment will now be described.

Figure 17A:
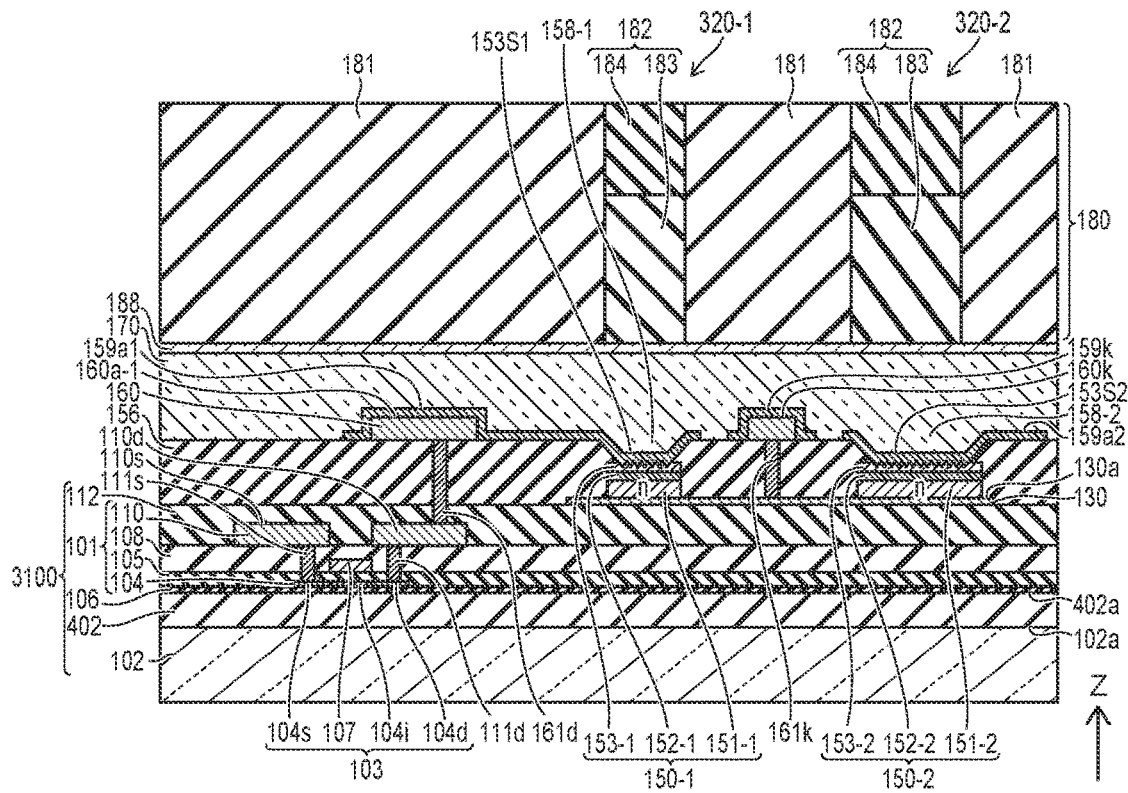
FIG. 17A is a schematic cross-sectional view illustrating a manufacturing method of the image display device according to the third embodiment.
Figure 17B:
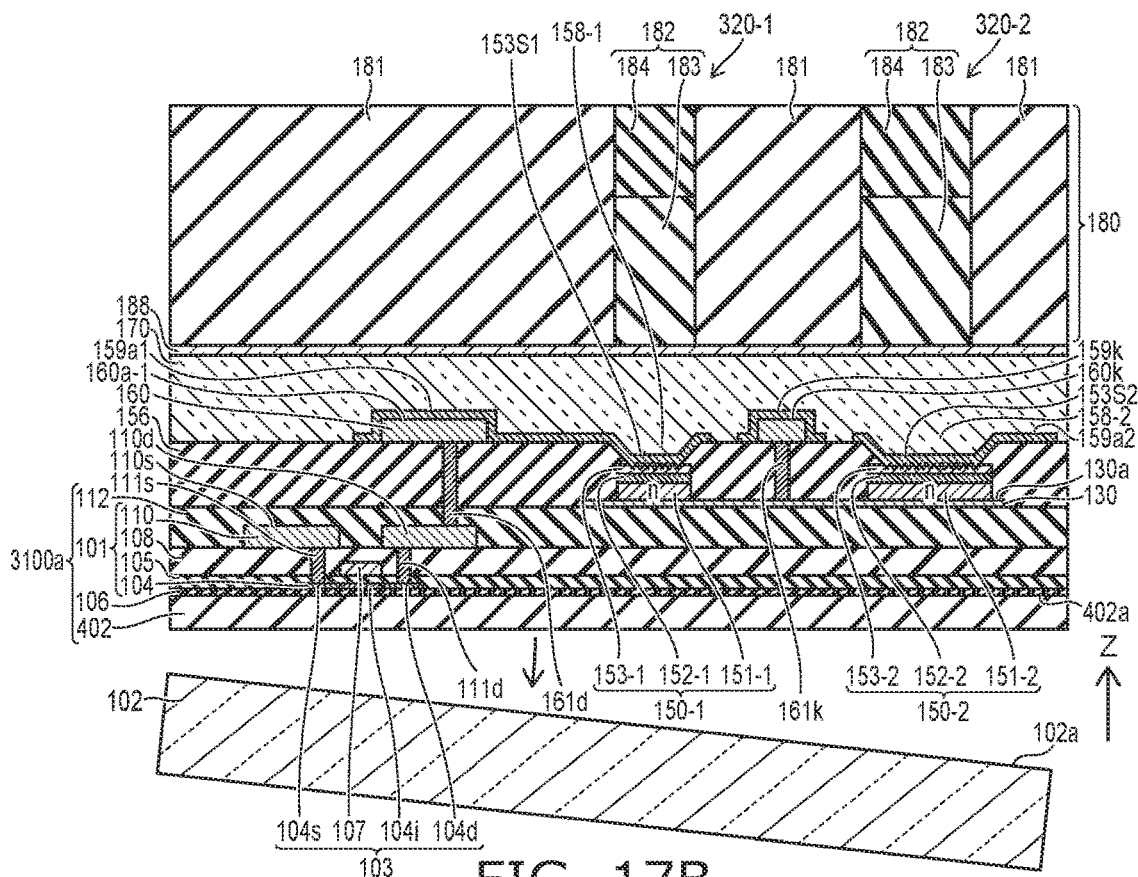
FIG. 17B is a schematic cross-sectional view illustrating the manufacturing method of the image display device according to the third embodiment.

FIG. 17A to FIG. 17B are schematic cross-sectional views illustrating the manufacturing method of the image display device according to the present embodiment.

As illustrated in FIG. 17A, in the present embodiment, a circuit substrate 3100 different from that of the other embodiments described above is prepared. The circuit substrate 3100 includes the two layers of the substrates 102, 402. The substrate 402 is provided on the first surface 102*a* of the substrate 102, and is formed by, for example, applying a polyimide material and baking. An inorganic film such as SiNx may be further interposed between the two layers of the substrates 102, 402. The TFT lower layer film 106, the circuit 101, and the interlayer insulating film 112 are provided on the first surface 402*a* of the substrate 402. The first surface 402*a* of the substrate 402 is the surface facing the surface on which the substrate 102 is provided.

In such a circuit substrate 3100, an upper structure of the sub-pixels 320-1, 320-2 is formed by applying the processes described in FIG. 5A to FIG. 11D, for example.

As illustrated in FIG. 17B, the substrate 102 is removed from the structure in which an upper structure including the color filter and the like is formed, forming a new circuit substrate 3100*a*. To remove the substrate 102, laser lift-off is used, for example. Removal of the substrate 102 is not limited to the point in time described above, and can be performed at another appropriate point in time. For example, the substrate 102 may be removed after wafer bonding or before formation of the color filter. By removing the substrate 102 at an earlier point in time, defects such as cracking and chipping during the manufacturing process can be reduced.

Effects of the image display device of the present embodiment will now be described.

The substrate 402 is flexible and thus can be bent as an image display device and can be adhered to a curved surface or utilized with a wearable terminal or the like without any discomfort.

Fourth Embodiment

In the present embodiment, a plurality of light-emitting surfaces corresponding to a plurality of light-emitting elements are formed in a single semiconductor layer including a light-emitting layer, thereby realizing an image display device having a higher light emission efficiency. In the description below, components that are the same as those of the other embodiments described above are denoted by the same reference characters, and detailed descriptions thereof will be omitted as appropriate.

Figure 18:
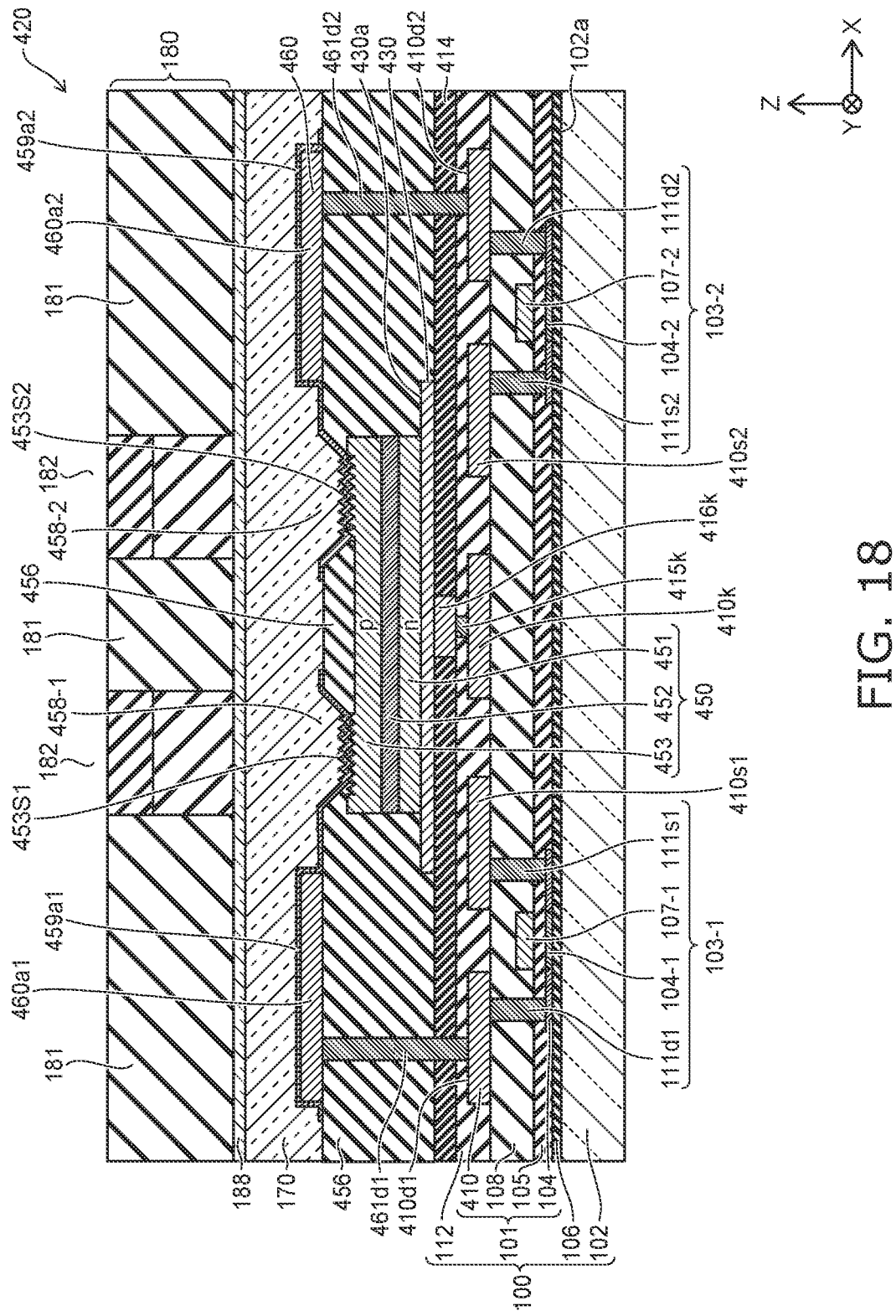
FIG. 18 is a schematic cross-sectional view illustrating a portion of an image display device according to a fourth embodiment.

FIG. 18 is a schematic cross-sectional view illustrating a portion of the image display device according to the present embodiment.

As illustrated in FIG. 18, the image display device includes a sub-pixel group 420. The sub-pixel group 420 includes transistors (plurality of transistors) 103-1, 103-2, a first wiring layer (first wiring layer) 410, the interlayer insulating film (first insulating film) 112, a plug 416k, a conductive layer 430, a semiconductor layer 450, an interlayer insulating film (second insulating film) 456, and vias (plurality of vias) 461d1, 461d2.

In the present embodiment, the p-channel transistors 103-1, 103-2 are turned on, thereby injecting holes into the semiconductor layer 450 via a wiring layer 460 and injecting electrons into the semiconductor layer 450 via the plug 416k, causing the light-emitting layer 452 to emit light. The circuit configuration illustrated in FIG. 3, for example, is applied to the drive circuit. The n-type semiconductor layer and the p-type semiconductor layer of the semiconductor layers can be vertically interchanged by using the other embodiment described above to make a configuration in which the semiconductor layer is driven by an n-channel transistor. In such a case, the circuit configuration of FIG. 13, for example, is applied to the drive circuit.

The semiconductor layer 450 includes two light-emitting surfaces 453S1, 453S2, and the sub-pixel group 420 substantially includes two sub-pixels. In the present embodiment, the display region is formed by arraying the sub-pixel group 420 substantially including two sub-pixels in a lattice pattern, as in the other embodiments described above.

The transistors 103-1, 103-2 are respectively formed in TFT channels 104-1, 104-2. In this example, the TFT channels 104-1, 104-2 each include a p-doped region, and a channel region is interposed between these regions.

On the TFT channel 104-1, 104-2, the insulating layer 105 is formed and gates 107-1, 107-2 are formed with the insulating layer 105 interposed therebetween. The gates 107-1, 107-2 are gates of the transistors 103-1, 103-2. In this example, the transistors 103-1, 103-2 are p-channel TFTs.

The insulating film 108 covers the two transistors 103-1, 103-2. The wiring layer 410 is formed on the insulating film 108.

Vias 111s1, 111d1 are provided between the p-type doped region of the transistor 103-1 and the wiring layer 410. Vias 111s2, 111d2 are provided between the p-type doped region of the transistor 103-2 and the wiring layer 410.

The wiring layer 410 includes wiring lines 410k, 410s1, 410s2, 410d1, 410d2. The wiring line 410k is connected to the plug 416k via a connecting portion 415k. The wiring line 410k is connected to the ground line 4 illustrated in FIG. 3, for example.

The wiring line 410s1 is electrically connected to a region corresponding to a source electrode of the transistor 103-1 by the via 111s1. The wiring line 410s2 is electrically connected to a region corresponding to a source electrode of the transistor 103-2 by the via 111s2. The wiring lines 410s1, 410s2 are connected to the power source line 3 illustrated in FIG. 3, for example.

The wiring line 410d1 is connected to a region corresponding to a drain electrode of the transistor 103-1 by the via 111d1. The wiring line 410d2 is connected to a region corresponding to a drain electrode of the transistor 103-2 by the via 111d2.

The interlayer insulating film 112 covers the transistors 103-1, 103-2 and the wiring layer 410. The plug 416k is formed on the interlayer insulating film 112.

A flattening film 414 is formed on the interlayer insulating film 112. The flattening film 414 is also provided on a lateral surface of the plug 416k. The plug 416k is embedded in the flattening film 414, and the flattening film 414 and the plug 416k include surfaces in the same plane in an XY plane view. These surfaces are surfaces on sides facing the surface of the interlayer insulating film 112 side.

The conductive layer 430 is provided on the flattening film 414 and the plug 416k. The conductive layer 430 includes a light-reflecting plate 430a. The conductive layer 430 and the light-reflecting plate 430a are configured in the same manner as in the other embodiments described above. That is, at least a portion of the conductive layer 430 is formed of a single crystal metal. Preferably, the entire conductive layer 430 is a single crystal metal layer. At least a portion of the light-reflecting plate 430a is formed of a single crystal metal. At least the location where the semiconductor layer 450 of the light-reflecting plate 430a is provided is formed of a single crystal metal, forming a single crystal metal layer, for example. The conductive layer 430 and the light-reflecting plate (portion) 430a are formed of a single crystal metal layer as a whole.

The semiconductor layer 450 is provided on the light-reflecting plate 430a. The single crystal metal is Cu or Hf, for example.

The semiconductor layer 450 includes an n-type semiconductor layer (first semiconductor layer) 451, a light-emitting layer 452, and a p-type semiconductor layer (second semiconductor layer) 453. The semiconductor layer 450 is layered in the order of the n-type semiconductor layer 451, the light-emitting layer 452, and the p-type semiconductor layer 453, from the side of the interlayer insulating film 112 toward the side of the light-emitting surfaces 453S1, 453S2. The n-type semiconductor layer 451 is provided on the light-reflecting plate 430a and is electrically connected to the light-reflecting plate 430a.

The interlayer insulating film 456 covers the flattening film 414 and the conductive layer 430. The interlayer insulating film 456 covers a portion of the semiconductor layer 450. Preferably, the interlayer insulating film 456 covers a surface of the p-type semiconductor layer 453, excluding the light-emitting surfaces (exposed surfaces) 453S1, 453S2 of the semiconductor layer 450. The interlayer insulating film 456 covers a lateral surface of the semiconductor layer 450. The interlayer insulating film 456 is, for example, a white resin, and may be a black resin.

Openings 458-1, 458-2 are formed in a portion of the semiconductor layer 450 not covered by the interlayer insulating film 456.

The openings 458-1, 458-2 are formed at positions corresponding to the light-emitting surfaces 453S1, 453S2. The light-emitting surfaces 453S1, 453S2 are formed in separated positions on the p-type semiconductor layer 453. The light-emitting surface 453S1 is provided on the p-type semiconductor layer 453 at a position closer to the transistor 103-1. The light-emitting surface 453S2 is provided on the p-type semiconductor layer 453 at a position closer to the transistor 103-2.

The openings 458-1, 458-2 have, for example, square or rectangular shapes in an XY plane view. The shape is not limited to rectangular, and may be circular, elliptical, or polygonal such as hexagon. The light-emitting surfaces 453S1, 453S2 also have square, rectangular, other polygonal, or circular shapes or the like in an XY plane view. The shapes of the light-emitting surfaces 453S1, 453S2 may be similar to or different from the shapes of the openings 458-1, 458-2.

The wiring layer 460 is provided on the interlayer insulating film 456. The wiring layer 460 includes wiring lines 460a1, 460a2.

The vias 461d1, 461d2 are provided through the interlayer insulating films 112, 456. The via 461d1 is provided between the wiring line 410d1 and the wiring line 460a1. One end of the via 461d1 is connected to the wiring line 410d1 and the other end of the via 461d1 is connected to the wiring line 460a1. The via 461d2 is provided between the wiring line 410d2 and the wiring line 460a2. One end of the via 461d2 is connected to the wiring line 410d2 and the other end of the via 461d2 is connected to the wiring line 460a2.

A light-transmitting electrode 459a1 is provided on the wiring line 460a1, and the wiring line 460a1 and the light-transmitting electrode 459a1 are electrically connected. The light-transmitting electrode 459a1 is extended to the opening 458-1. The light-transmitting electrode 459a1 is provided across the entire light-emitting surface 453S1 exposed from the opening 458-1, and is electrically connected to the p-type semiconductor layer 453 via the light-emitting surface 453S1.

A light-transmitting electrode 459a2 is provided on the wiring line 460a2, and the wiring line 460a2 and the light-transmitting electrode 459a2 are electrically connected. The light-transmitting electrode 459a2 is extended to the opening 458-2. The light-transmitting electrode 459a2 is provided across the entire light-emitting surface 453S2 exposed from the opening 458-2, and is electrically connected to the p-type semiconductor layer 453 via the light-emitting surface 453S2.

As described above, the light-transmitting electrodes 459a1, 459a2 are connected to the light-emitting surfaces 453S1, 453S2 exposed from the openings 458-1, 458-2. When the transistor 103-1 is turned on, holes are injected into the light-transmitting electrode 459a1 via the wiring line 460a1, the via 461d1, and the wiring line 410d1. When the transistor 103-2 is turned on, holes are injected into the light-transmitting electrode 459a2 via the wiring line 460a2, the via 461d2, and the wiring line 410d2. On the other hand, electrons are injected into the n-type semiconductor layer 451 via the wiring line 410k connected to the ground line 4, the connecting portion 415k, the plug 416k, and the light-reflecting plate 430a.

The transistors 103-1, 103-2 are drive transistors of adjacent sub-pixels and are driven sequentially. Accordingly, holes injected from either one of the two transistors 103-1, 103-2 are injected into the light-emitting layer 452, electrons injected from the light-reflecting plate 430a are injected into the light-emitting layer 452, and the light-emitting layer 452 emits light. When the transistor 103-1 is turned on, the light-emitting surface 453S1 emits light, and when the transistor 103-2 is turned on, the light-emitting surface 453S2 emits light. In this way, the light emission of the light-emitting layer 452 is localized as a result of a drift current flowing in a direction parallel to the XY plane in the semiconductor layer 450 being suppressed by the resistance of the p-type semiconductor layer 453.

A manufacturing method of the image display device according to the present embodiment will now be described.

FIG. 19A to FIG. 22B are schematic cross-sectional views illustrating the manufacturing method of the image display device according to the embodiment.

FIG. 19A to FIG. 20B illustrate a process of forming the plug 416k on a circuit substrate 4100.

FIGS. 21A to 22B illustrate a process of forming the semiconductor layer 450 and the like on the circuit substrate 4100 on which the plug 416k is formed to form the sub-pixel group 420.

Figure 19A:
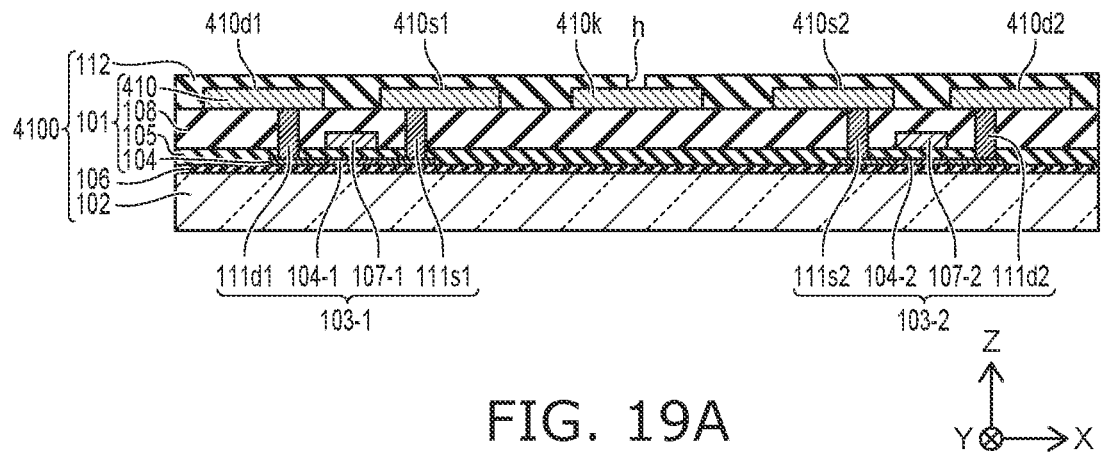
FIG. 19A is a schematic cross-sectional view illustrating a manufacturing method of the image display device according to the fourth embodiment.

As illustrated in FIG. 19A, the circuit substrate 4100 is prepared. The circuit substrate 4100 includes the circuit 101, which is the same as that described in FIG. 1 and the like. This circuit 101 includes the transistors 103-1, 103-2 and the like, and is formed on the TFT lower layer film 106 formed on the substrate 102. The circuit 101 is covered by the first interlayer insulating film 112. A contact hole h is formed in the interlayer insulating film 112. The position at which the contact hole h is formed is a position where the wiring line 410k is provided. The contact hole h is formed to a depth at which a surface of the wiring line 410k is exposed.

Figure 19B:
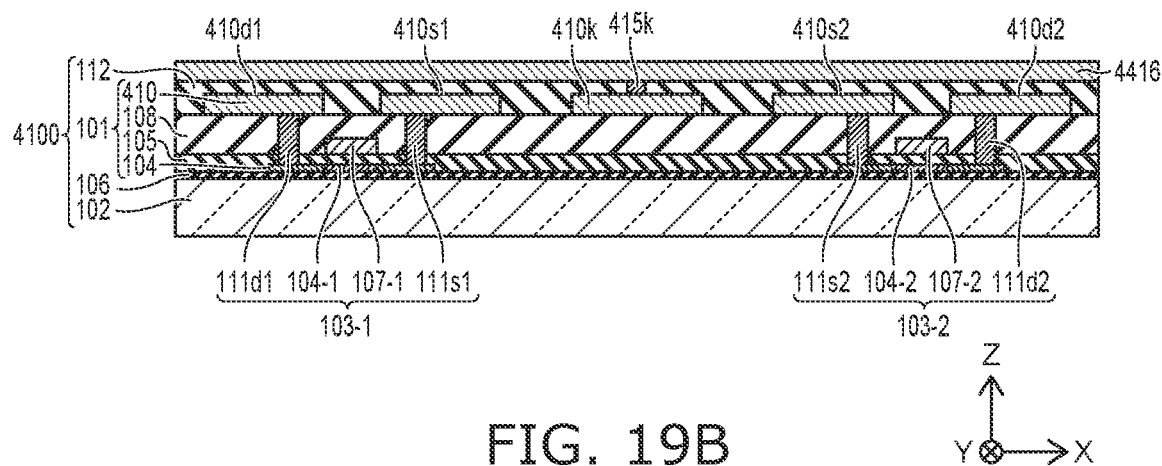
FIG. 19B is a schematic cross-sectional view illustrating the manufacturing method of the image display device according to the fourth embodiment.

As illustrated in FIG. 19B, a metal layer 4416 is formed over the entire surface of the interlayer insulating film 112. The contact hole h is filled with the same conductive material as the metal layer 4416, simultaneously with the formation of the metal layer 4416. The connecting portion 415k is formed in the contact hole h filled with the material of the metal layer 4416. Accordingly, the connecting portion 415k electrically connects the wiring line 410k and the metal layer 4416.

Figure 19C:
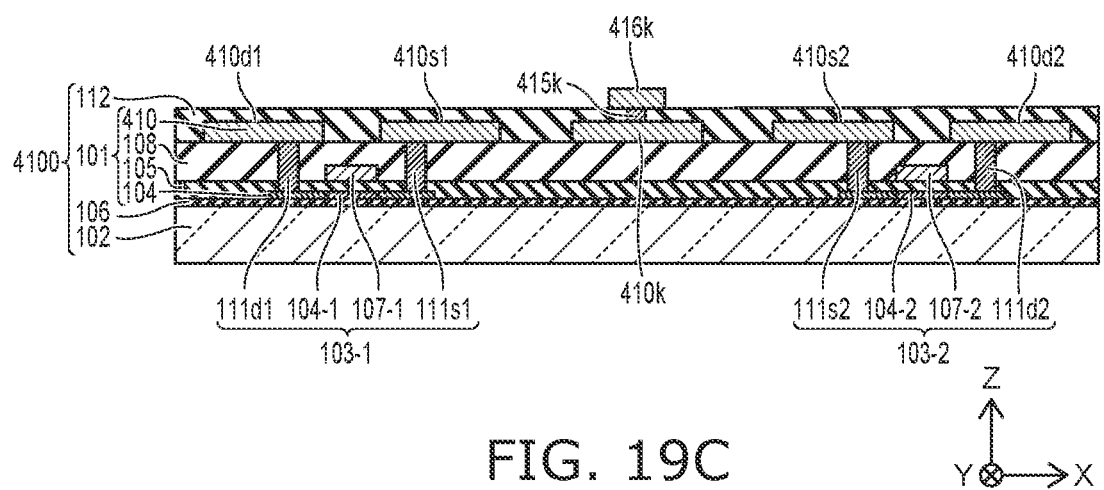
FIG. 19C is a schematic cross-sectional view illustrating the manufacturing method of the image display device according to the fourth embodiment.

As illustrated in FIG. 19C, the plug 416k is formed on the connecting portion 415k by photolithography and dry etching.

The plug may be formed directly on the wiring line 410k without forming the connecting portion 415k.

Figure 20A:
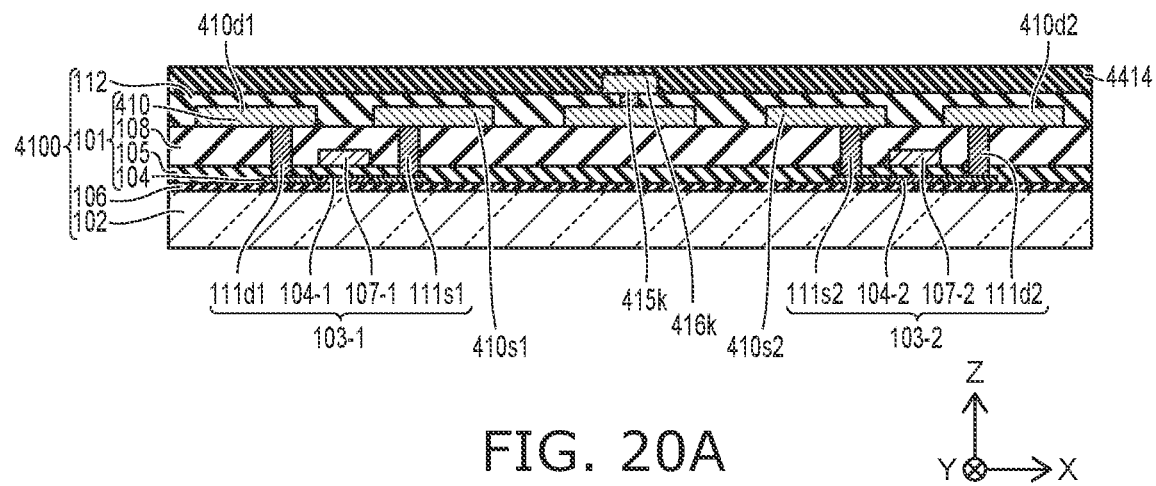
FIG. 20A is a schematic cross-sectional view illustrating the manufacturing method of the image display device according to the fourth embodiment.

As illustrated in FIG. 20A, a flattening film 4414 is applied so as to cover the interlayer insulating film 112 and the plug 416k and subsequently baked. The flattening film 4414 is formed thicker than a thickness of the plug 416k. Subsequently, a front surface of the flattening film 4414 is polished. To polish the flattening film 4414, a chemical mechanical polishing (CMP) is used, for example.

Figure 20B:
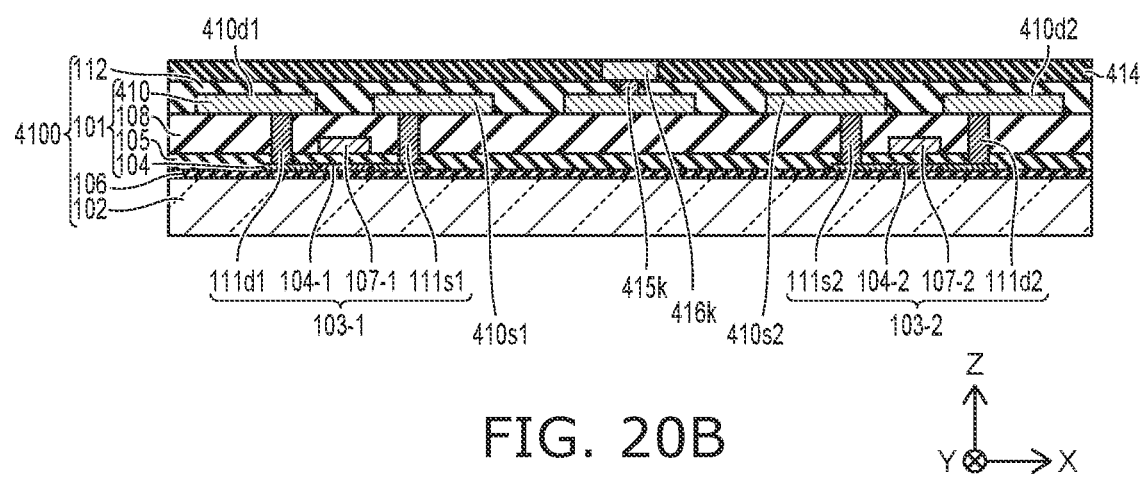
FIG. 20B is a schematic cross-sectional view illustrating the manufacturing method of the image display device according to the fourth embodiment.

As illustrated in FIG. 20B, by the polishing, the surface of plug 416k is exposed and the flattening film 414 is formed. In this way, the plug 416k and the connecting portion 415k are formed.

Figure 21A:
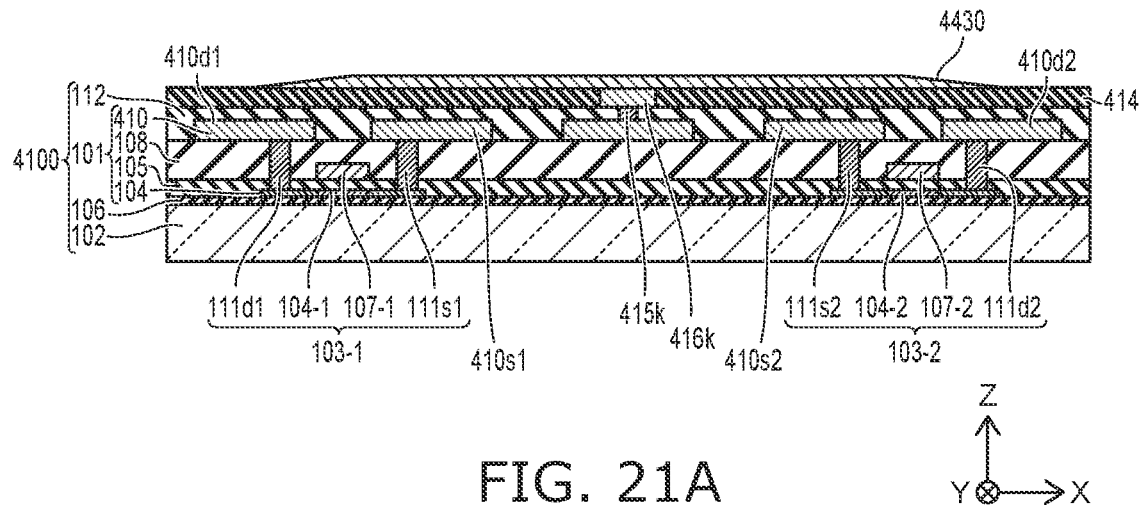
FIG. 21A is a schematic cross-sectional view illustrating the manufacturing method of the image display device according to the fourth embodiment.

Furthermore, as illustrated in FIG. 21A, a conductive layer 4430 is formed on the plug 416k and the flattening film 414 of the circuit substrate 4100. The conductive layer 4430 is patterned and then monocrystallized across the entire surface by an annealing process. For the annealing process, laser annealing is preferably used.

Figure 21B:
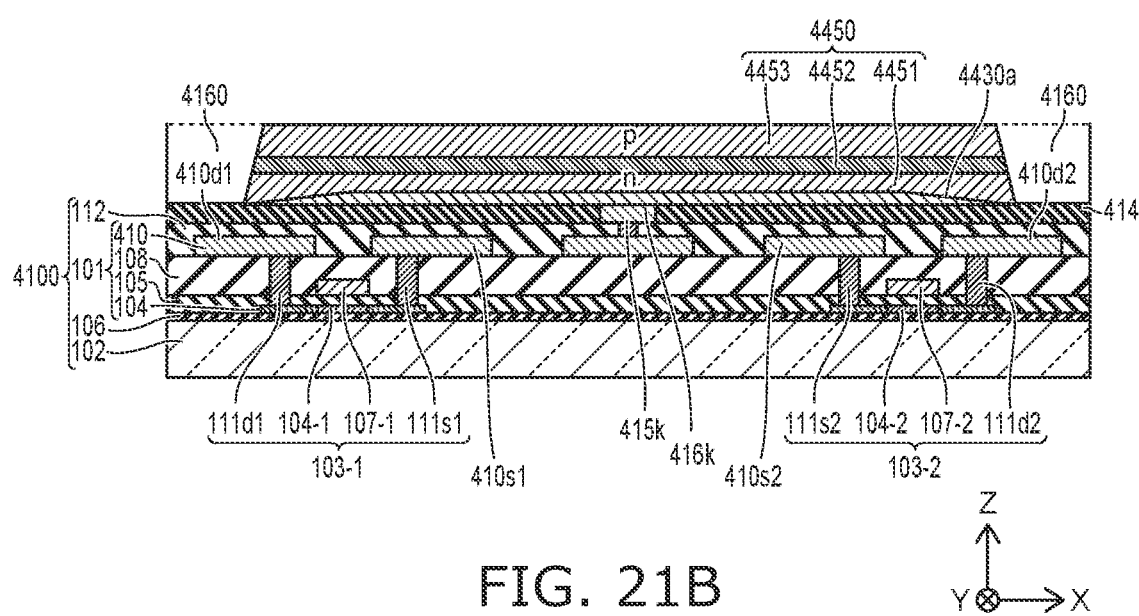
FIG. 21B is a schematic cross-sectional view illustrating the manufacturing method of the image display device according to the fourth embodiment.

As illustrated in FIG. 21B, a semiconductor layer 4450 is formed on the conductive layer 4430a monocrystallized across the entire surface. To form the semiconductor layer 4450, pulse sputtering is preferably used. The semiconductor layer 4450 is grown from an n-type semiconductor layer 4451 and grown in the order of a light-emitting layer 4452 and a p-type semiconductor layer 4453. The semiconductor layer 4450 is formed on the conductive layer 4430a and, in a case in which there is a location where the conductive layer 4430a is not present or a location of the conductive layer that is not monocrystallized, a deposit 4160 that is not monocrystallized is formed.

Figure 22A:
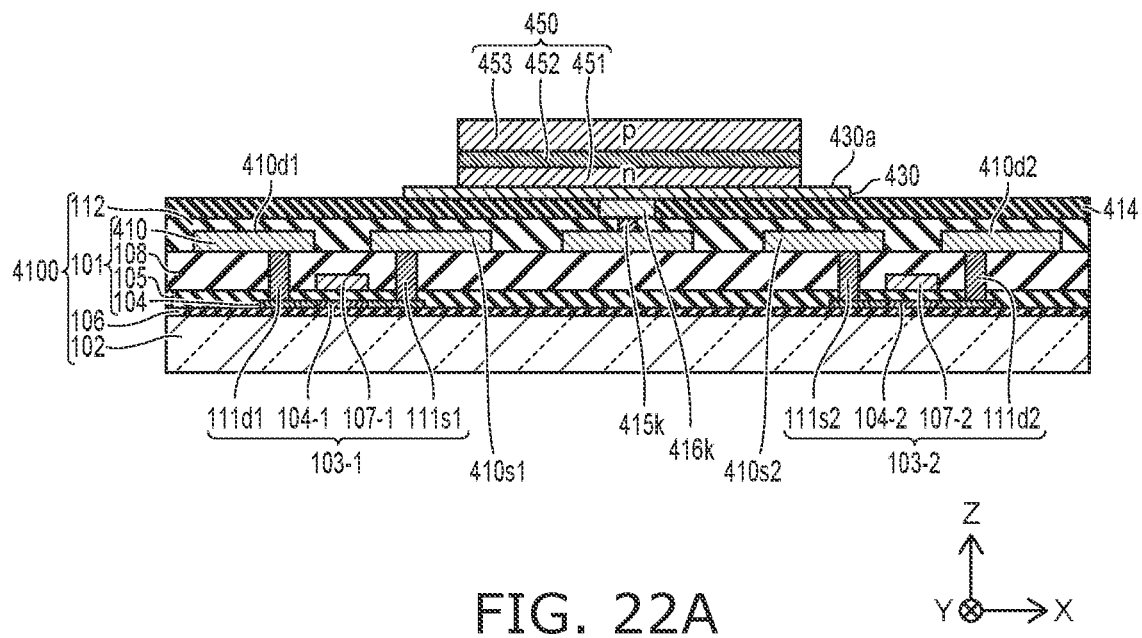
FIG. 22A is a schematic cross-sectional view illustrating the manufacturing method of the image display device according to the fourth embodiment.

As illustrated in FIG. 22A, the conductive layer 4430a illustrated in FIG. 21B is molded into the conductive layer 430 including the light-reflecting plate 430a having a desired shape and pattern by etching or the like. The semiconductor layer 4450 illustrated in FIG. 21B is molded into a desired shape by etching or the like, forming the semiconductor layer 450.

Figure 22B:
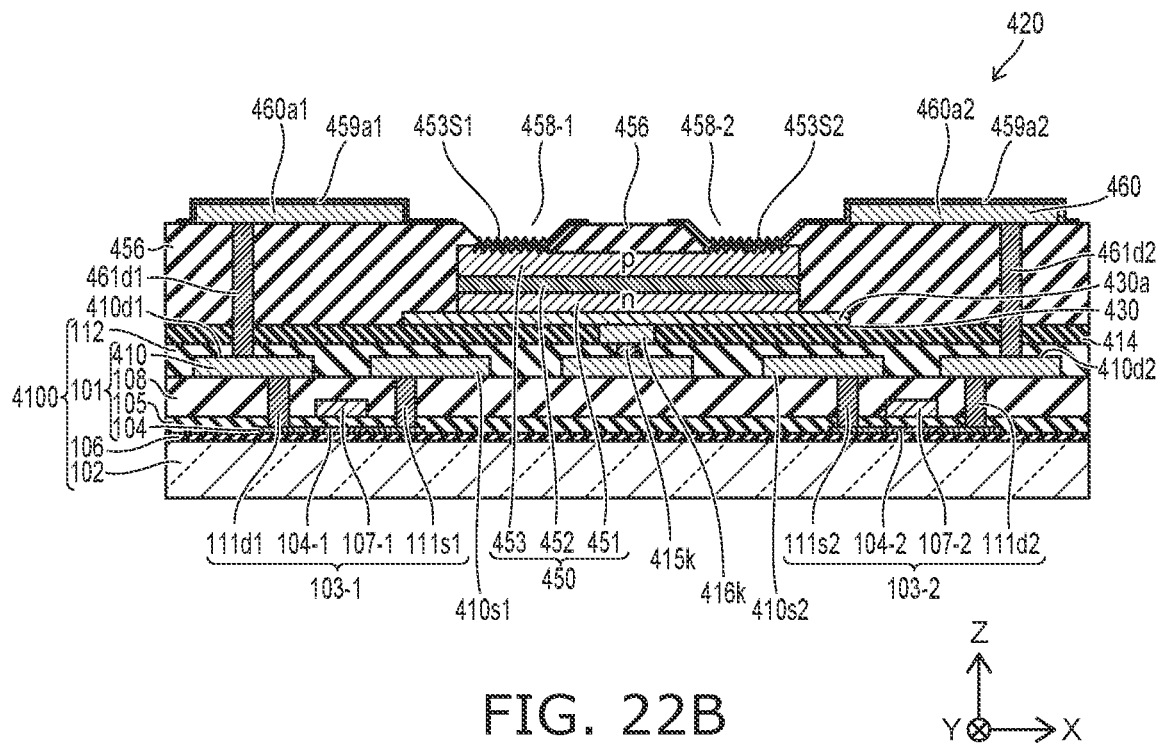
FIG. 22B is a schematic cross-sectional view illustrating the manufacturing method of the image display device according to the fourth embodiment.

As illustrated in FIG. 22B, the second interlayer insulating film 456 is formed on the first interlayer insulating film 112, the conductive layer 430, and the semiconductor layer 450. The vias 461d1, 461d2 are formed through the interlayer insulating films 112, 456 and the flattening film 414. Furthermore, the wiring layer 460 is formed, and the wiring lines 460a1, 460a2 and the like are formed.

Subsequently, the openings 458-1, 458-2 are formed between the wiring lines 460a1, 460a2. The light-emitting surfaces 453S1, 453S2 of the p-type semiconductor layer exposed by the openings 458-1, 458-2 are each roughened. The light-transmitting electrodes 459a1, 459a2 are then formed.

In this manner, the sub-pixel group 420 including the semiconductor layer 450 that shares the two light-emitting surfaces 453S1, 453S2 is formed.

In the present example, the two light-emitting surfaces 453S1, 453S2 are provided in one semiconductor layer 450, but the number of light-emitting surfaces is not limited to two, and three or more light-emitting surfaces can be provided on the one semiconductor layer 450. As an example, one or two columns of sub-pixels may be realized by a single semiconductor layer 550. As a result, as described below, a recombination current that does not contribute to light emission per light-emitting surface can be reduced and the effect of realizing a finer light-emitting element can be increased.

Modified Example

Figure 23:
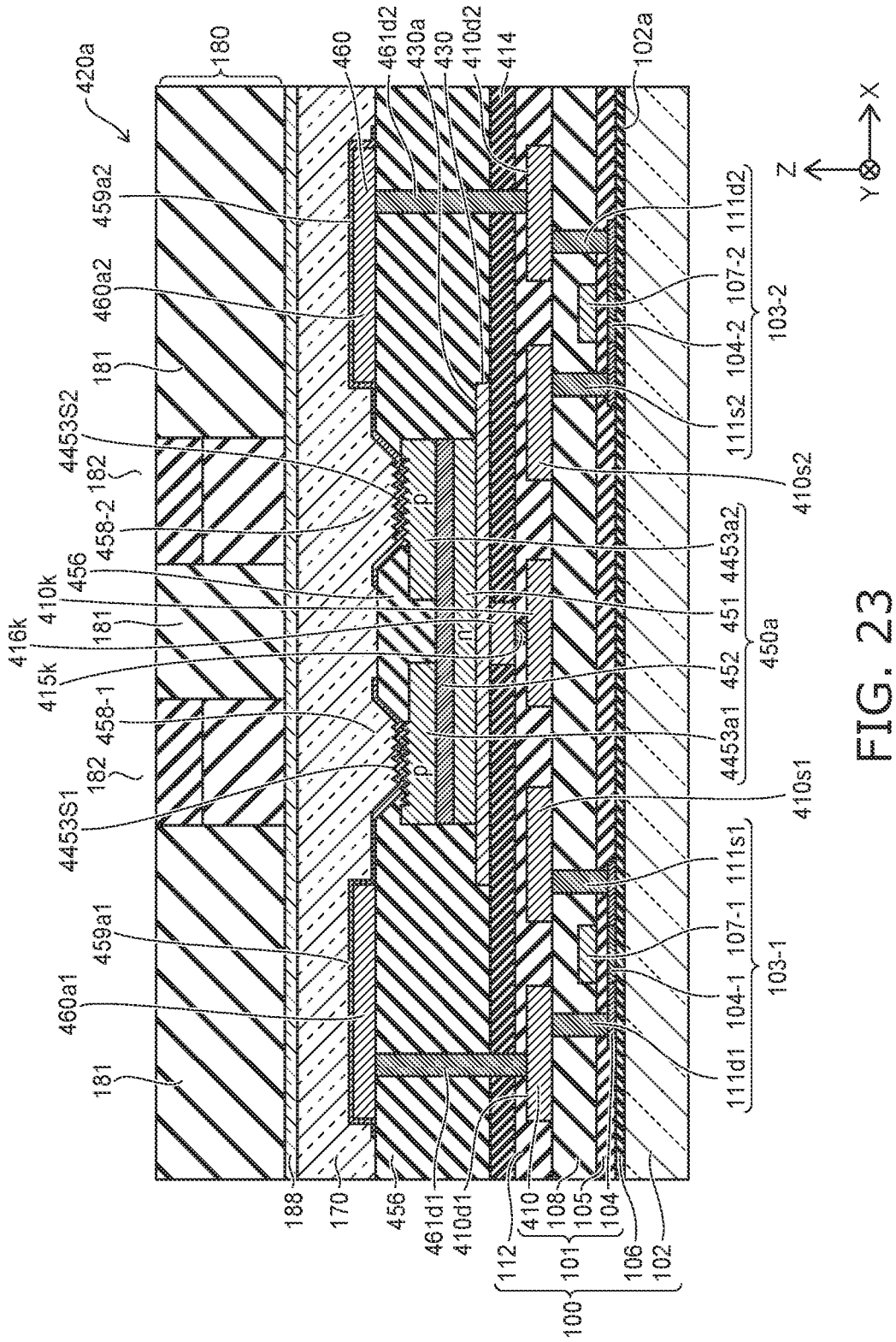
FIG. 23 is a schematic cross-sectional view illustrating a portion of an image display device according to a modified example of the fourth embodiment.

FIG. 23 is a schematic cross-sectional view illustrating a portion of an image display device according to a modified example of the present embodiment.

The present modified example differs from the fourth embodiment described above in that two p-type semiconductor layers 4453a1, 4453a2 are provided on the light-emitting layer 452. In other respects, components that are the same as those of the fourth embodiment are denoted by the same reference characters, and detailed descriptions thereof will be omitted as appropriate.

As illustrated in FIG. 23, the image display device of the present modified example includes a sub-pixel group 420a. The sub-pixel group 420a includes a semiconductor layer 450a. The semiconductor layer 450a includes the n-type semiconductor layer 451, the light-emitting layer 452, and the p-type semiconductor layers 4453a1, 4453a2. The semiconductor layer 450a is provided with the n-type semiconductor layer 451 on the plug 416k. The light-emitting layer 452 is layered on the n-type semiconductor layer 451. The two different p-type semiconductor layers 4453a1, 4453a2 are provided on the light-emitting layer 452.

The p-type semiconductor layers 4453a1, 4453a2 are separated in the X-axis direction on the light-emitting layer 452. The interlayer insulating film 456 is provided between the p-type semiconductor layers 4453a1, 4453a2, and the p-type semiconductor layers 4453a1, 4453a2 are separated by the interlayer insulating film 456.

The p-type semiconductor layers 4453a1, 4453a2 have substantially the same shape in an XY plane view, and the shape thereof is substantially square or rectangular, and may be another polygonal shape, circular, or the like.

The p-type semiconductor layers 4453a1, 4453a2 respectively include light-emitting surfaces 4453S1, 4453S2. The light-emitting surfaces 4453S1, 4453S2 are surfaces of the p-type semiconductor layers 4453a1, 4453a2 respectively exposed by the openings 458-1, 458-2.

The light-emitting surfaces 4453S1, 4453S2 have substantially the same shape in an XY plane view and have a substantially square shape or the like, similar to the shape of the light-emitting surfaces in the fourth embodiment. The shape of the light-emitting surfaces 4453S1, 4453S2 is not limited to a rectangular shape such as in the present embodiment, and may be circular, elliptical, or polygonal such as hexagonal. The shape of the light-emitting surfaces 4453S1, 4453S2 may be similar to or different from the shape of the openings 458-1, 458-2.

The light-transmitting electrodes 459a1, 459a2 are respectively provided on the light-emitting surfaces 4453S1, 4453S2. The light-transmitting electrodes 459a1, 459a2 are also respectively provided on the wiring lines 460a1, 460a2. The light-transmitting electrode 459a1 is provided between the wiring line 460a1 and the light-emitting surface 4453S1, and electrically connects the wiring line 460a1 and the light-emitting surface 4453S1. The light-transmitting electrode 459a2 is provided between the wiring line 460a2 and the light-emitting surface 4453S2, and electrically connects the wiring line 460a2 and the light-emitting surface 4453S2.

A manufacturing method of the present modified example will now be described.

Figure 24A:
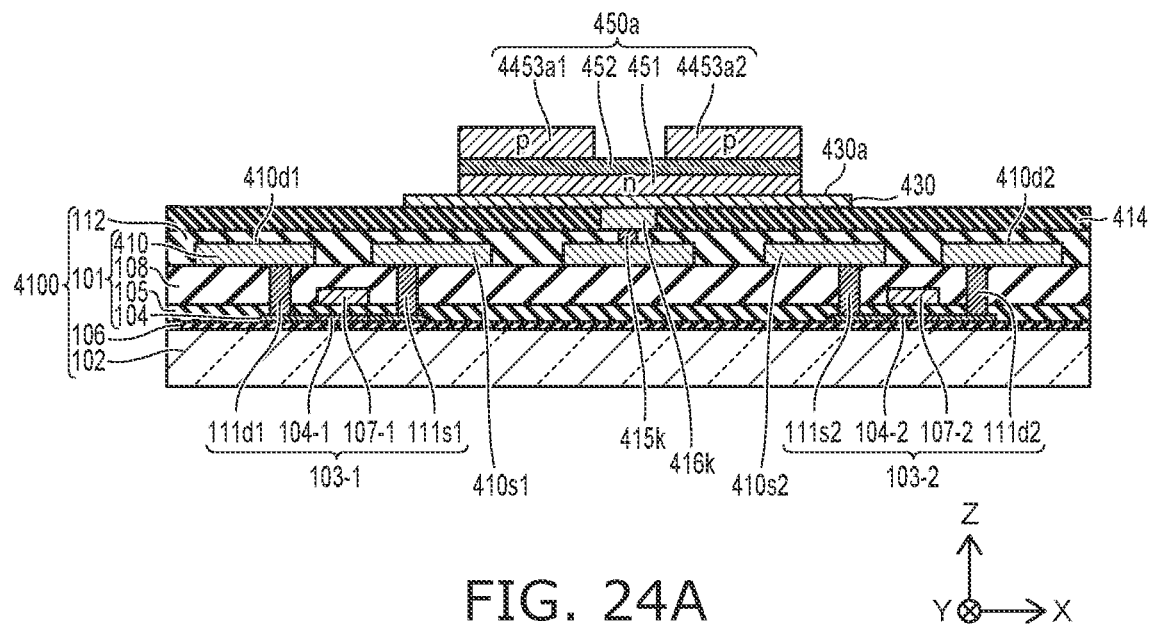
FIG. 24A is a schematic cross-sectional view illustrating a manufacturing method of the image display device according to the modified example of the fourth embodiment.
Figure 24B:
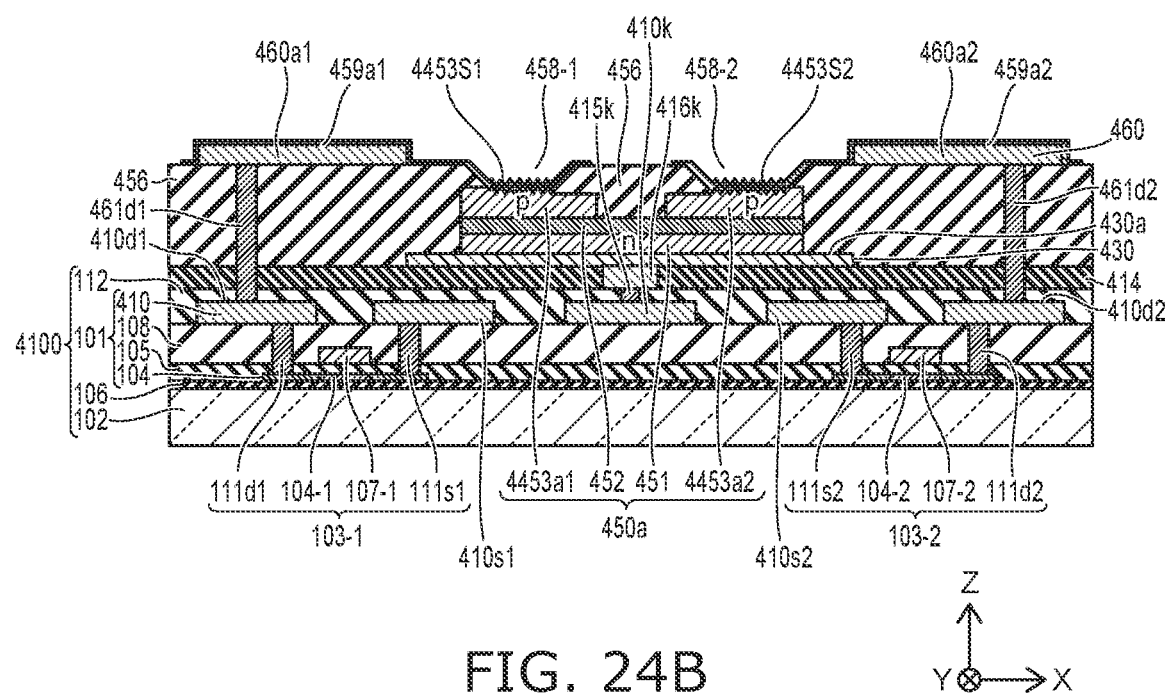
FIG. 24B is a schematic cross-sectional view illustrating the manufacturing method of the image display device according to the modified example of the fourth embodiment.

FIG. 24A and FIG. 24B are schematic cross-sectional views illustrating the manufacturing method of the image display device according of the present modified example.

In the present modified example, until formation of the conductive layer of a single crystal metal on the circuit substrate 4100 in which the plug 416k is formed and formation of the semiconductor layer 4450 on the conductive layer, the same processes as those described in FIG. 20A to FIG. 22B of the fourth embodiment are applied. Hereinafter, the manufacturing method of the present modified example will be described for the process illustrated in FIG. 21B and subsequent processes.

As illustrated in FIG. 24A, in the present modified example, the conductive layer 4430a is etched or the like in FIG. 22B to form the conductive layer 430 including the light-reflecting plate 430a. Furthermore, the semiconductor layer 4450 illustrated in FIG. 22B is etched to form the semiconductor layer 450a. In the process of forming the semiconductor layer 450a, the n-type semiconductor layer 451 and the light-emitting layer 452 are formed and subsequently further etched to form the two p-type semiconductor layers 4453a1, 4453a2.

The p-type semiconductor layers 4453a1, 4453a2 may be formed by deeper etching. For example, the etching for forming the p-type semiconductor layers 4453a1, 4453a2 may be performed to a depth that reaches inside the light-emitting layer 452 and inside the n-type semiconductor layer 451. In a case in which the p-type semiconductor layers are thus deeply etched, an etching position of the p-type semiconductor layer 4453 is preferably separated from outer peripheries of the light-emitting surfaces 4453S1, 4453S2 of the p-type semiconductor layer by 1 µm or more. By separating the etching position from the outer peripheries of the light-emitting surfaces 4453S1, 4453S2, a recombination current can be suppressed.

As illustrated in FIG. 24B, the interlayer insulating film 456 covering the flattening film 414 and the semiconductor layer 450a is formed, and subsequently the vias 461d1, 461d2 are formed. Furthermore, the wiring layer 460 is formed, and the wiring lines 460a1, 460a2 and the like are formed.

The openings 458-1, 458-2 are each formed in the interlayer insulating film 456. The light-emitting surfaces 4453S1, 4453S2 of the p-type semiconductor layer exposed by the openings 458-1, 458-2 are each roughened. Subsequently, the light-transmitting electrodes 459a1, 459a2 are formed.

In this manner, the sub-pixel group 420a including the two light-emitting surfaces 4453S1, 4453S2 is formed.

In the case of the present modified example as well, as in the case of the fourth embodiment, the number of light-emitting surfaces is not limited to two, and three or more light-emitting surfaces may be provided on one semiconductor layer 450a.

Effects of the image display device of the present embodiment will now be described.

Figure 25:
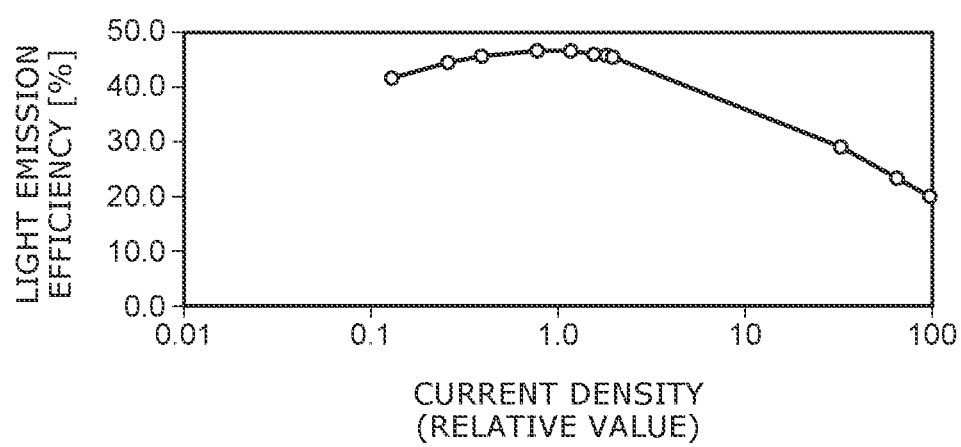
FIG. 25 is a graph showing features of a pixel LED element.

FIG. 25 is a graph showing characteristics of a pixel LED element.

The vertical axis in FIG. 25 indicates light emission efficiency (%). The horizontal axis indicates the current density of the current flowing in the pixel LED element by a relative value.

As shown in FIG. 25, in regions where the relative value of the current density is less than 1.0, the light emission efficiency of the pixel LED element is substantially constant or increases monotonically. In regions where the relative value of the current density is greater than 1.0, the light emission efficiency decreases monotonically. That is, in the pixel LED element, there exists an appropriate current density that results in the greatest light emission efficiency.

It is expected that a highly efficient image display device is realized by suppressing the current density to the extent that sufficient brightness can be acquired from the light-emitting element. Nevertheless, it is shown by FIG. 25 that, at low current densities, the light emission efficiency tends to decrease as the current density decreases.

For example, as described in the first embodiment described above, the light-emitting elements 150-1, 150-2 are formed by individually separating all layers of the semiconductor layer 1150 including the light-emitting layers 152-1, 152-2 by etching or the like. At this time, a bonding surface between the light-emitting layers 152-1, 152-2 and the p-type semiconductor layers 153-1, 153-2 is exposed at an end portion. Similarly, a bonding surface between the light-emitting layers 152-1, 152-2 and the n-type semiconductor layers 151-1, 151-2 is exposed at an end portion.

If such an end portion is present, electrons and holes are recombined at the end portion. On the other hand, such a recombination does not contribute to light emission. Recombination at the end portion occurs almost regardless of the current flowing in the light-emitting element. Recombination is thought to occur depending on a length, at the end portion, of the bonding surface that contributes to light emission.

When two cubic-shaped light-emitting elements having the same dimensions are made to emit light, recombination can occur at a total of eight end portions because the end portions are formed in four directions for each light-emitting element.

In contrast, in the present embodiment, the semiconductor layers 450, 450a having two light-emitting surfaces have four end portions. Because the region between the openings 458-1, 458-2 has few injections of electrons and holes and hardly contributes to light emission, the number of end portions contributing to light emission can be regarded as six. Thus, in the present embodiment, the number of end portions of the semiconductor layer is substantially reduced, making it possible to reduce the recombination current that does not contribute to light emission and, by the reduction in the recombination current, reduce the drive current.

For high definition and the like, in a case in which the distance between sub-pixels is reduced or a case in which the current density is relatively high or the like, the distance between the light-emitting surfaces 4453S1, 4453S2 is shortened in the sub-pixel group 420 of the fourth embodiment. In this case, when the p-type semiconductor layer 453 is shared, there is a risk that a portion of the electrons injected on the side of the adjacent light-emitting surface may be diverted, causing the light-emitting surface on the side not being driven to emit a small amount of light. In the modified example, the p-type semiconductor layers 4453a1, 4453a2 are separated from the light-emitting surfaces 4453S1, 4453S2, making it possible to reduce the occurrence of small light emission in the light-emitting surface on the side not being driven.

In the present embodiment, the semiconductor layer including the light-emitting layer is layered from the side of the interlayer insulating film 112 in the order of the n-type semiconductor layer, the light-emitting layer, and the p-type semiconductor layer, and the exposed surface of the p-type semiconductor layer is roughened to improve the light emission efficiency. As with the other embodiments described above, instead of the layered order of the n-type semiconductor layer and the p-type semiconductor layer, the p-type semiconductor layer, the light-emitting layer, and the n-type semiconductor layer may be layered in this order.

In all embodiments and modified examples described above, the layered order of the light-emitting element can be changed and applied by the appropriate manufacturing procedure described above. For example, the light-emitting element according to the first embodiment can be layered in the order of the p-type semiconductor layer, the light-emitting layer, and the n-type semiconductor layer, from the side of the first interlayer insulating film 112 toward the side of the light-emitting surface. Similarly, the light-emitting element of the second embodiment can be layered in the order of the n-type semiconductor layer, the light-emitting layer, and the p-type semiconductor layer, from the side of the first interlayer insulating film 112 toward the side of the light-emitting surface.

Fifth Embodiment

The image display device described above can be, as an image display module including an appropriate number of pixels, a computer display, a television, a mobile terminal such as a smartphone, or a car navigation system, for example.

Figure 26:
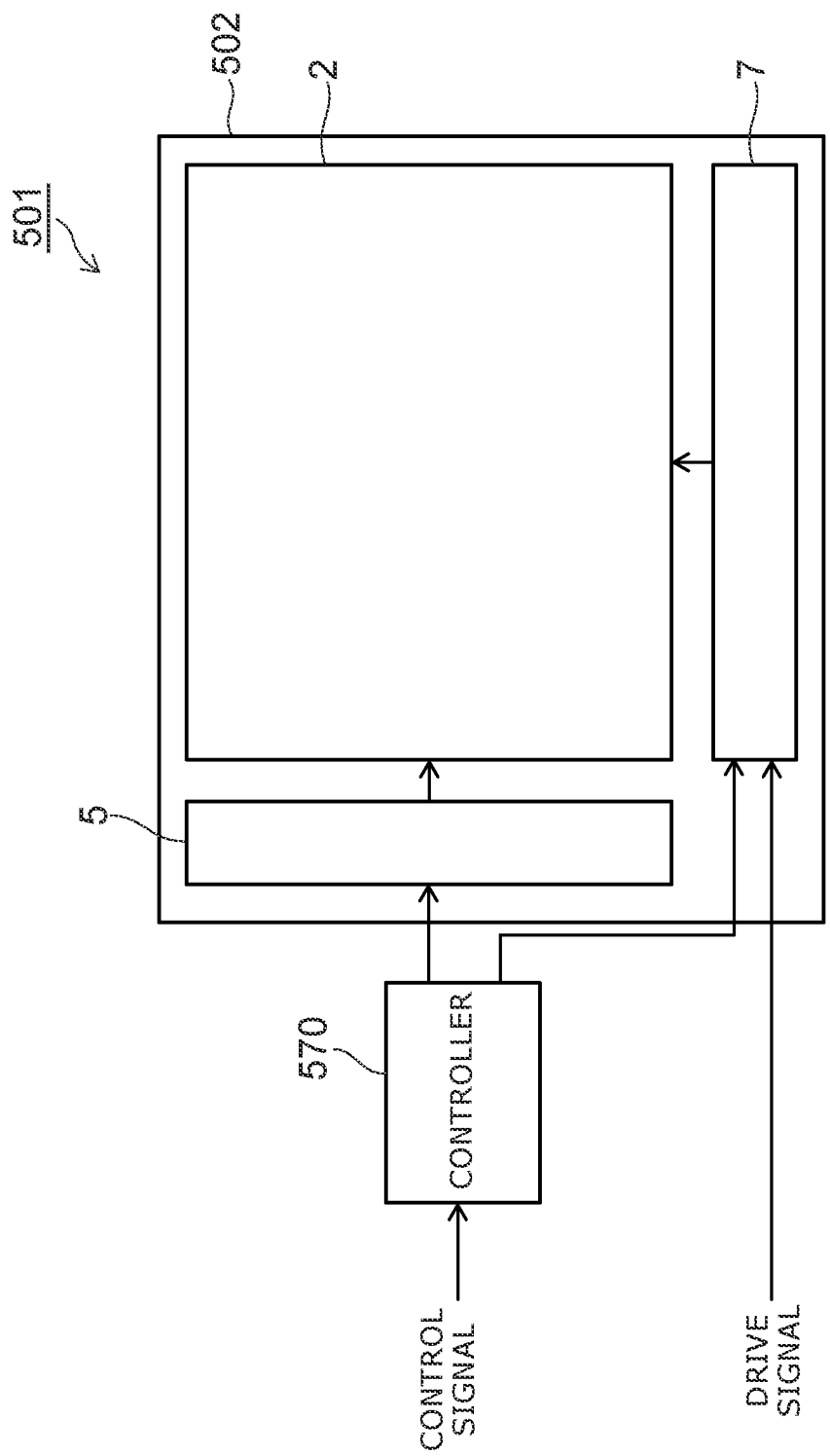
FIG. 26 is a block diagram illustrating an image display device according to a fifth embodiment.

FIG. 26 is a block diagram illustrating an image display device according to the present embodiment.

A main portion of a configuration of a computer display is illustrated in FIG. 26.

As illustrated in FIG. 26, an image display device 501 includes an image display module 502. The image display module 502 is an image display device having the configuration of the first embodiment described above, for example. The image display module 502 includes the display region 2 in which the sub-pixels 20 are arrayed, the row selection circuit 5, and the signal voltage output circuit 7. The image display device 501 may be provided with the configuration of any one of the second to fourth embodiments or the modified examples.

The image display device 501 further includes a controller 570. The controller 570 inputs control signals separated and generated by an interface circuit (not illustrated) to control the drive and drive sequence of each sub-pixel with respect to the row selection circuit 5 and the signal voltage output circuit 7.

Modified Example

Figure 27:
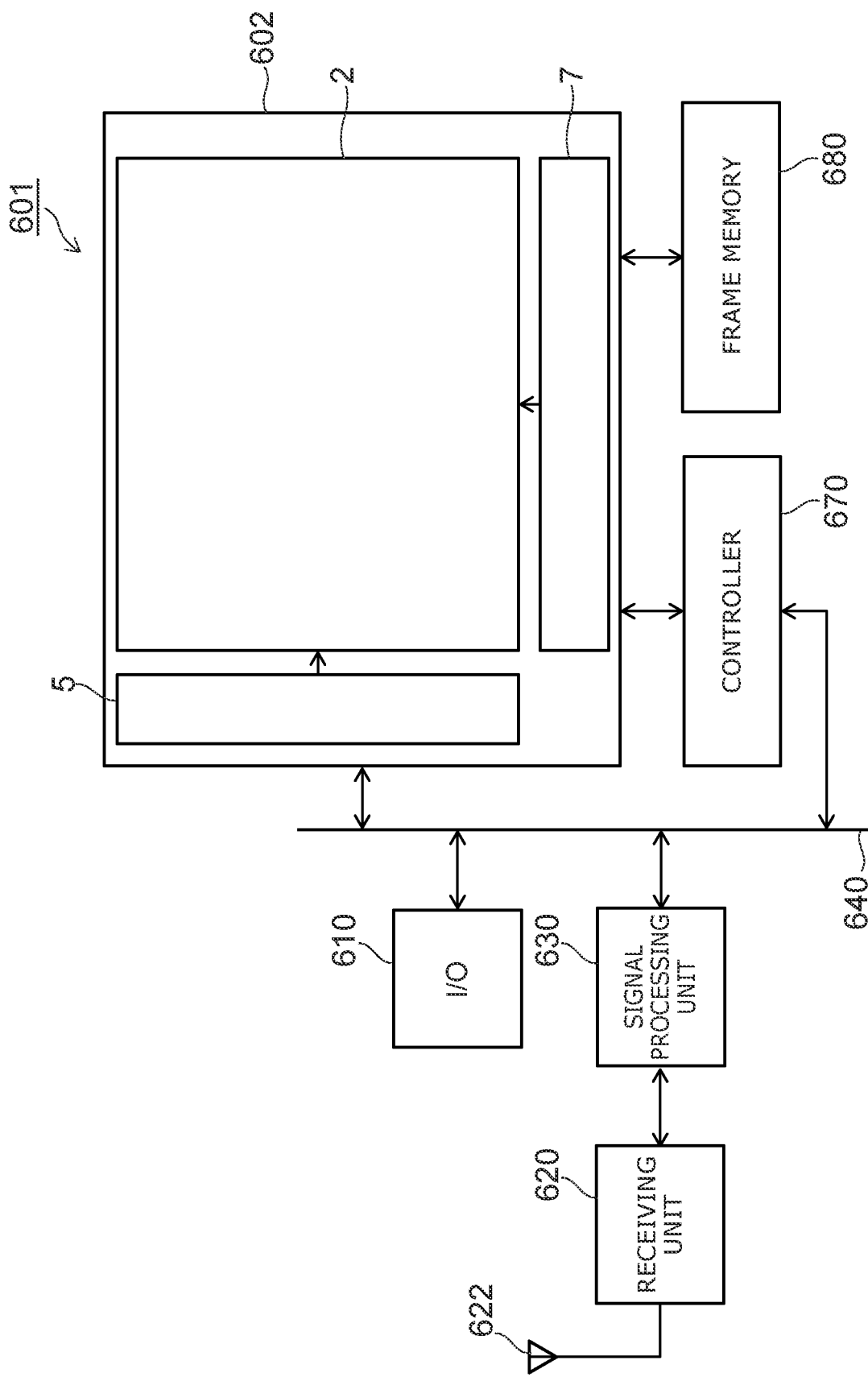
FIG. 27 is a block diagram illustrating an image display device according to a modified example of the fifth embodiment.

FIG. 27 is a block diagram illustrating an image display device of the present modified example.

FIG. 27 illustrates a configuration of a high-definition, flat-screen television.

As illustrated in FIG. 27, an image display device 601 includes an image display module 602. The image display module 602 is, for example, the image display device 1 provided with the configuration of the first embodiment described above. The image display device 601 includes a controller 670 and a frame memory 680. The controller 670 controls the drive sequence of each sub-pixel in the display region 2 on the basis of the control signal supplied by a bus 640. The frame memory 680 stores the display data of one frame and is used for processing, such as smooth video playback.

The image display device 601 includes an I/O circuit 610. The I/O circuit 610 provides an interface circuit and the like for connection to an external terminal, device, or the like. The I/O circuit 610 includes, for example, a universal serial bus (USB) interface for connecting an external hard disk device or the like, and an audio interface.

The image display device 601 includes a receiving unit 620 and a signal processing unit 630. The receiving unit 620 is connected with an antenna 622 to separate and generate necessary signals from radio waves received by the antenna 622. The signal processing unit 630 includes a digital signal processor (DSP), a central processing unit (CPU), and the like, and signals separated and generated by the receiving unit 620 are separated and generated into image data, audio data, and the like by the signal processing unit 630.

Other image display devices can be made as well by using the receiving unit 620 and the signal processing unit 630 as high-frequency communication modules for transmission/reception of mobile phones, Wi-Fi, global positioning system (GPS) receivers, and the like. For example, an image display device provided with an image display module with an appropriate screen size and resolution may be made into a mobile information terminal such as a smartphone or a car navigation system.

The image display module in the case of the present embodiment is not limited to the configuration of the image display device in the first embodiment, and may be the configuration of a modified example or other embodiment.

Figure 28:
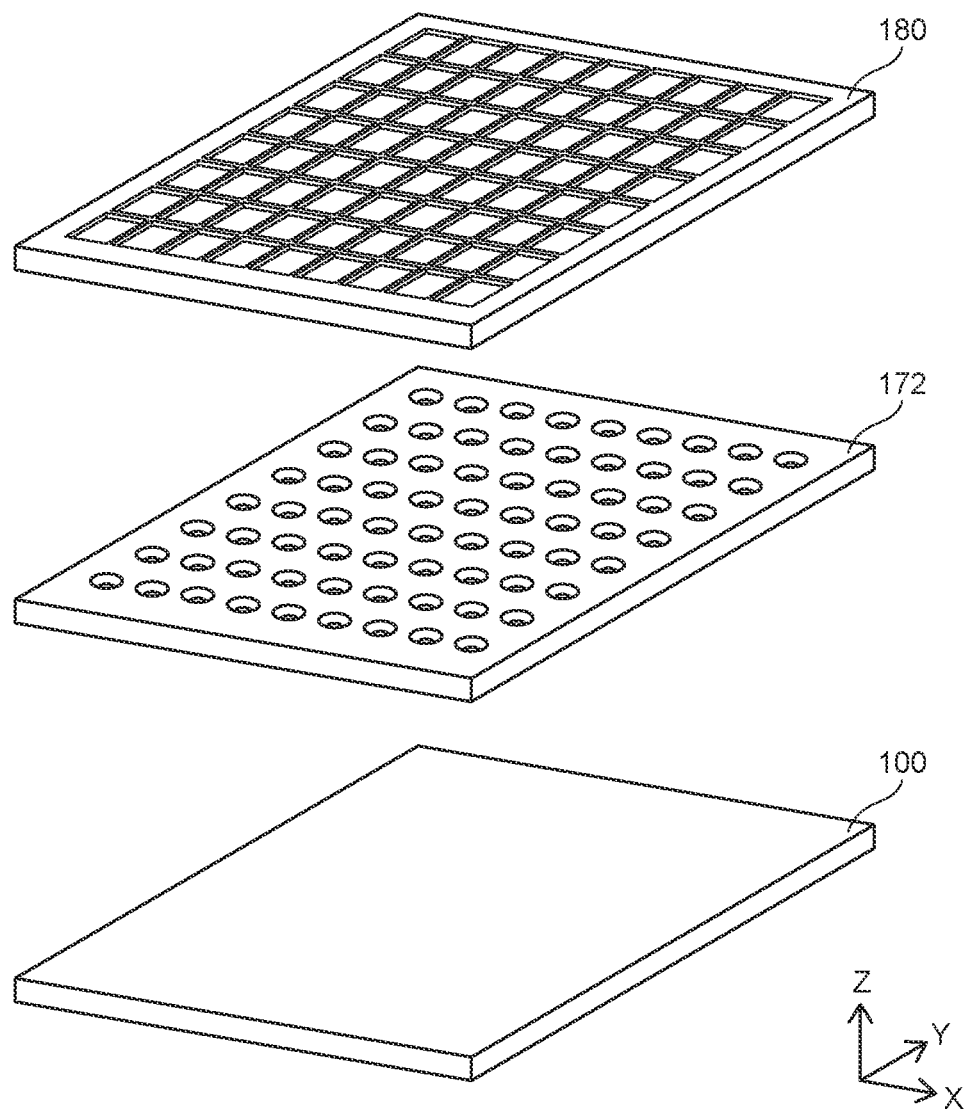
FIG. 28 is a perspective view schematically illustrating the image display devices according to the first to fourth embodiments and the modified examples thereof.

FIG. 28 is a perspective view schematically illustrating the image display devices according to the first to fourth embodiments and the modified examples thereof.

As illustrated in FIG. 28, the image display devices of the first to fourth embodiments are provided with the light-emitting circuit portion 172 including the plurality of sub-pixels on the circuit substrate 100, as described above. The color filter 180 is provided on the light-emitting circuit portion 172. Note that, in the fifth embodiment, the structures including the circuit substrate 100, the light-emitting circuit portion 172, and the color filter 180 are the image display modules 502, 602 and are incorporated into the image display devices 501, 601.

According to the embodiments described above, an image display device manufacturing method and an image display device that reduce a transfer process of a light-emitting element and improve yield are realized.

While several embodiments of the present invention have been described above, these embodiments have been presented as examples, and are not intended to limit the scope of the invention. These novel embodiments may be implemented in various other forms, and various omissions, substitutions, and changes may be made without departing from the spirit of the invention. These embodiments and variations thereof are included in the scope and spirit of the invention, and are within the scope of the invention described in the claims and equivalents thereof. Further, each of the aforementioned embodiments may be implemented in combination with each other.

What is claimed is:

1. An image display device manufacturing method comprising:
    providing a first substrate that comprises:
        a circuit comprising a circuit element formed on a light-transmitting substrate, and
        a first insulating film covering the circuit;
    forming, on the first insulating film, a conductive layer comprising a portion made of a single crystal metal;
    forming, on and in direct physical contact with the portion made of the single crystal metal, a semiconductor layer comprising a light-emitting layer;
    etching the semiconductor layer to form a light-emitting element;
    forming a second insulating film covering the conductive layer, the light-emitting element, and the first insulating film;
    forming a via passing through the first insulating film and the second insulating film; and
    electrically connecting the light-emitting element and the circuit element through the via at a light-emitting surface facing a surface of the light-emitting element on a first insulating film side.

2. The image display device manufacturing method according to claim 1, wherein:
    the step of forming the conductive layer comprises:
        forming a metal layer on the first insulating film, and
        annealing the metal layer to form the portion.

3. The image display device manufacturing method according to claim 2, wherein the step of forming the conductive layer comprises patterning the metal layer before the annealing of the metal layer.

4. The image display device manufacturing method according to claim 2, wherein the step of forming the metal layer on the first insulating film comprises patterning the metal layer in a predetermined shape in advance.

5. The image display device manufacturing method according to claim 1, wherein, in the step of forming the semiconductor layer, the semiconductor layer is formed by sputtering.

6. The image display device manufacturing method according to claim 1, wherein:
    a second substrate having flexibility is provided between the light-transmitting substrate and the circuit element; and
    the method further comprises, after the step of forming the semiconductor layer, removing the light-transmitting substrate.

7. The image display device manufacturing method according to claim 1, wherein the light-transmitting substrate comprises a glass substrate.

8. The image display device manufacturing method according to claim 1, further comprising:
    exposing the light-emitting surface; and
    forming a light-transmitting electrode on the light-emitting surface that is exposed.

9. The image display device manufacturing method according to claim 1, wherein the semiconductor layer comprises a gallium nitride compound semiconductor.

10. The image display device manufacturing method according to claim 1, further comprising:
    forming a wavelength conversion member on the light-emitting element.

11. The image display device manufacturing method according to claim 1, wherein the conductive layer is located between the semiconductor layer and the first insulating film.

* * * * *